(12) United States Patent
Okuno et al.

(10) Patent No.: US 8,697,526 B2
(45) Date of Patent: Apr. 15, 2014

(54) SEMICONDUCTOR DEVICE MANUFACTURING METHOD

(75) Inventors: Masaki Okuno, Yokohama (JP); Hajime Yamamoto, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 101 days.

(21) Appl. No.: 13/301,682

(22) Filed: Nov. 21, 2011

(65) Prior Publication Data

US 2012/0220094 A1    Aug. 30, 2012

(30) Foreign Application Priority Data

Feb. 28, 2011    (JP) .................................. 2011-042675

(51) Int. Cl.
  *H01L 21/336* (2006.01)
(52) U.S. Cl.
  USPC .................................. 438/294; 257/E21.409
(58) Field of Classification Search
  CPC ... H01L 21/336; H01L 21/682; H01L 21/768; H01L 21/8244; H01L 27/11
  USPC .................. 257/620, 621, 774, 776; 438/294
  See application file for complete search history.

(56) References Cited

U.S. PATENT DOCUMENTS 7,064,395 B2 *    6/2006    Minami et al. ................. 257/368

FOREIGN PATENT DOCUMENTS

JP        2002-033389 A    1/2002

* cited by examiner

*Primary Examiner* — George Fourson, III
*Assistant Examiner* — Wilner Jean Baptiste
(74) *Attorney, Agent, or Firm* — Fujitsu Patent Center

(57) ABSTRACT

A semiconductor manufacturing method includes exposing on a photoresist film a first partial pattern of a contact hole, overlapping a part of a gate interconnection in alignment with an alignment mark formed simultaneously with forming the gate interconnection, exposing on the photoresist film a second partial pattern, overlapping a part of an active region in alignment with an alignment mark formed simultaneously with forming the active region, developing the photoresist film to form an opening at the portion where the first partial pattern and the second partial pattern have been exposed, and etching an insulation film to form a contact hole down to the gate interconnection and the source/drain diffused layer.

4 Claims, 52 Drawing Sheets

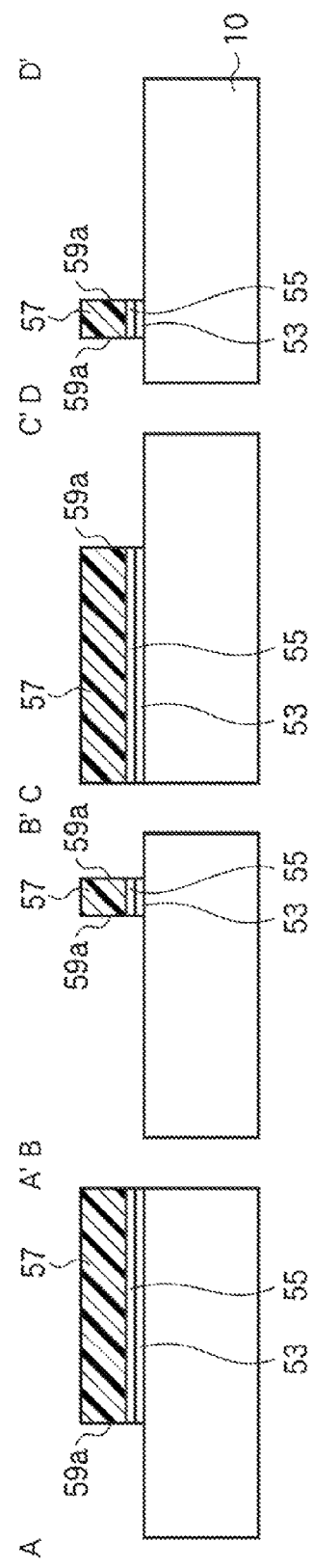
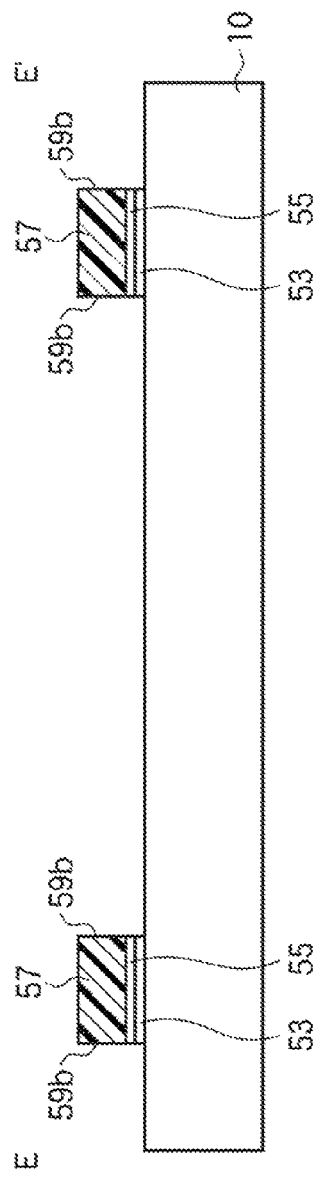
FIG. 7A
FIG. 7B

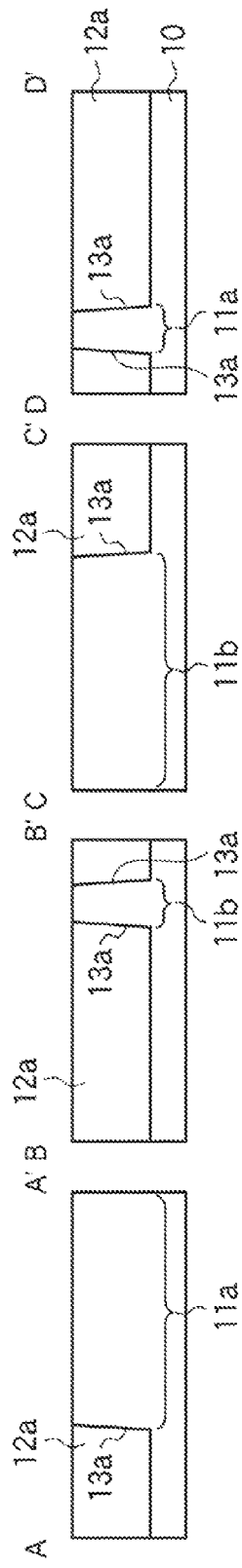
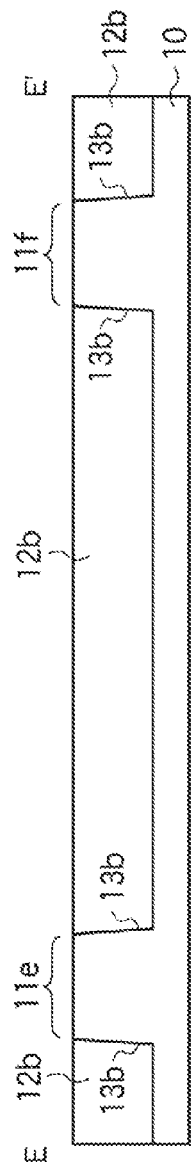
FIG. 10A
FIG. 10B

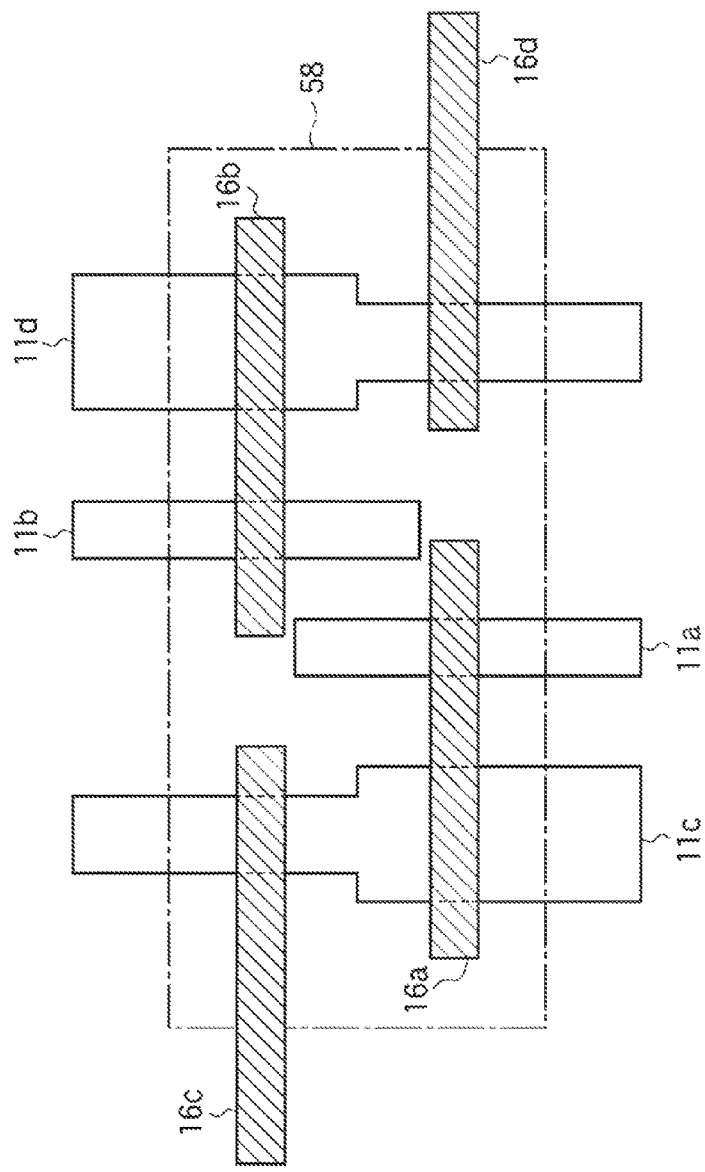
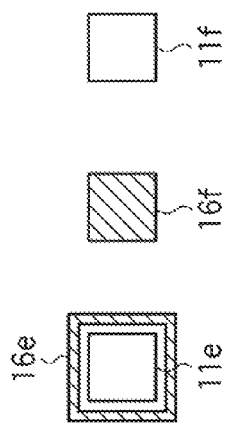
FIG. 13A
FIG. 13B

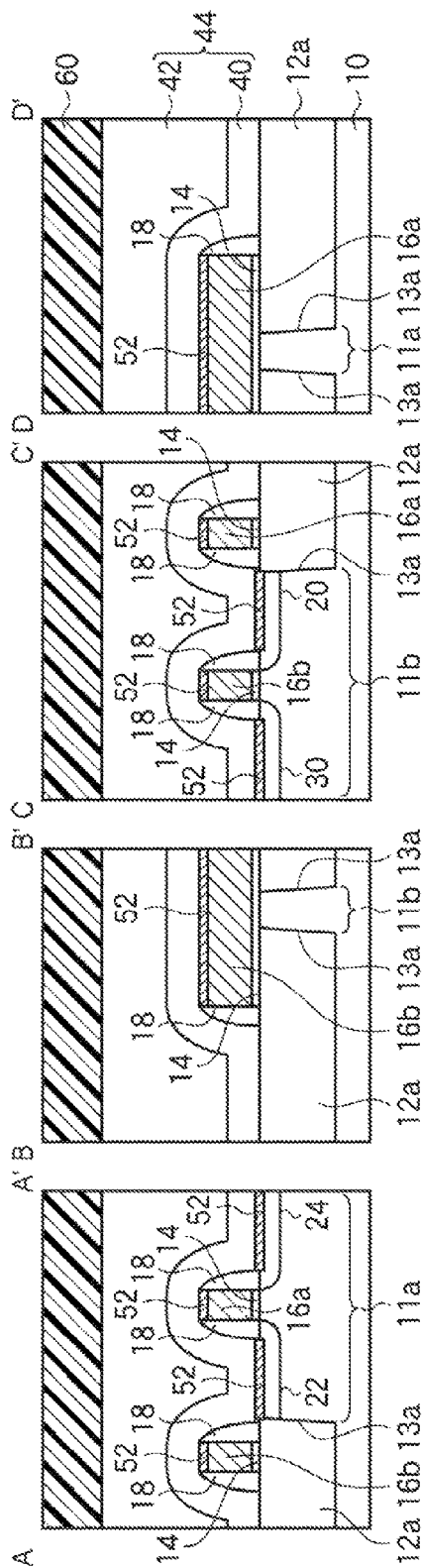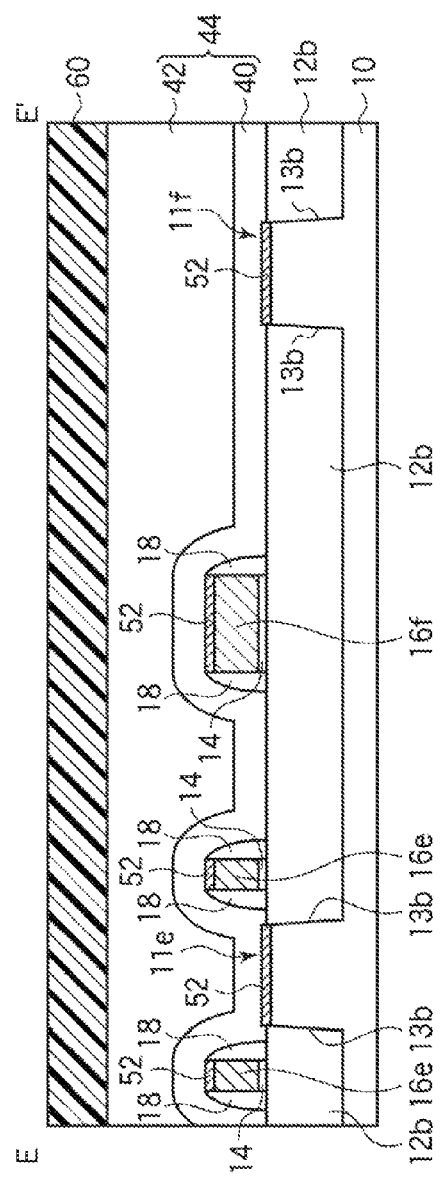

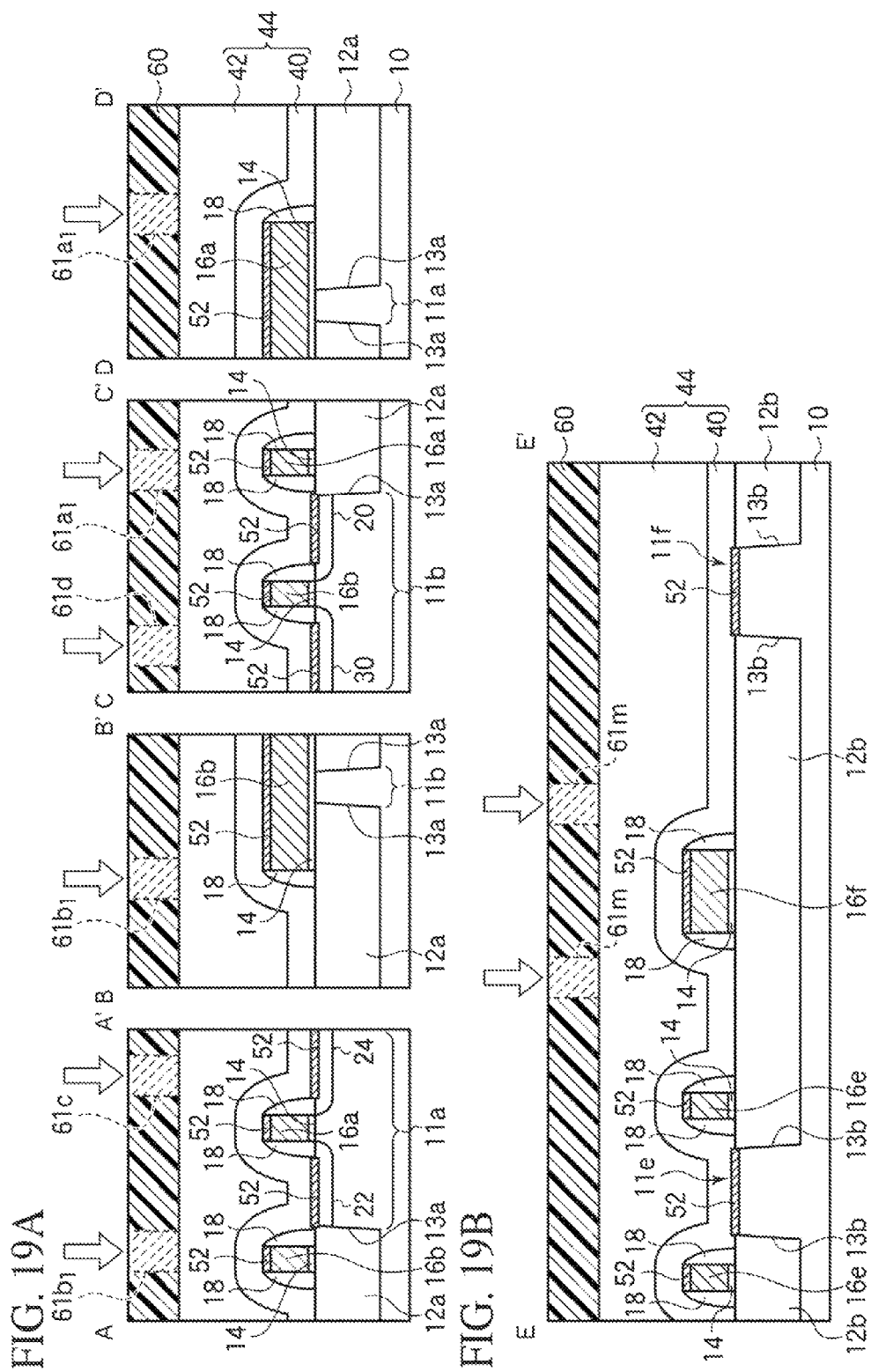

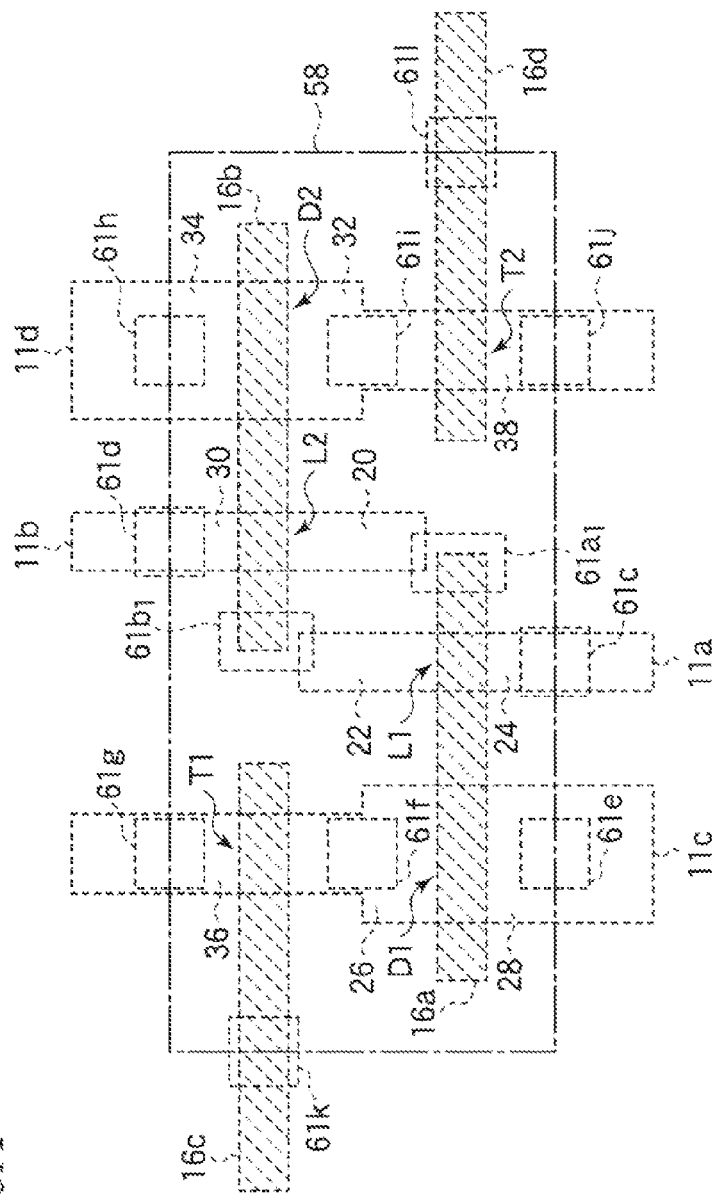
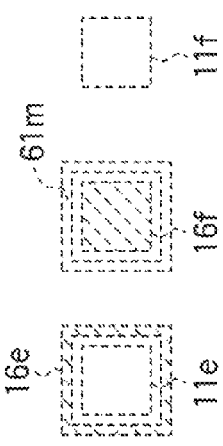
FIG. 20A
FIG. 20B

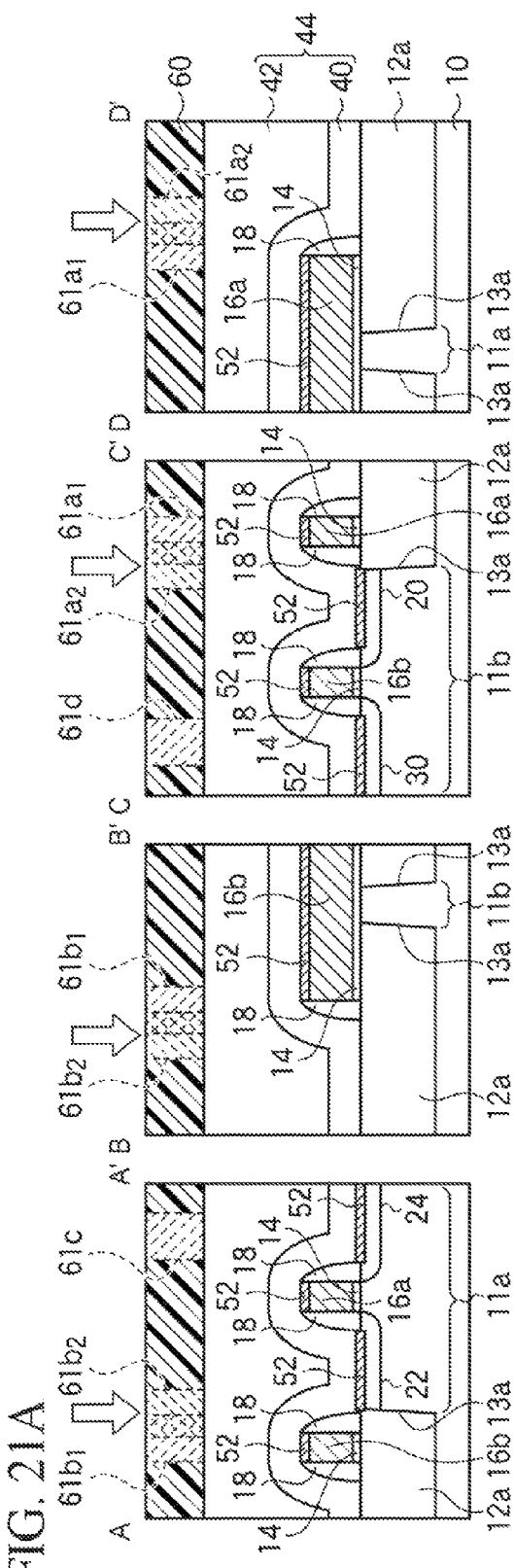
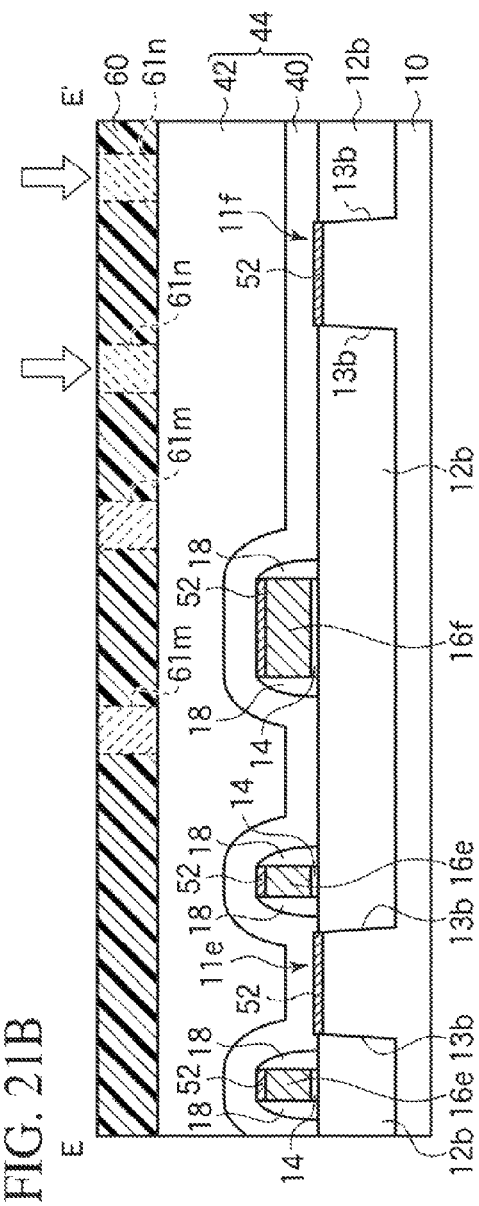
FIG. 21A
FIG. 21B

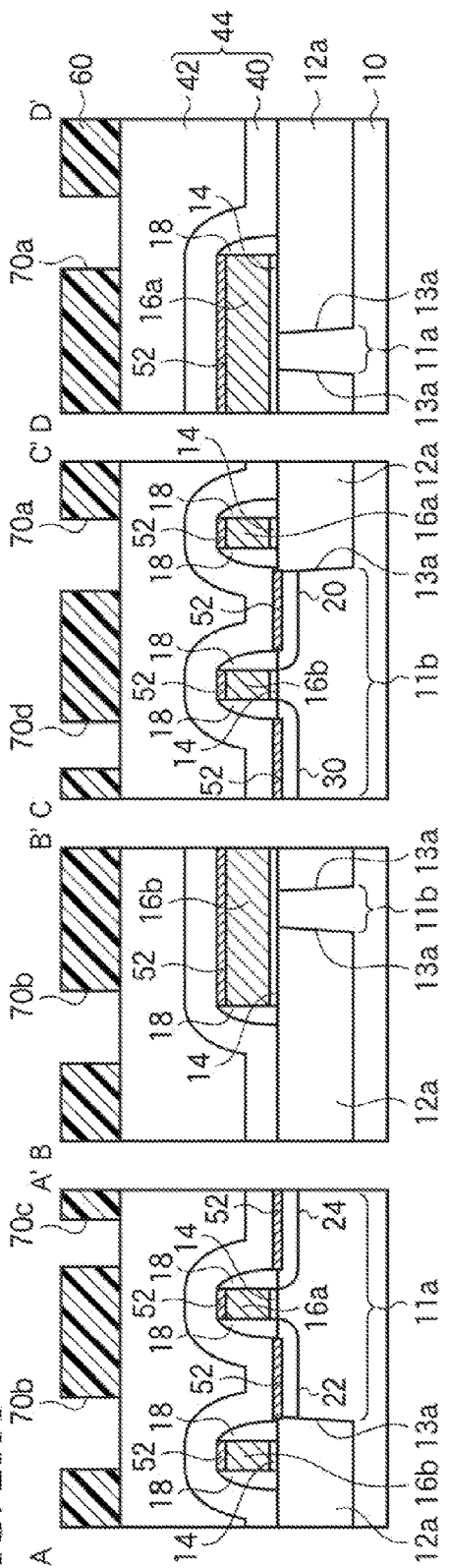
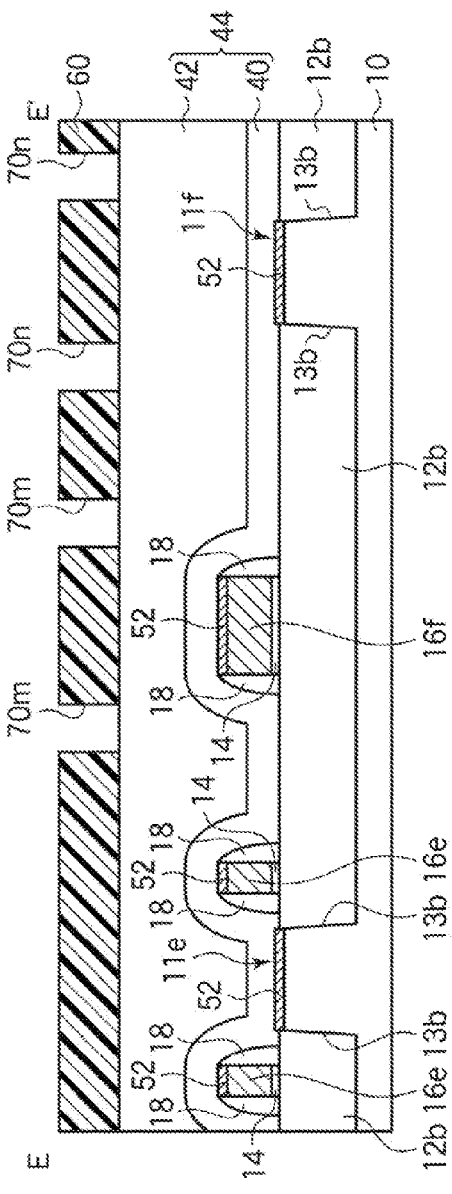
FIG. 23A
FIG. 23B

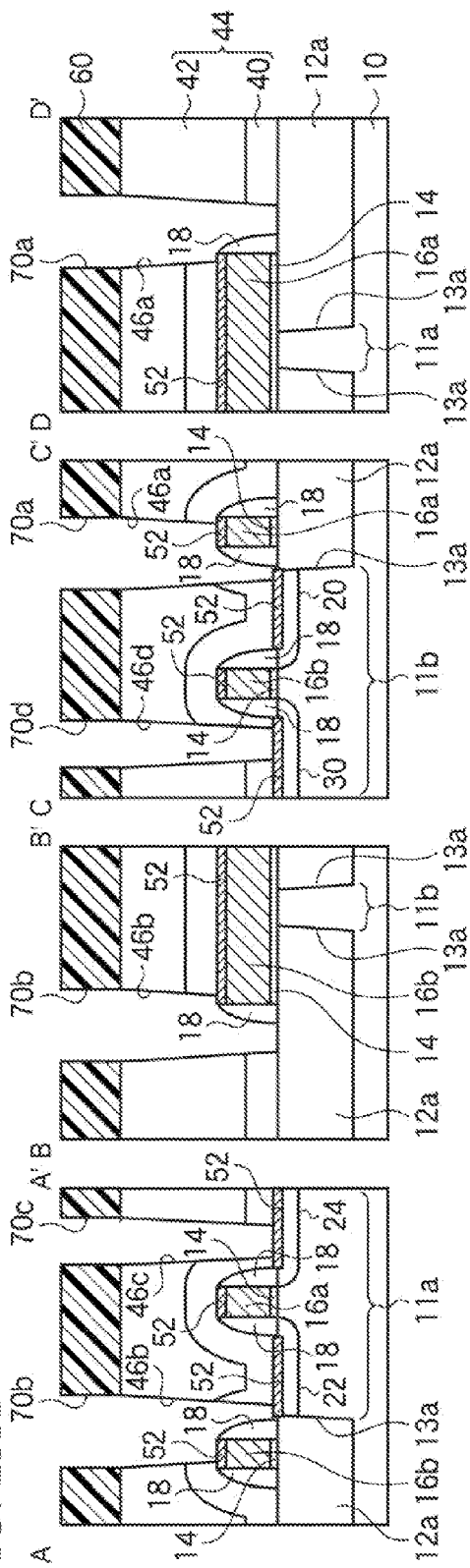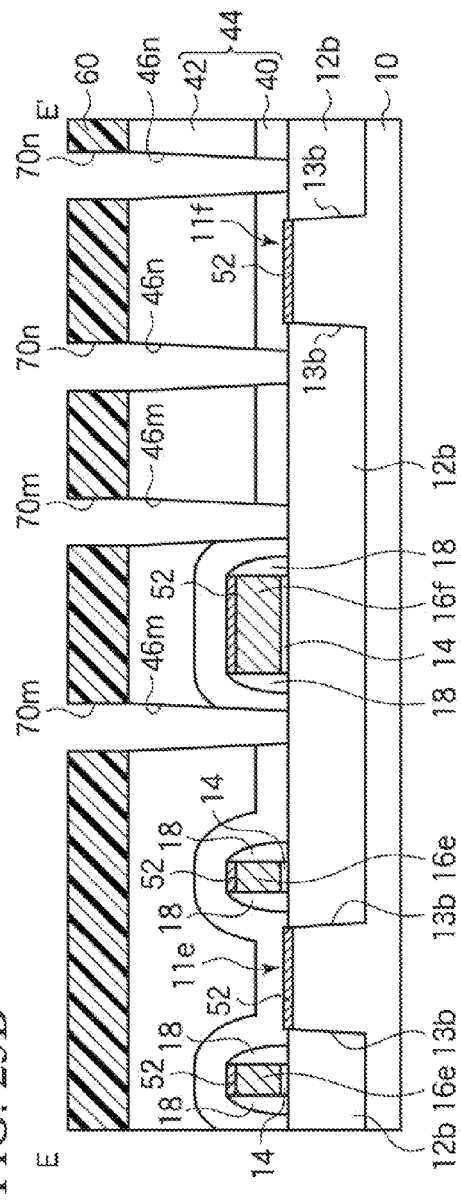

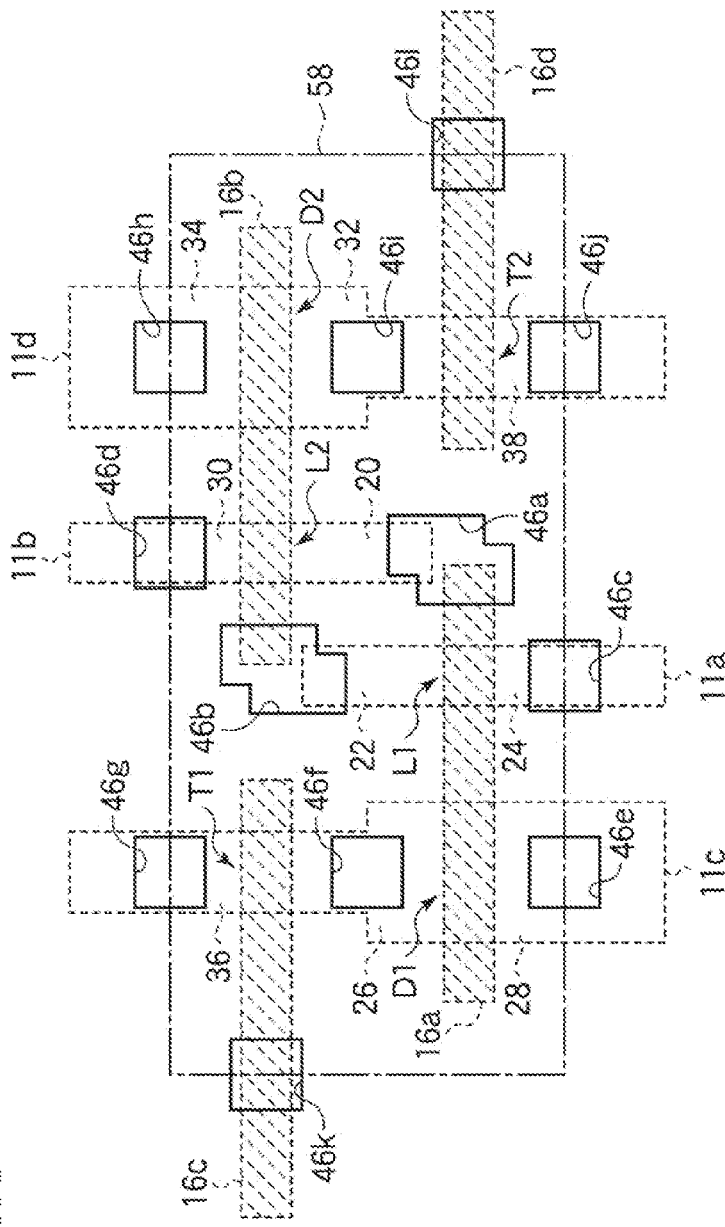
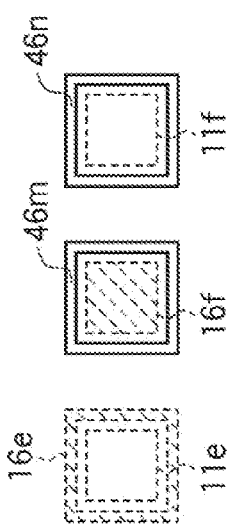
FIG. 26A
FIG. 26B

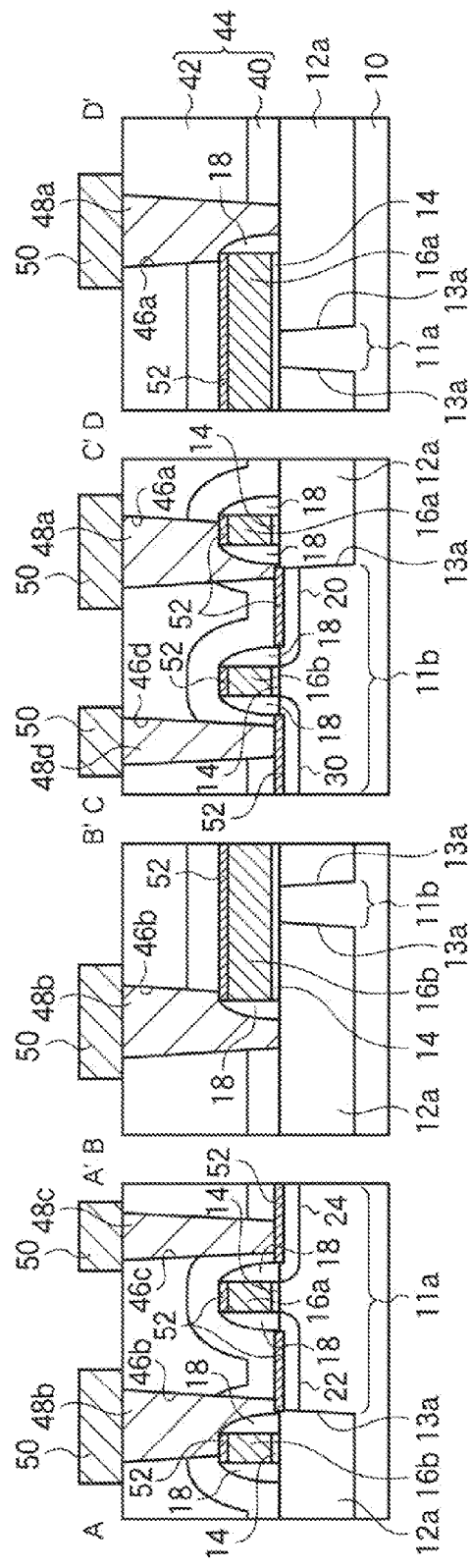
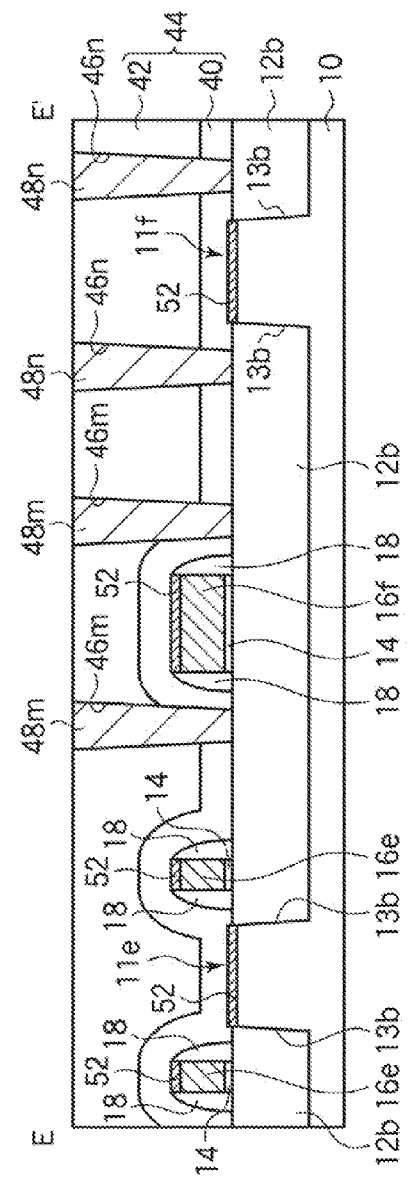

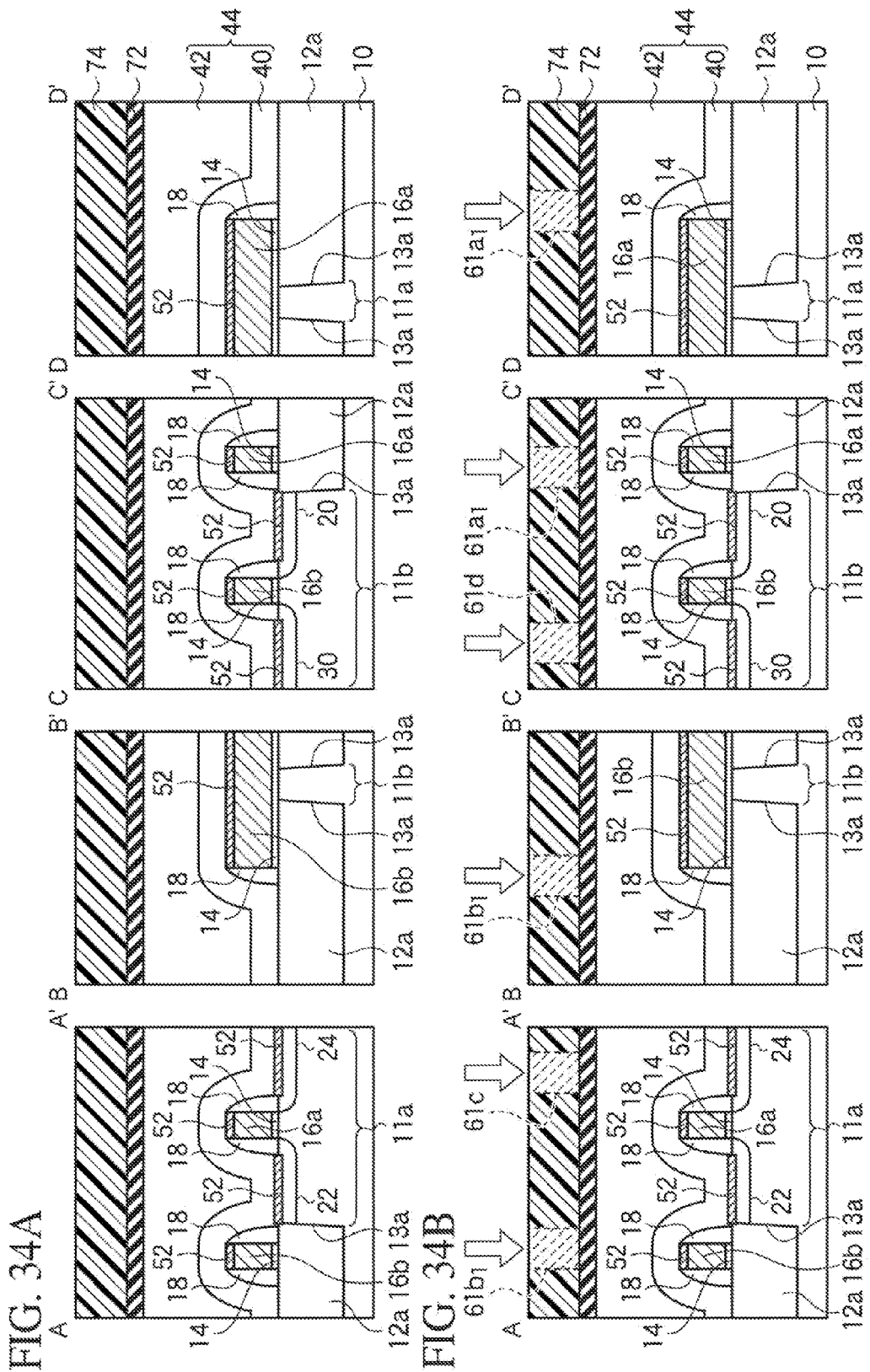

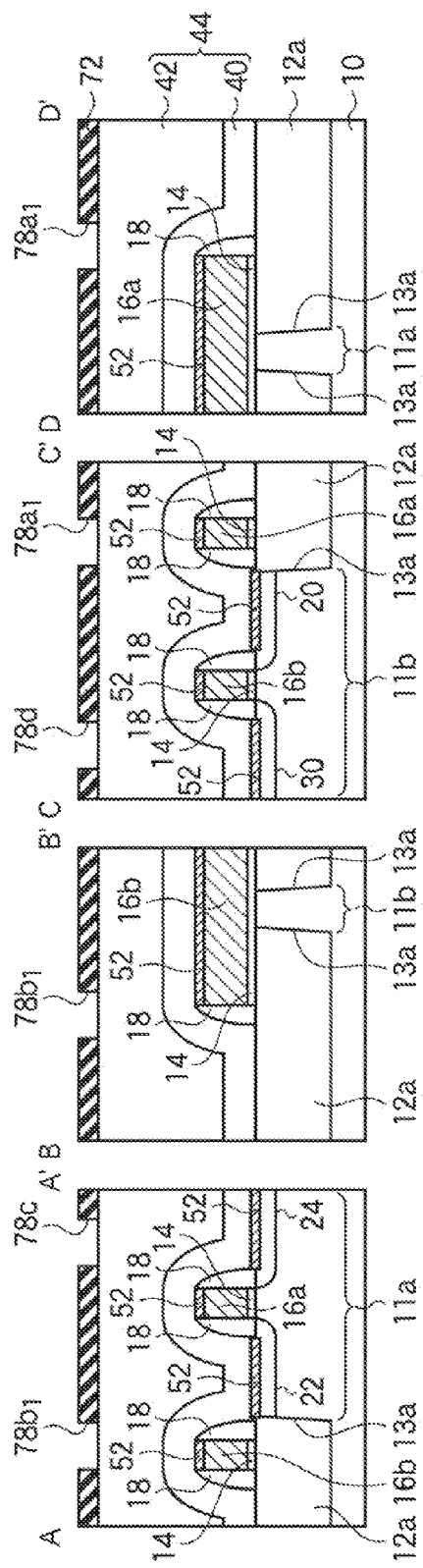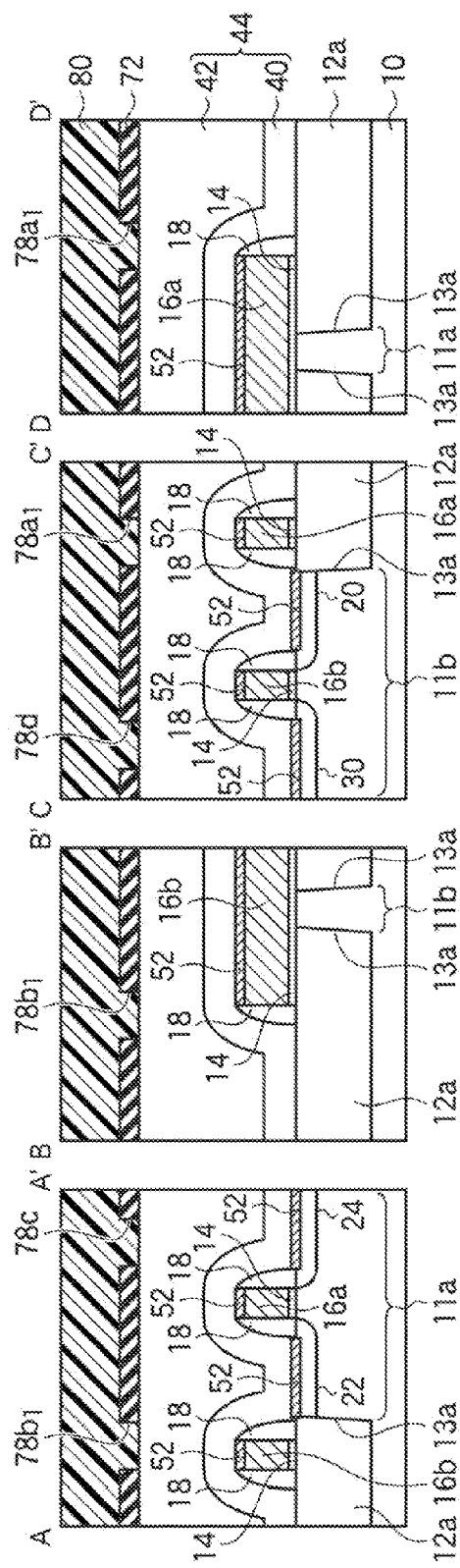

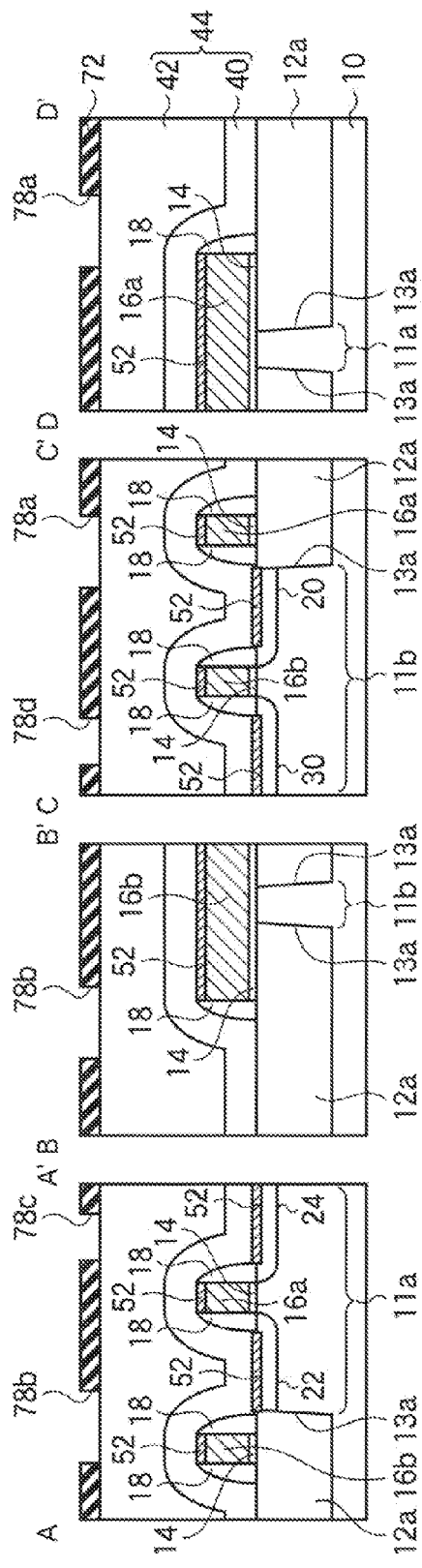
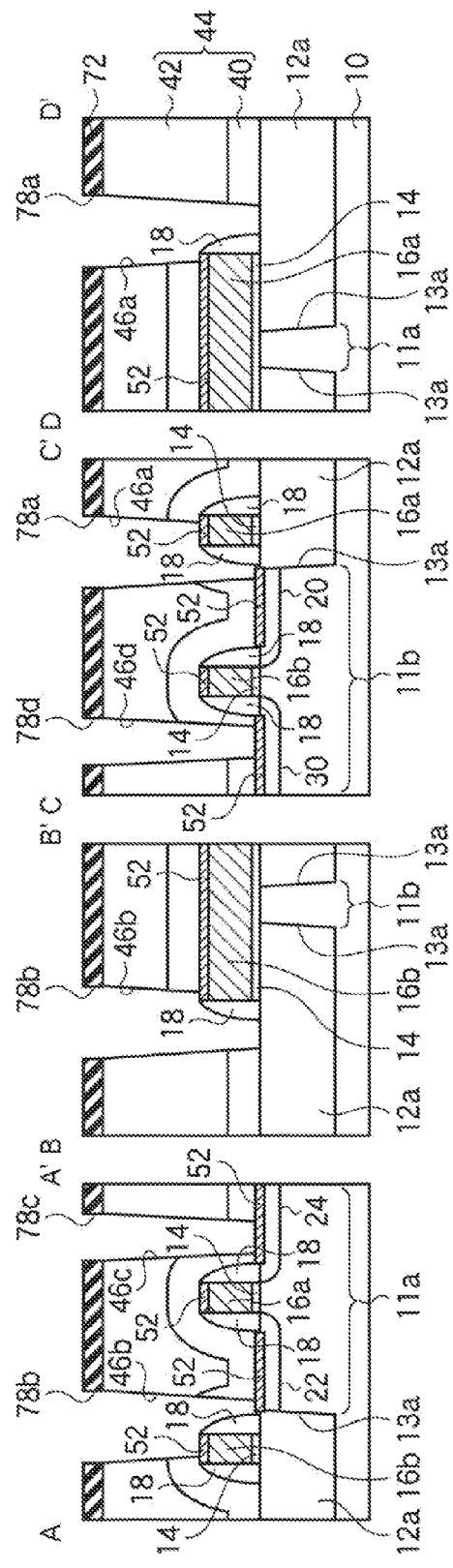
FIG. 45A
FIG. 45B

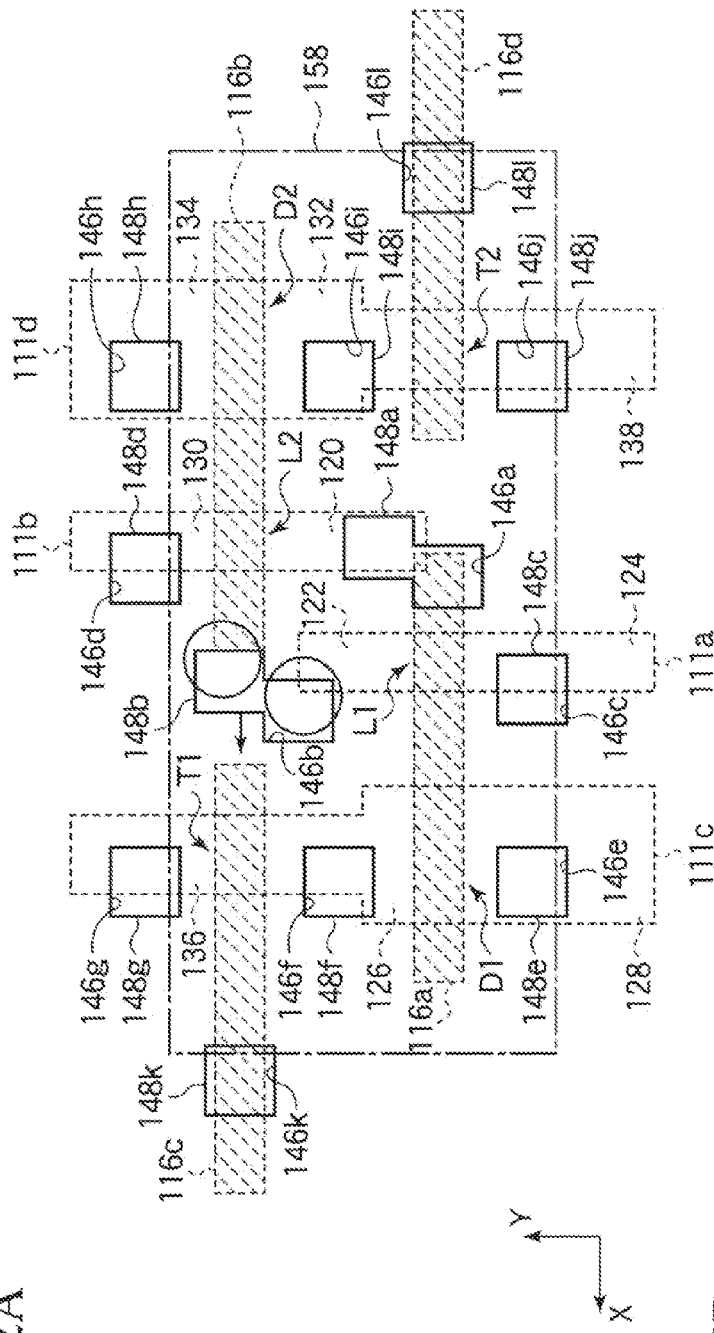
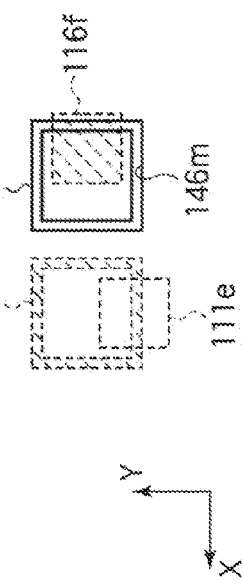
FIG. 52A
FIG. 52B

SEMICONDUCTOR DEVICE MANUFACTURING METHOD

CROSS-REFERENCE TO RELATED APPLICATION

This application is based upon and claims the benefit of priority of the prior Japanese Patent Application No. 2011-42675, filed on Feb. 28, 2011, the entire contents of which are incorporated herein by reference.

FIELD

The embodiments discussed herein are related to a semiconductor device manufacturing method.

BACKGROUND

Static Random Access Memory (SRAM) is a semiconductor device having the memory cells formed of flip-flop circuits and is operative at high speed.

In semiconductor devices, such as SRAM, etc., gate interconnections, conductor plugs, etc. are laid out in the memory cell parts in very high densities. The gate interconnections, the conductor plugs, etc. are laid out in very high density, whereby the size of the memory cells can be reduced, and the memory capacity can be increased.

Recently, to realize lower costs and larger capacities, the memory cells are required to be more micronized and integrated.

It is required to manufacture SRAM of high reliability at higher yields.

Related reference is as follows:
Japanese Laid-open Patent Publication No. 2002-33389.

SUMMARY

According to one aspect of an embodiment, a semiconductor device manufacturing method comprising: forming a device isolation region for defining a plurality of active regions in a semiconductor substrate and forming a first alignment mark in the semiconductor substrate; forming a first gate interconnection which is formed, crossing over one of said plurality of active regions and which is linear and includes the gate electrode of a first transistor, and a second gate interconnection which is formed, crossing over the other of said plurality of active regions and which is linear and in parallel with the first gate interconnection over the semiconductor substrate with a gate insulation film formed therebetween, and forming a second alignment mark over the semiconductor substrate; forming source/drain diffused layers respectively in the active regions; forming an insulation film over the semiconductor substrate and over the first gate interconnection and the second gate interconnection; forming a photoresist film over the insulation film; making alignment by using the second alignment mark and exposing on the photoresist film a first partial pattern for forming a first contact hole in the insulation film, overlapping at least a part of the first gate interconnection; making alignment by using the first alignment mark and exposing on the photoresist film a second partial pattern for forming the first contact hole in the insulation film, overlapping at least a part of the source/drain diffused layer of the second transistor; developing the photoresist film to form a first opening in the photoresist film at the portion where the first partial pattern and the second partial pattern have been exposed; etching the insulation film with the photoresist film as the mask to form in the insulation film the first contact hole down to the first gate interconnection and the source/drain diffused layer of the second transistor; and burying the first contact layer in the first contact hole.

According to another aspect of the embodiment, a semiconductor device manufacturing method comprising: forming a device isolation region for defining a plurality of active regions in a semiconductor substrate and forming a first alignment mark in the semiconductor substrate; forming a first gate interconnection which is formed, crossing over one of said plurality of active regions and which is linear and includes the gate electrode of a first transistor, and a second gate interconnection which is formed, crossing over the other of said plurality of active regions and which is linear and in parallel with the first gate interconnection over the semiconductor substrate with a gate insulation film formed therebetween, and forming a second alignment mark over the semiconductor substrate; forming source/drain diffused layers respectively in the active regions on both sides of the gate electrodes; forming the first insulation film over the semiconductor substrate, the first gate interconnection and the second gate interconnection; forming over the first insulation film the second insulation film which is different from the first insulation film in the etching characteristics; forming the first photoresist film over the second insulation film; making alignment by using the second alignment mark and exposing on the first photoresist film a first partial pattern for a first contact hole in the first insulation film, overlapping at least a part of the first gate interconnection; developing the first photoresist film to form a first opening in the first photoresist film at the portion where the first partial pattern has been exposed; etching the second insulation film by using as the mask the first photoresist film with the first opening formed in; forming a second photoresist film over the second insulation film; making alignment by using the first alignment mark to expose on the second photoresist film a second partial pattern for forming the first contact hole in the first insulation film, overlapping at least a part of the source/drain diffused layer of the second transistor; developing the second photoresist film to form a second opening in the second photoresist film at the portion where the second partial pattern has been exposed; etching the second insulation film by using as the mask the second photoresist film with the second opening formed in; etching the first insulation film with the second insulation film as the mask to form in the first insulation film the first contact hole down to the first gate interconnection and the source/drain diffused layer of the second transistor; and burying the first contact layer in the first contact hole.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 5A to 29B are views of the semiconductor device according to the first embodiment in the steps of the method for manufacturing the semiconductor device, which illustrate the method;

FIGS. 30A to 33B are plan views of the semiconductor device according to the first embodiment in the steps of the method for manufacturing the semiconductor device, which illustrate a case of disalignment;

FIGS. 34A to 48B are views of the semiconductor device in the steps of the semiconductor device manufacturing method according to a second embodiment, which illustrate the method;

FIGS. 49A to 52B are sectional views of the semiconductor device in the steps of the semiconductor device manufacturing method according to a reference example, which illustrate the method.

DESCRIPTION OF EMBODIMENTS

The proposed semiconductor device manufacturing method has not been always able to provide sufficiently high reliability and yields.

The semiconductor device manufacturing method according to the reference example will be described with reference to FIGS. 49A to 52B. FIGS. 49A to 52B are plan views of the semiconductor device in the steps of the semiconductor device manufacturing method, which illustrate the method.

Figure 49A:
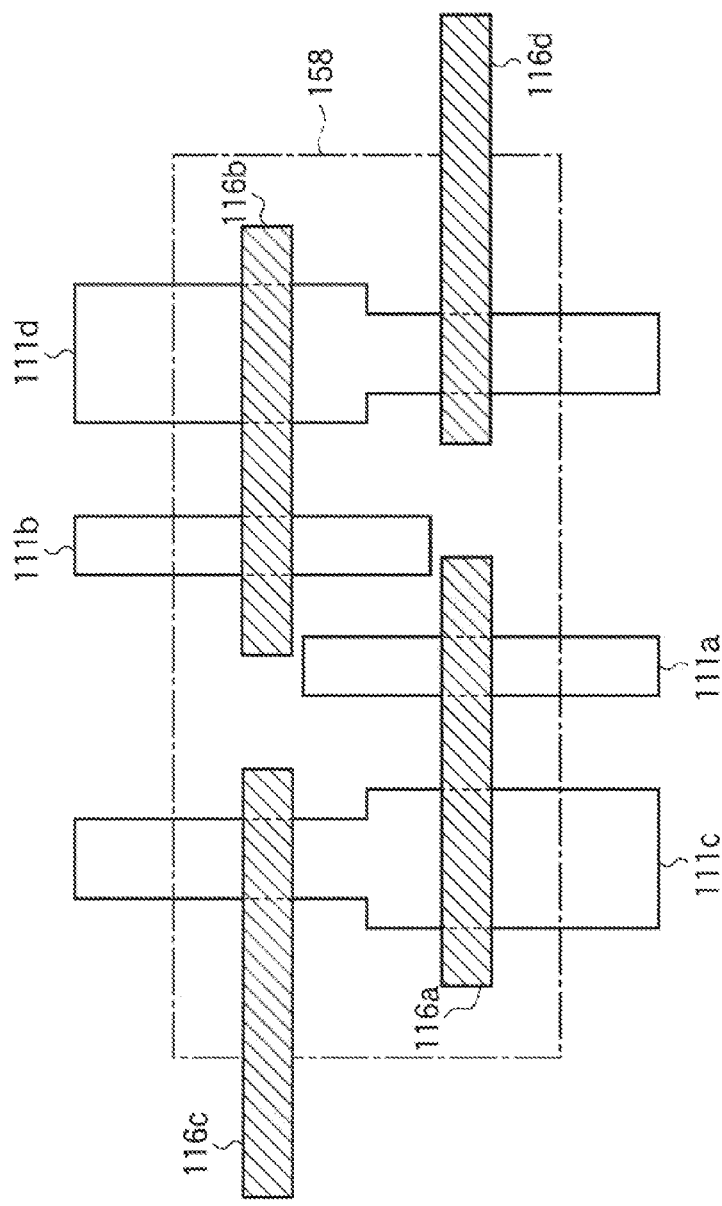
Figure 49B:
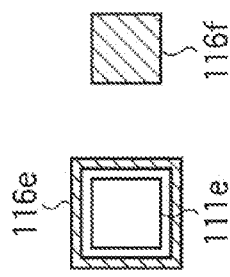
Figure 50A:
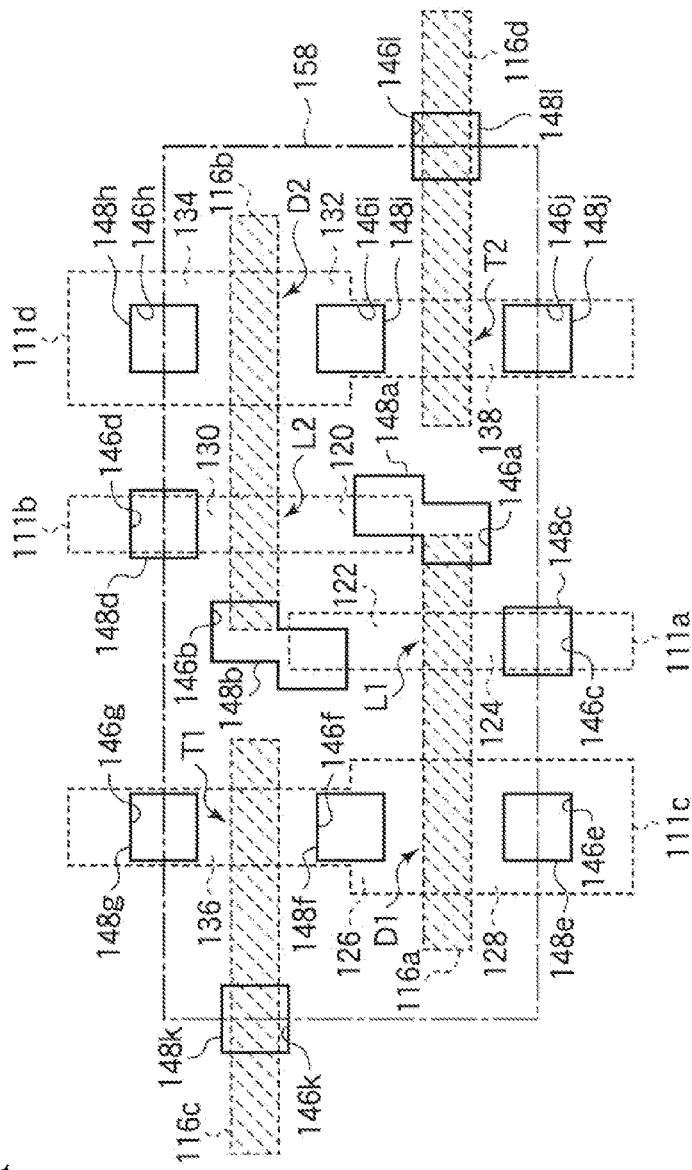
Figure 50B:
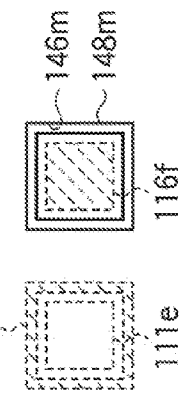

As illustrated in FIGS. 49A and 49B, active regions 111a-111d defined by a device isolation region (not illustrated) is formed in a part of a semiconductor substrate (not illustrated) a memory cell 158 is to be formed. Simultaneously with forming the active regions 111a-111d, alignment mark 111e is also formed. The alignment mark 111e is formed of the same film of the device isolation region defining the active regions 111a-111e.

Next, gate interconnections 116a-116d are formed, crossing the active regions 111a-111d. When the patterns of the gate interconnections 116a-116d are transferred, the mask (reticle) is aligned with the alignment mark 111e. Simultaneously with forming the gate interconnections 116a-116d, the alignment marks 116e, 116f are formed. The alignment marks 116e, 116f are formed of the same film as the gate interconnections 116a-116d.

Then, in the active regions 111a-111d on both sides of the gate interconnections 116a-116d, source/drain diffused layers 120, 122, 124, 126, 128, 130, 132, 134, 136, 138 are formed.

Thus, load transistors L1, L2, driver transistors D1, D2 and transfer transistors T1, T2 are formed.

Next, an inter-layer insulation film (not illustrated) is formed on the semiconductor substrate.

Then, contact holes 146a-146l are transferred on the inter-layer insulation film. When the contact holes 146a-146l are transferred, the mask is aligned with the alignment mark 116f. Simultaneously with forming the contact holes 146a-146l, an opening 146m of the pattern of the alignment mark for the mask is formed.

Next, contact layers 148a-148l are buried in the contact holes 148a-148l. At this time, the alignment mark 148m is buried in the opening 146m (see FIGS. 50A and 50B).

However, in aligning the mask, disalignments often take place.

Figure 51A:
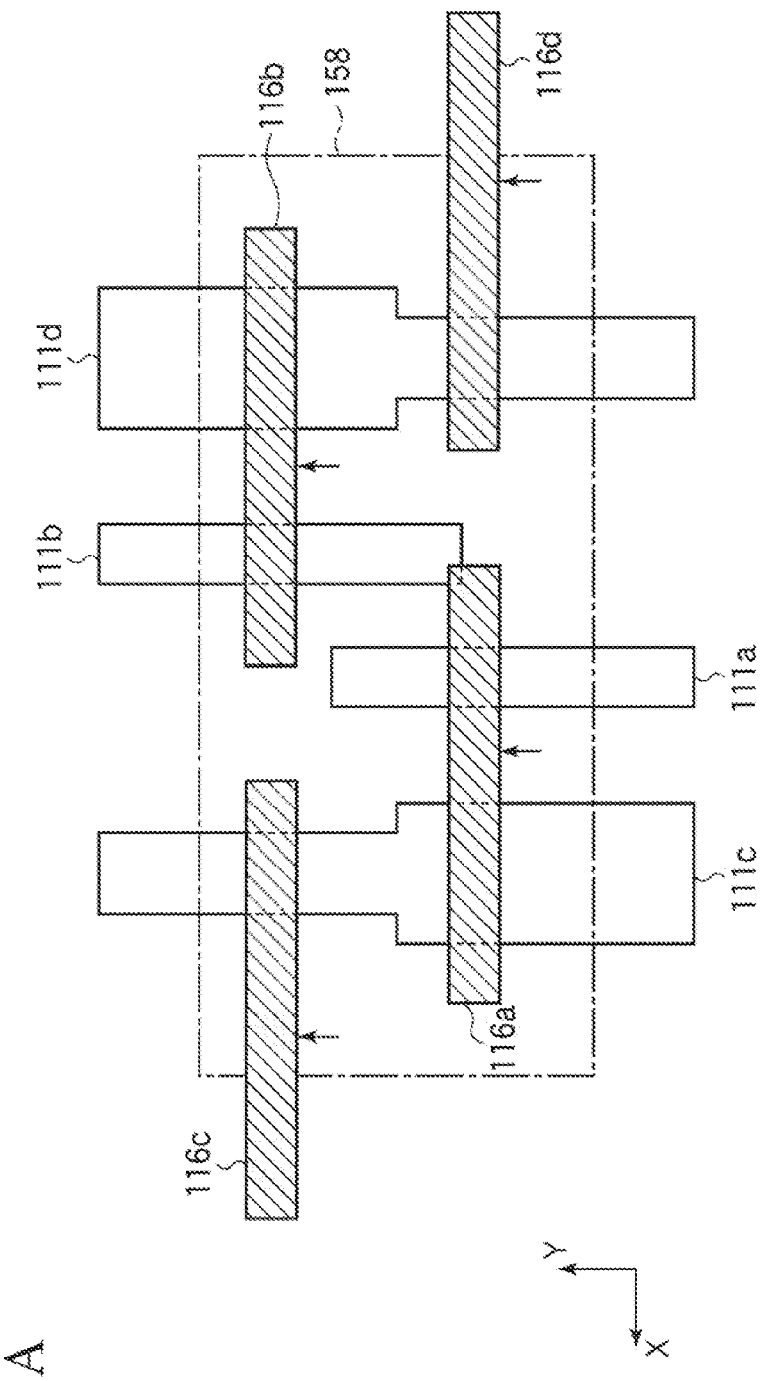
Figure 51B:
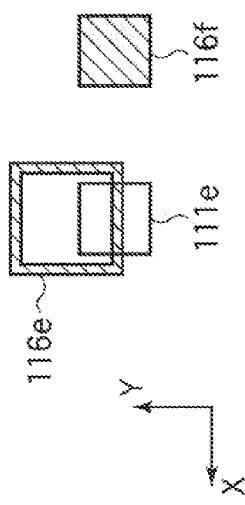

FIGS. 51A and 51B illustrate a case that a large disalignment has taken place in the Y direction in transferring the patterns of the gate interconnections 116a-116d.

FIGS. 52A and 52b illustrate a case that a large disalignment has further taken place in the X direction in transferring the pattern of the contact holes 246a.

When such disalignments take place, defective connections often take place between the contact layers 148a, 148b and the gate interconnections 116a, 116b in the encircled parts in FIG. 52A. Between the contact layers 148a, 148b and the source/drain diffused layers 120, 122, defective connections often take place.

The inventors of the present application have made earnest studies and got an idea that a semiconductor device of high reliability can be manufactured in the following way with high yields.

Preferred embodiments of the present invention will be explained with reference to accompanying drawings.

[a] First Embodiment

The semiconductor device according to a first embodiment and its manufacturing method will be described with reference to FIGS. 1A to 33B.

[The Semiconductor Device]

Figure 1A:
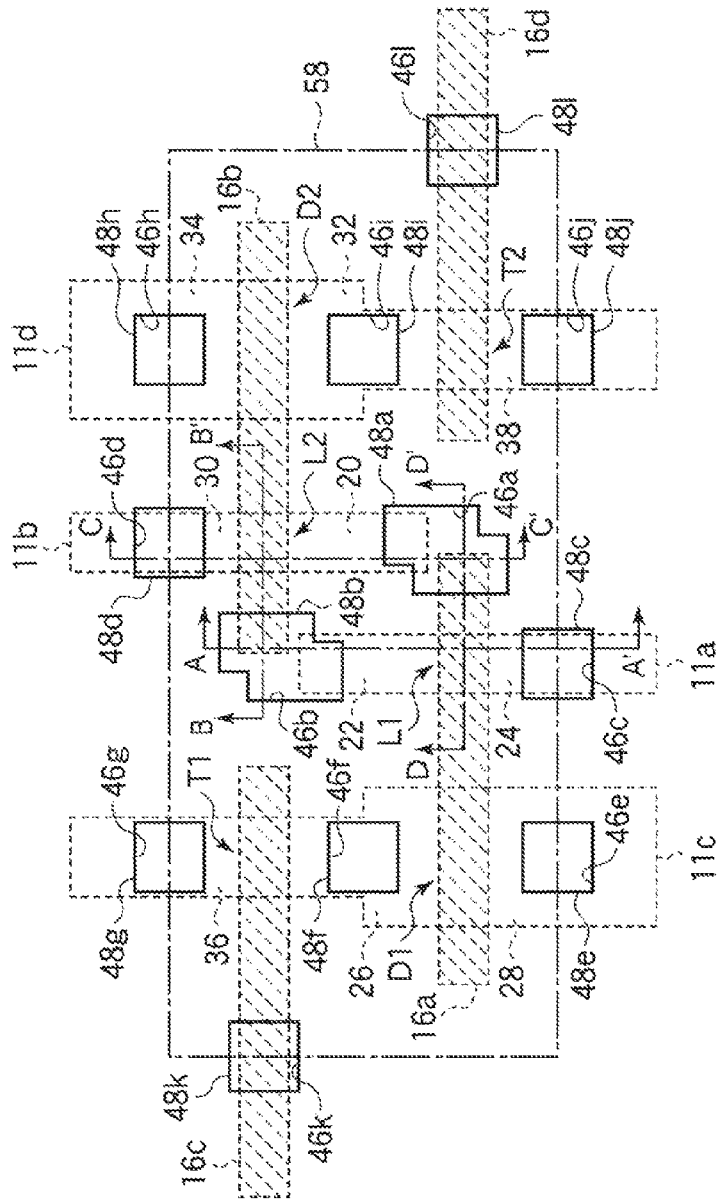
FIGS. 1A and 1B are plan views of the semiconductor device according to a first embodiment (Part 1)
Figure 1B:
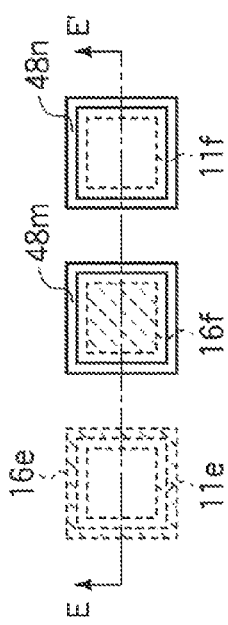
Figure 2A:
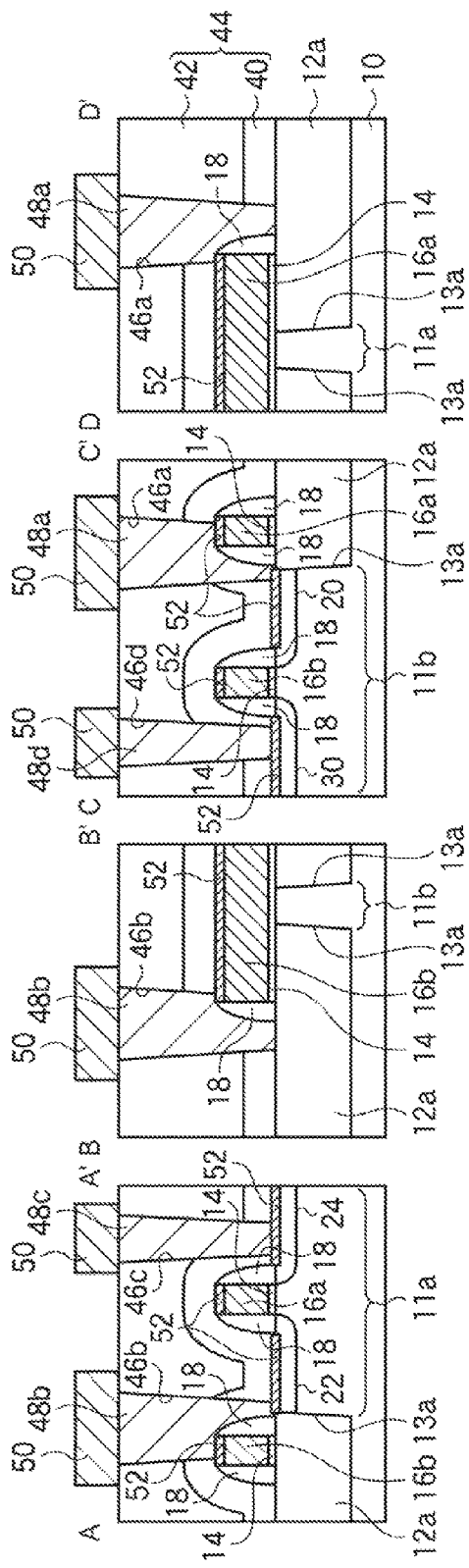
FIGS. 2A and 2B are sectional views of the semiconductor device according to the first embodiment.
Figure 2B:
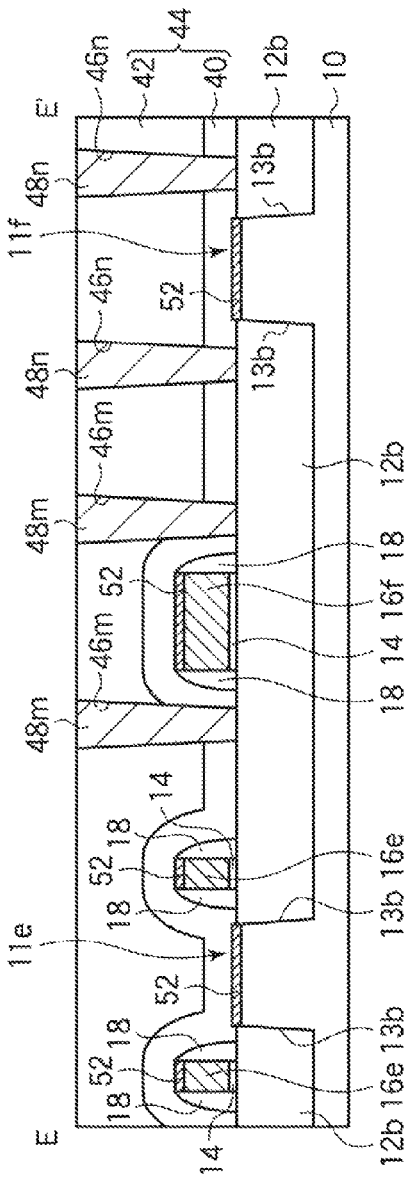
Figure 3:
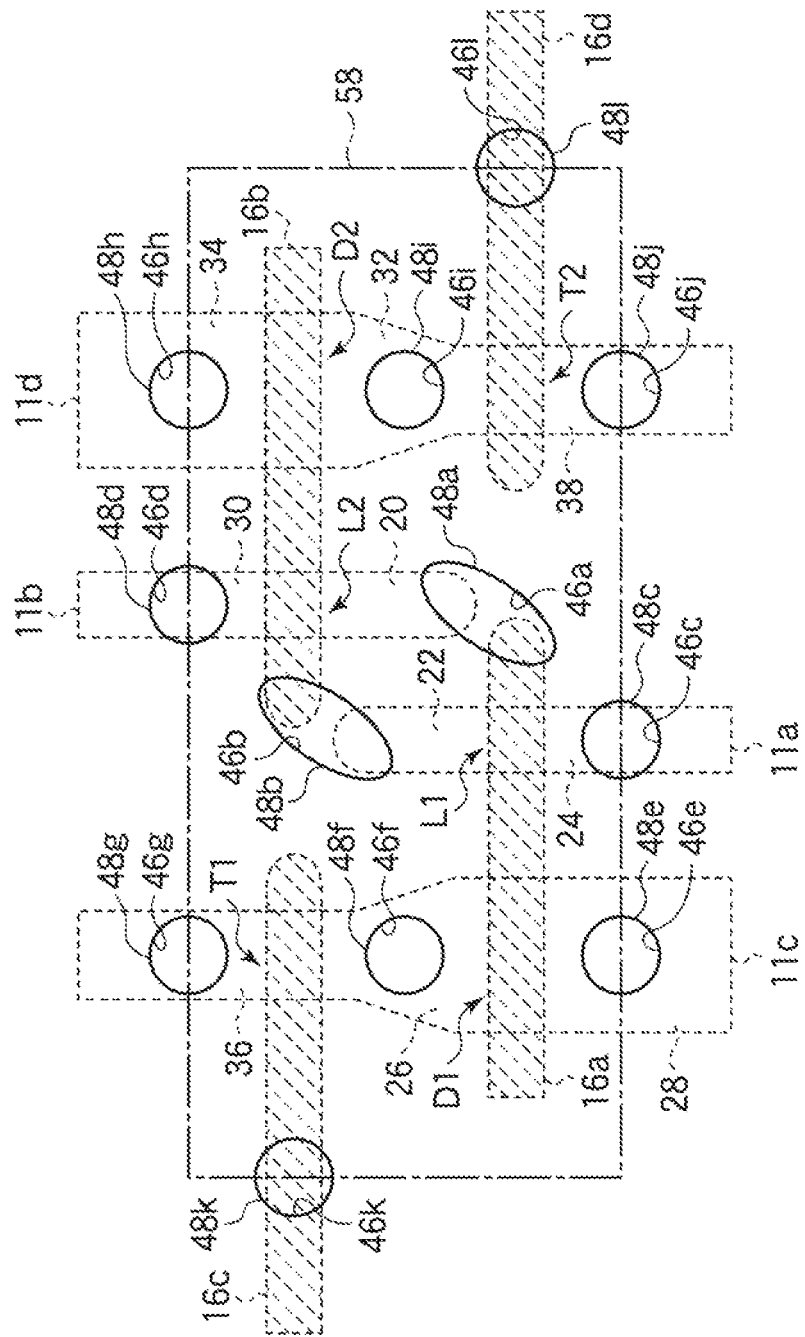
FIG. 3 is a plan view of the semiconductor device according to the first embodiment (Part 2)
Figure 4:
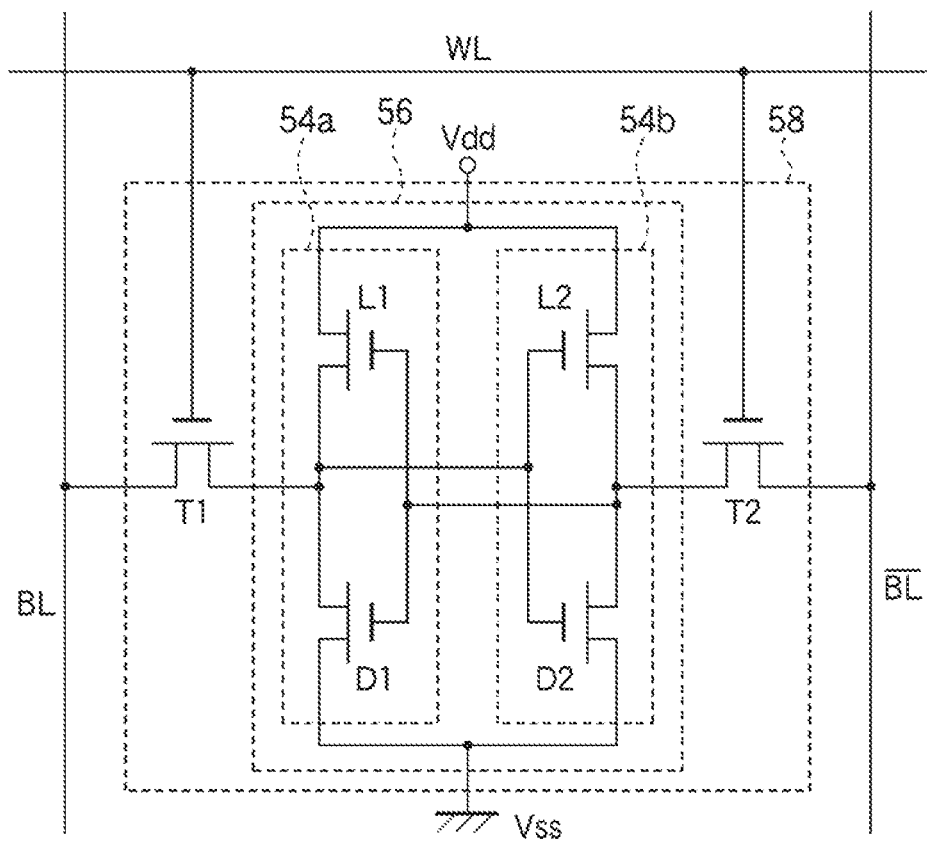
FIG. 4 is a circuit diagram of the semiconductor device according to the first embodiment.

First, the semiconductor device according to the present embodiment will be described with reference to FIGS. 1A to 4. FIGS. 1A and 1B are plan views of the semiconductor device according to the present embodiment (Part 1). FIG. 1A illustrates one of plural memory cells formed in the memory cell region. FIG. 1B illustrates the alignment marks provided in the peripheral part of a semiconductor chip. FIGS. 2A and 2B are sectional views of the semiconductor device according to the present embodument. The leftmost view of FIG. 2A is the A-A' line sectional view of FIG. 1A. The second view of FIG. 2A from the left is the B-B' line sectional view of FIG. 1A. The third view of FIG. 2A from the left is the C-C' line sectional view of FIG. 1A. The fourth view of FIG. 2A from the left is the D-D' line sectional view of FIG. 1A. FIG. 2B is the E-E' line sectional view of FIG. 1B. FIG. 3 is a plan view (Part 2) of the semiconductor device according to the present embodiment. FIGS. 1A and 1B illustrate the configuration of the design pattern, and FIG. 3 illustrates an example of the configuration of the pattern to be actually formed. FIG. 3 corresponds to FIG. 1A, and FIG. 4 is a circuit view of the semiconductor device according to the present embodiment.

In a semiconductor substrate 10, a device isolation region 12a defining the device regions 11a-11d is formed. The device isolation region 12a is buried in a trench 13a formed in the semiconductor substrate 10. The semiconductor substrate 10 is, e.g., a silicon substrate. As the device isolation region 12a, silicon oxide film, for example, is used.

In the semiconductor substrate 10, alignment marks 11e, 11f are formed. The alignment marks 11e, 11f are provided, e.g., in the peripheral part of the semiconductor substrate (semiconductor chip) 10. The alignment marks 11e, 11f are defined by the same insulation film 12b as the device isolation region 12a. The insulation film 12b defining the alignment marks 11e, 11f is buried in the trench 13b formed in the semiconductor substrate 10.

The plane shape of the alignment marks 11e, 11f is, e.g., a rectangle.

The plane shape of the alignment marks 11e, 11f is not limited to rectangle. The plane shapes of the alignment marks 11e, 11f can be, e.g., a frame shape or others.

On the semiconductor substrate 10, gate interconnections 16a-16d are formed with a gate insulation film 14 formed therebetween. On the semiconductor substrate 10, alignment marks 16e, 16f are formed with the insulation film 14 formed therebetween. The alignment marks 16e, 16f are formed of the same film as the gate interconnections 16a-16d. That is, the gate interconnections 16a-16d and the alignment marks 16e, 16f are formed by patterning the same film.

The plane shape of the alignment mark 16e is, e.g., a frame-shape.

The plane shape of the alignment mark 16e is not limited to a frame-shape. The plane shape of the alignment mark 16e can be a rectangle or others.

The plane shape of the alignment mark 16f is, e.g., a rectangle.

The plane shape of the alignment mark 16f is not limited to a rectangle. The plane shape of the alignment mark 16f can be, e.g., a frame shape or others.

A sidewall insulation film 18 is formed on the respective side walls of the gate interconnections 16a-16d and the alignment marks 16e, 16f.

The gate interconnection 16a is formed, crossing the device regions 11a, 11c. The gate interconnection 16a includes the gate electrode of a load transistor L1, the gate electrode of a driver transistor D1 and commonly connects the gate electrode of the load transistor L1 and the gate electrode of the driver transistor D1. The gate interconnection 16a is extended to the vicinity of the source/drain diffusion layers 20 of the load transistor L2 formed in the device region 11b.

In the device region 11a on both sides of the gate interconnection 16a, source/drain regions 22, 24 are formed. The gate electrode 16a and the source/drain diffused layers 22, 24 form the load transistor L1.

In the device region 11c on both sides of the gate interconnection 16a, source/drain diffused layers 26, are formed. The gate electrode 16a and the source/drain diffused layer 26, 28 form the driver transistor D1.

The gate interconnection 16b is formed, crossing the device regions 11b, 11d. The gate interconnection 16b includes the gate electrode of the load transistor L2 and the gate electrode of the driver transistor D2 and commonly connects the gate electrode of the load transistor L2 and the gate electrode of the driver transistor D2. The gate interconnection 16b is extended to the vicinity of the source/drain diffused layer 22 of the load transistor L1 formed in the device region 11a. The longitudinal direction of the gate interconnection 16a and the longitudinal direction of the gate interconnection 16b are the same. The gate interconnections 16a and the gate interconnection 16b are opposed to each other in a partial region.

In the device region 11b on both sides of the gate interconnection 16b, source/drain diffused layers 20, 30 are formed. The gate electrode 16b and the source/drain diffused layer 20, 30 form the load transistor L2.

In the device region 11d on both sides of the gate interconnection 16b, source/drain diffused layers 32, 34 are formed. The gate electrode 16b and the source/drain diffused layers 32, 34 form the driver transistor D2.

The gate interconnection 16c is formed, crossing the device region 11c. The gate interconnection 16c is positioned on the extended line of the gate interconnection 16b. The gate interconnection 16c includes the gate electrode of a transfer transistor T1. Source/drain diffused layers 26, 36 are formed in the device region 11c on both sides of the gate interconnection 16c. The gate electrode 16c and the source/drain diffused layers 26, 36 form the transfer transistor T1. One of the source/drain diffused layers 26 of the transfer transistor T1 and one of the source/drain diffused layers 26 of the driver transistor D1 are formed of the common source/drain diffused layer 26.

The gate interconnection 16d is formed, crossing the device region 11d. The gate interconnection 16d is positioned on the extended line of the gate interconnection 16a. The gate interconnection 16d includes the gate electrode of a transfer transistor T2. Source/drain diffused layers 32, 38 are formed in the device region 11d on both sides of the gate electrode 16d. The gate electrode 16d and the source/drain diffused layers 32, 38 form the transfer transistor T2. One of the source/drain diffused layers 32 of the transfer transistor T2 and one of the source/drain diffused layers 32 of the driver transistor D2 is formed of the common source/drain diffused layer 32.

The width of the gate interconnections 16a-16d, e.g., the gate length is, e.g., about 35-60 nm. The height of the gate interconnections 16a-16d is, e.g., about 70-100 nm. The interval between the gate interconnections 16a, 16d and the gate interconnections 16b, 16c, i.e., the pitch of the gate interconnections is, e.g., about 0.16-0.2 μm.

On the source/drain diffused layers 20, 22, 24, 26, 28, 30, 32, 34, 36, 38, a silicide film 52 of, e.g., nickel silicide is formed. The silicide film 52 on the source/drain diffused layers 20, 22, 24, 26, 28, 30, 32, 34, 36, 38 functions as the source/drain electrodes. On the gate interconnections 16a-16d, the silicide film 52 of, e.g., nickel silicide is formed.

On the semiconductor substrate 10 with these transistors L1, L2, D1, D2, T1, T2 formed on, an insulation film 40 of, e.g., silicon nitride is formed. The insulation film 40 is formed, filling the gaps between the gate electrodes 16a-16d.

On the semiconductor substrate 10 with the insulation film 40 formed on, an insulation film 42 of, e.g., silicon dioxide is formed. The surface of the insulation film 42 is planarized by polishing. The insulation film 40 and the insulation film 42 form an inter-layer insulation film 44.

In the inter-layer insulation film 44, a contact hole (opening) 46a for exposing the end of the gate interconnection 16a and the source/drain diffused layer 20 of the load transistor L2 is formed. The shape of the section of the opening 46a in the direction parallel with the surface of the semiconductor substrate 10 is, e.g., substantially elliptical (see FIG. 3). In the opening 46a, a contact layer (conductor plug) 48a of, e.g., tungsten is buried.

In the inter-layer insulation film 44, an opening 46b for integrally exposing the end of the gate interconnection 16b and the source/drain diffused layer 22 of the load transistor L1 is formed. The shape of the section of the opening 46b in the direction parallel with the surface of the semiconductor substrate 10 is, e.g., substantially elliptical (see FIG. 3). In the opening 46b, a contact layer 48b of, e.g., tungsten is buried.

The contact layers 48a, 48b are called shared contacts.

In the inter-layer insulation film 44, an opening 46c for exposing the source/drain diffused layer 24 of the load transistor L1 and an opening 46d for exposing the source/drain diffused layer 30 of the load transistor L2 are formed. In the inter-layer insulation film 44, an opening 46e for exposing the source/drain diffused layer 28 of the driver transistor D1 and an opening 46f for exposing the common source/drain diffused layer 26 of the driver transistor D1 and the transfer transistor T1 are formed. In the inter-layer insulation film 44, an opening 46g for exposing the source/drain diffused layer 36 of the driver transistor T1 and an opening 46h for exposing the source/drain diffused layer 34 of the driver transistor D2 are formed. In the inter-layer insulation film 44, an opening 46i for exposing the common source/drain diffused layer 32 of the driver transistor D2 and the transfer transistor T2 and an opening 46j for exposing the source/drain diffused layer 38 of the driver transistor T2 are formed. In the inter-layer insulation film 44, an opening 46k for exposing the gate interconnection 16c and an opening 46l for exposing the gate interconnection 16d are formed.

The shape of the section of the openings 46c-46l in the direction parallel with the surface of the semiconductor substrate 10 is, e.g., substantially circular (see FIG. 3). The diameter of the openings 46c-46l is, e.g., 50-80 nm. In the openings 46c-46l, contact layers 48c-48l of, e.g., tungsten are buried.

In the inter-layer insulation film 44, openings 46m, 46n are formed down to the insulation film 12b. In the openings 46m, 46n, alignment marks 48m, 48n are buried.

The plane shape of the alignment marks 48m, 48n is, e.g., a frame shape.

The plane shape of the alignment marks 48m, 48n are not especially limited to the frame shape. The plane shapes of the alignment marks 48m, 48n can be, e.g., a rectangle or others.

On the inter-layer insulation film 44, interconnections 50 (see FIGS. 2A and 2B) connected respectively to the contact layers 48a-48l are formed.

The contact layer 48a and the contact layer 48i are electrically connected by the interconnection 50. The contact layer 48b and the contact layer 48f are electrically connected by the interconnection 50.

The interconnection 50 connected to the contact layers 48c, 48d are electrically connected to a source voltage Vdd (see FIG. 4). The interconnection 50 connected to the contact layers 48e, 48h are electrically connected to a source voltage Vss (see FIG. 4).

The interconnections 50 connected to the contact layers 46g, 46j are electrically connected to the bit lines BL (see FIG. 4). The gate interconnections 16a, 16b are electrically connected to the word line WL (see FIG. 4) via contact layers not illustrated and the interconnections 50.

FIG. 4 is a circuit diagram of the memory cell of the semiconductor device according to the present embodiment.

As illustrated in FIG. 4, the load transistor L1 and the driver transistor D1 form an inverter 54a. The load transistor L2 and a driver transistor D2 form an inverter 54b. The inverter 54a and the inverter 54b form a flip-flop circuit 56. The flip-flop circuit 56 is controlled by the transfer transistors T1, T2 connected to the bit lines BL and the word line WL. The load transistors L1, L2, the driver transistors D1, D2 and the transfer transistors T1, T2 form the memory cell 58.

[The Method for Manufacturing the Semiconductor Device]

Figure 11A:
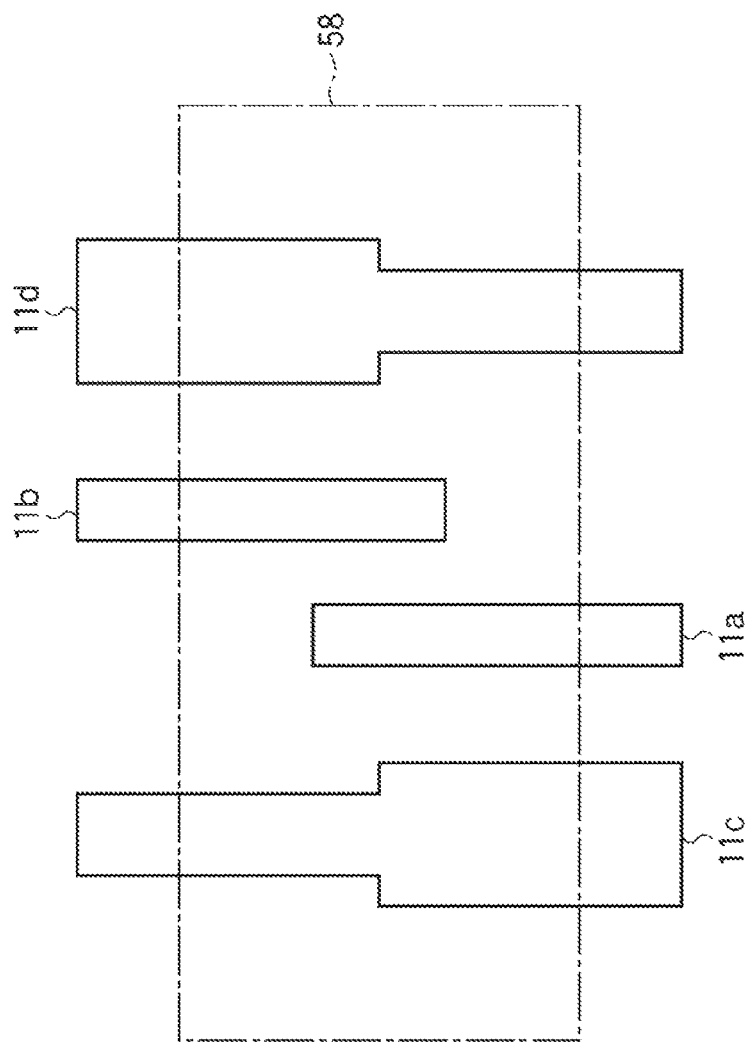
Figure 11B:
Figure 12A:
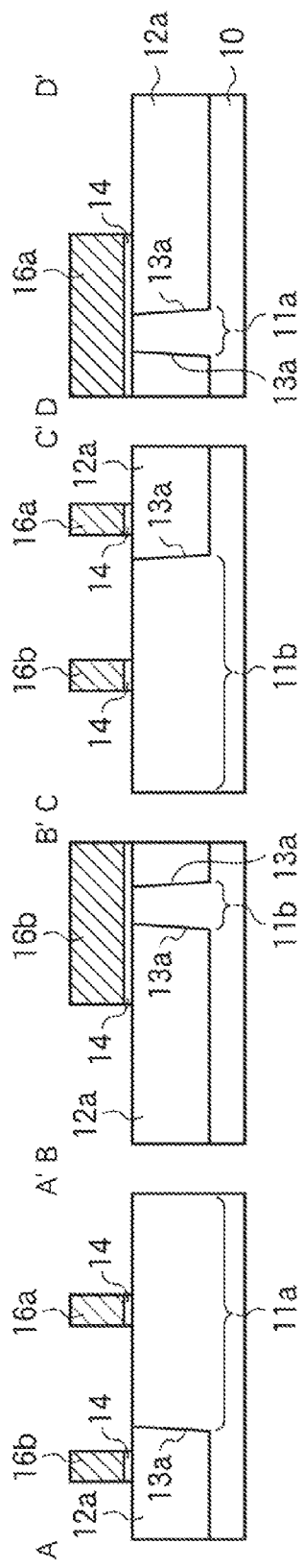
Figure 12B:
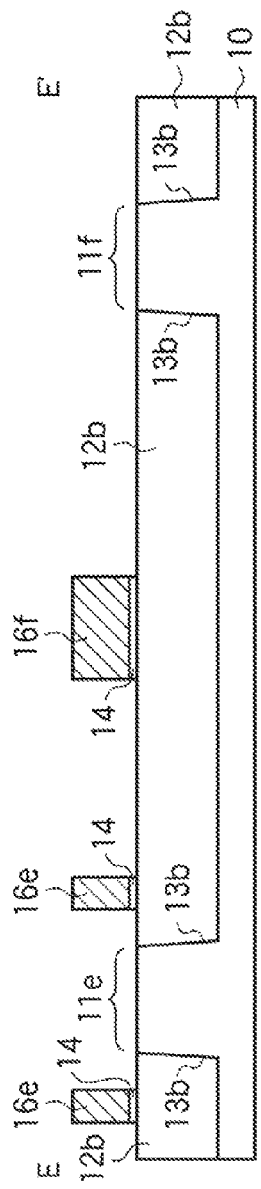
Figure 14A:
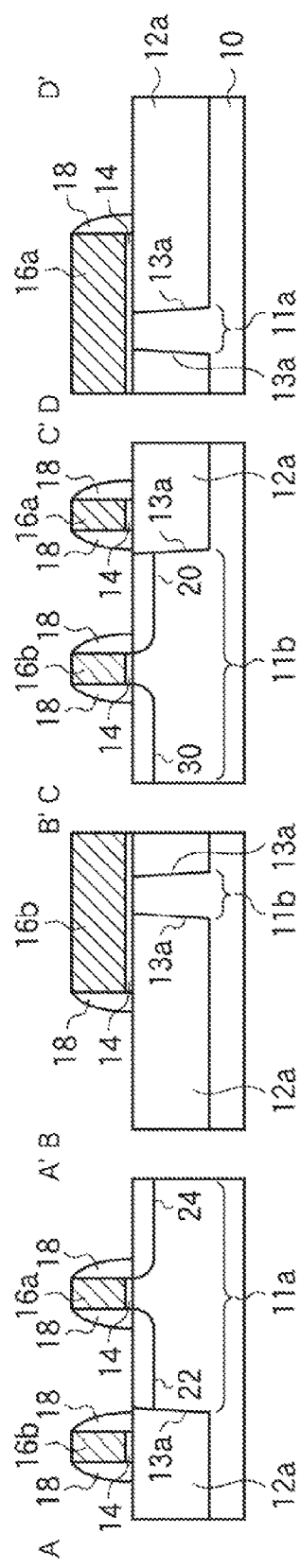
Figure 14B:
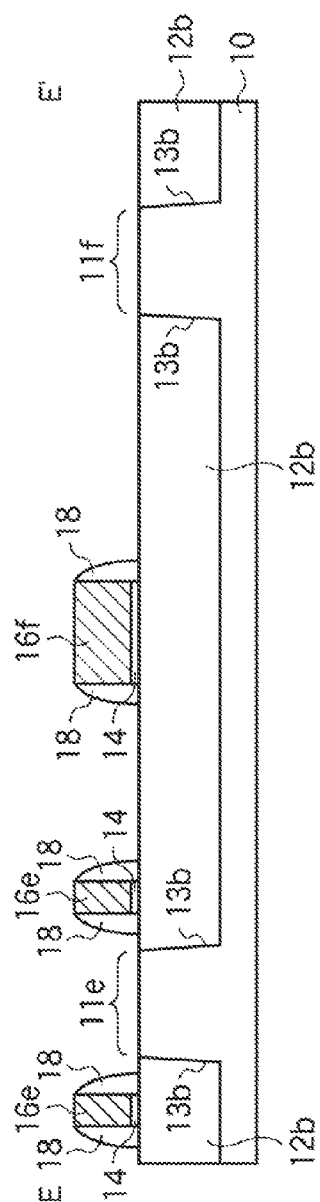
Figure 15A:
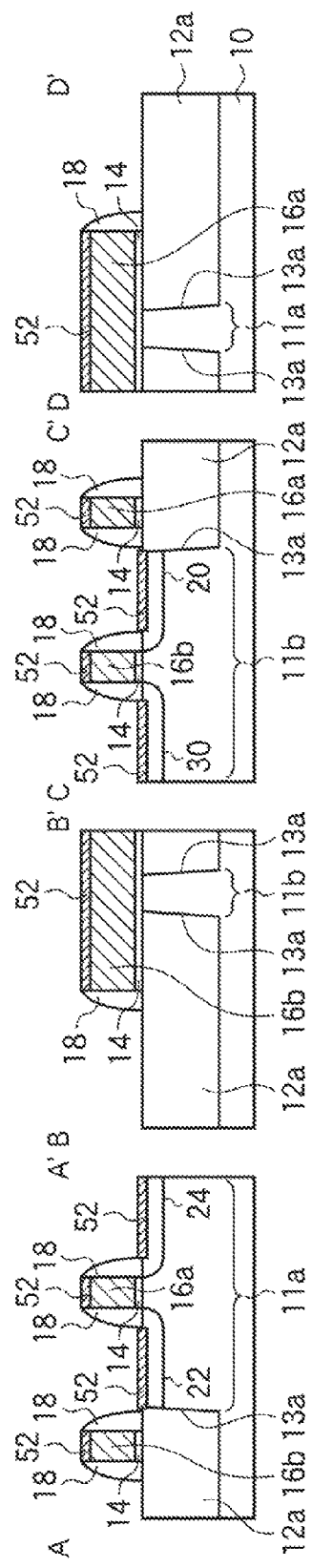
Figure 15B:
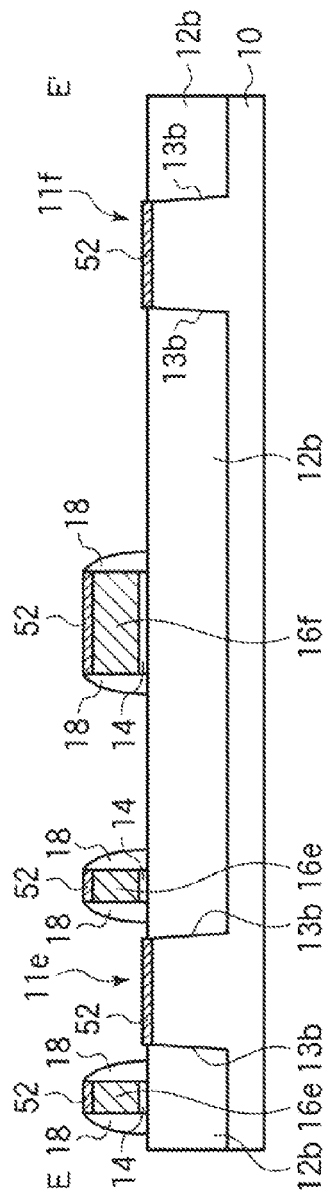
Figure 16A:
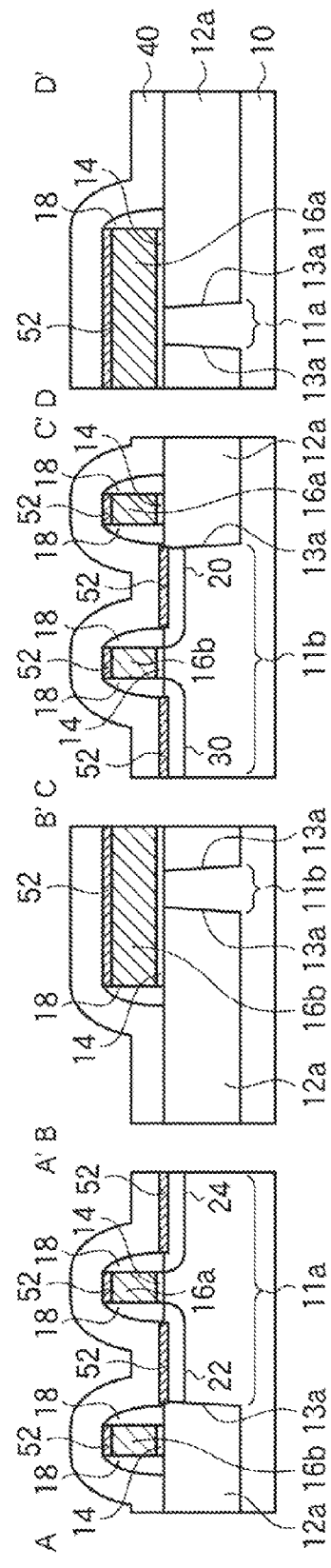
Figure 16B:
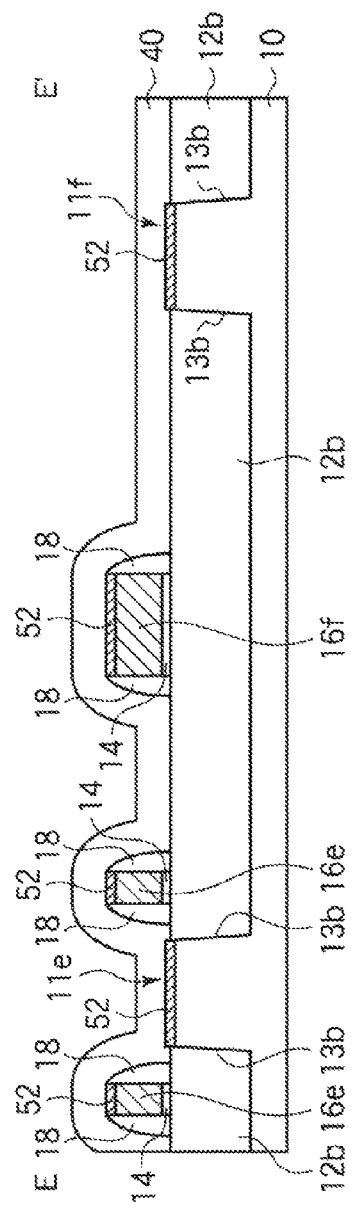
Figure 17A:
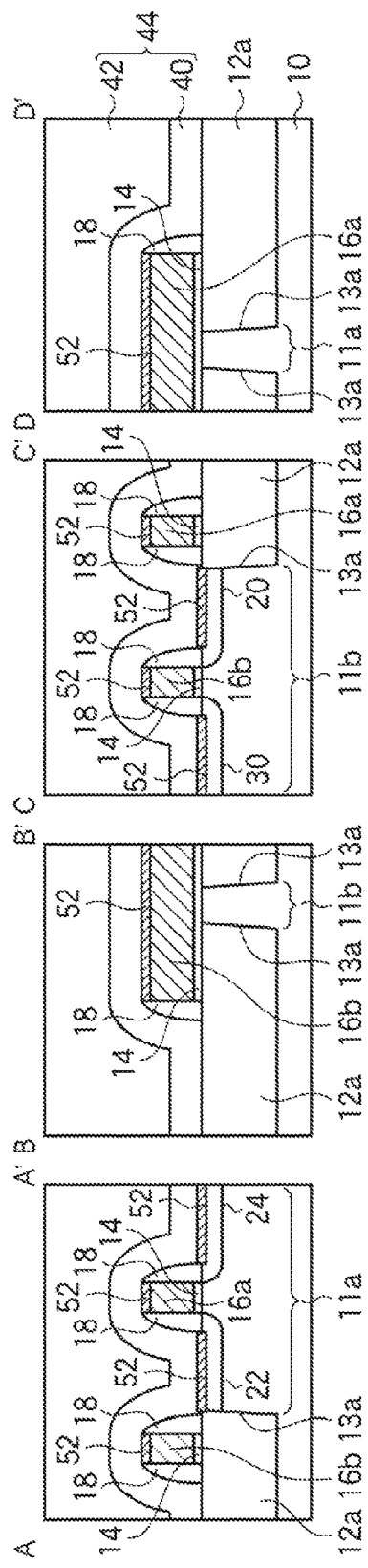
Figure 17B:
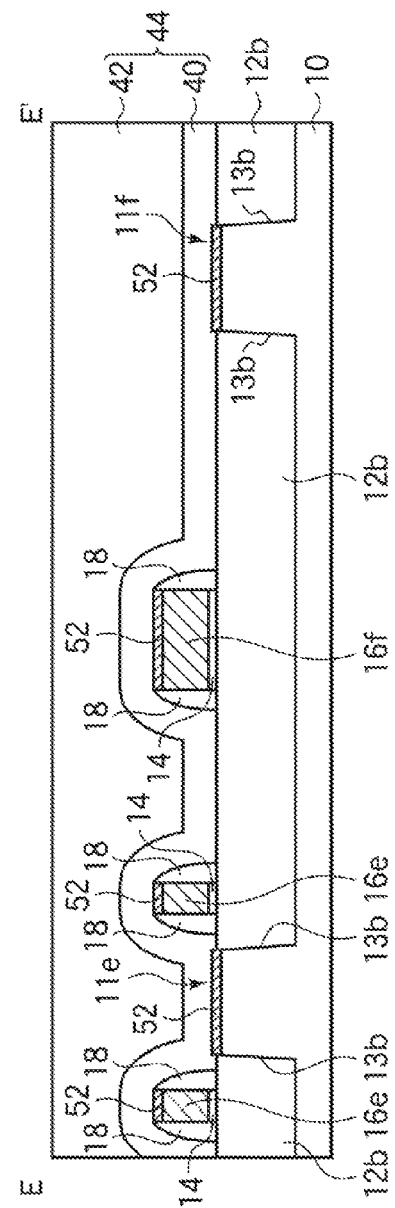
Figure 22A:
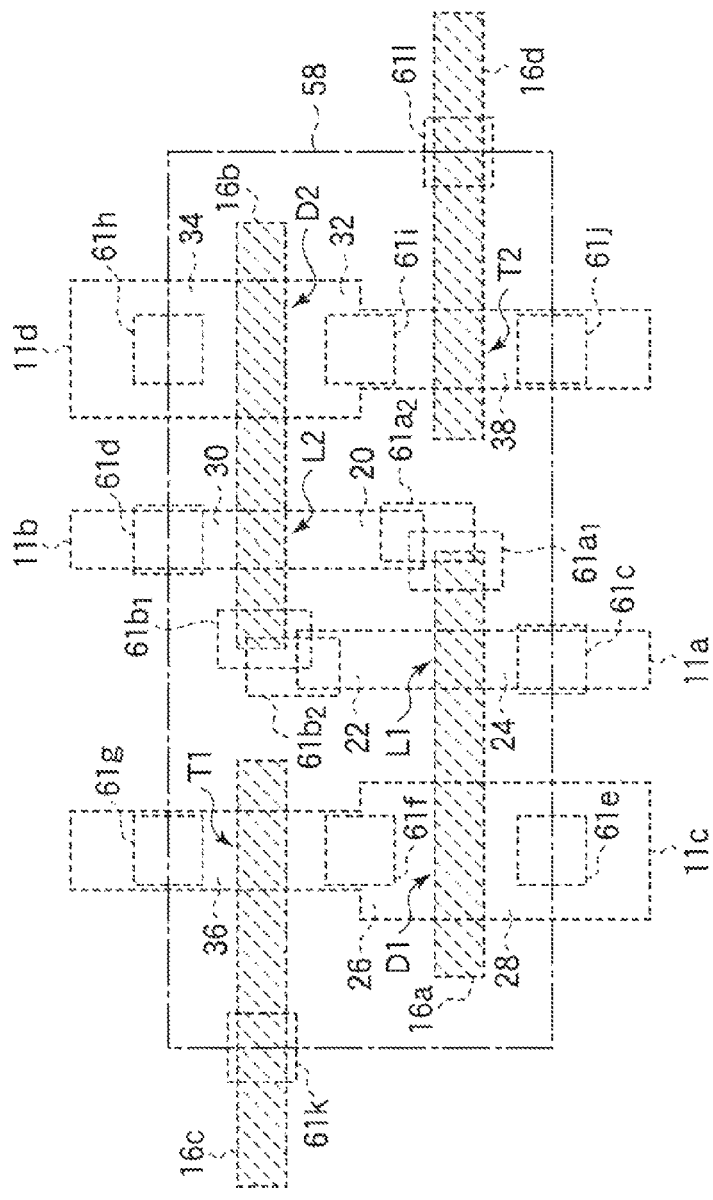
Figure 22B:
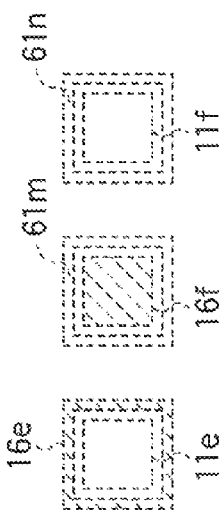
Figure 24A:
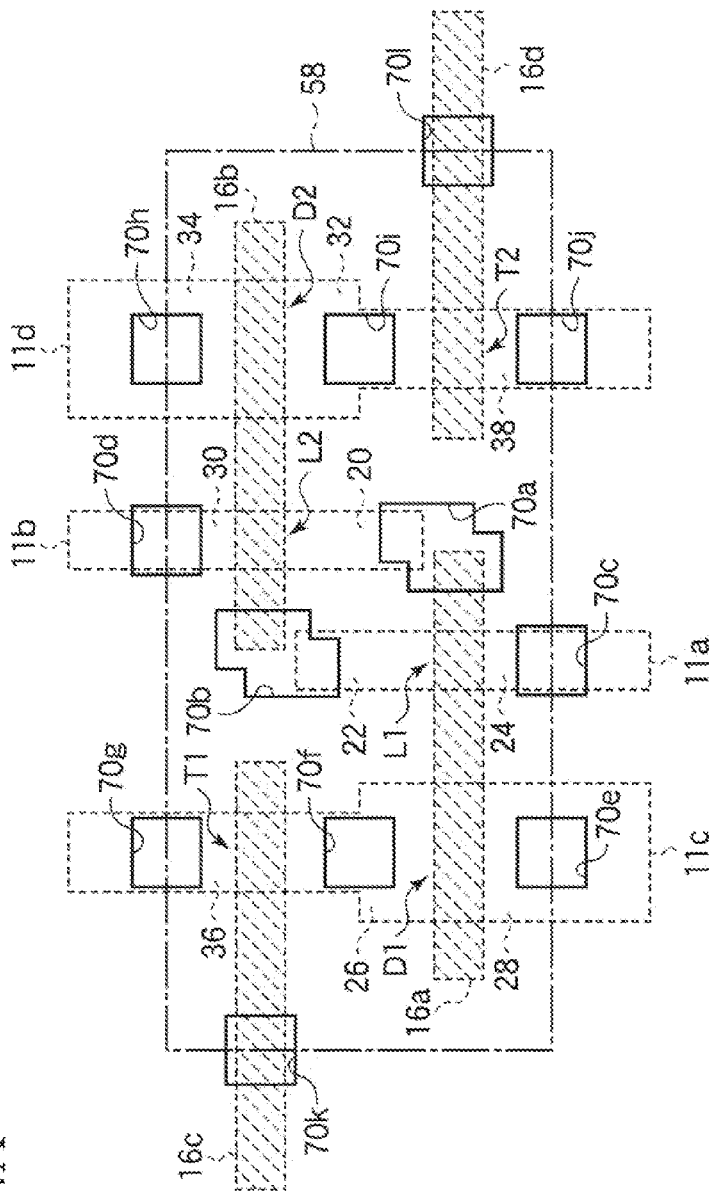
Figure 24B:
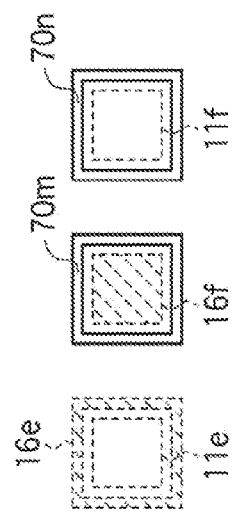
Figure 27A:
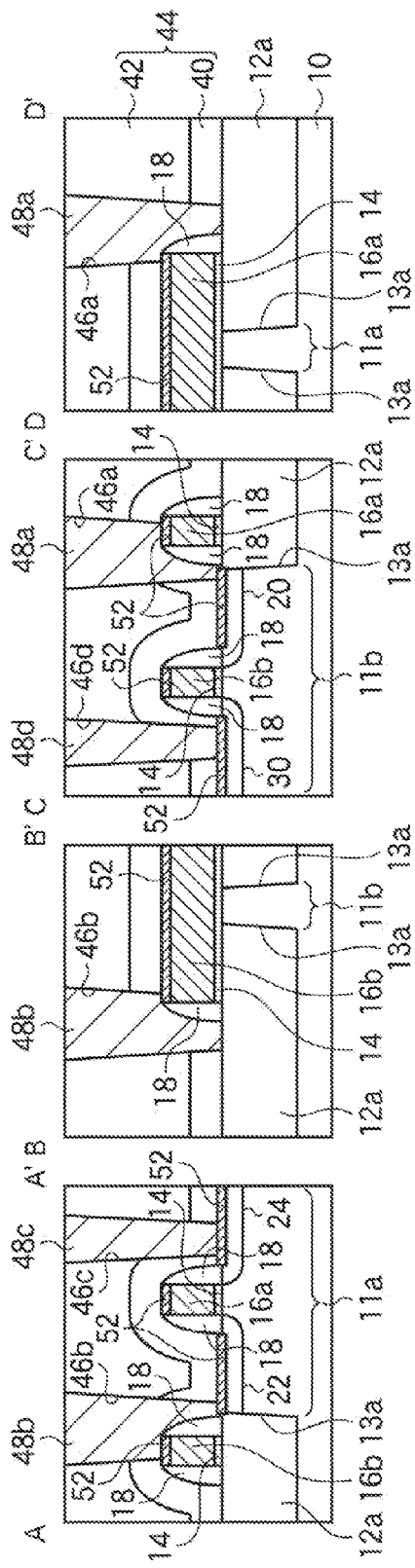
Figure 27B:
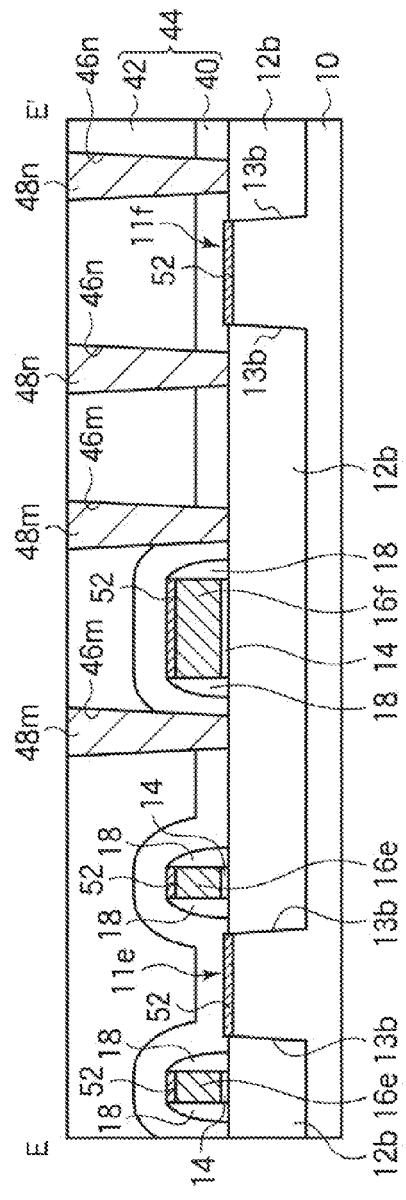
Figure 28A:
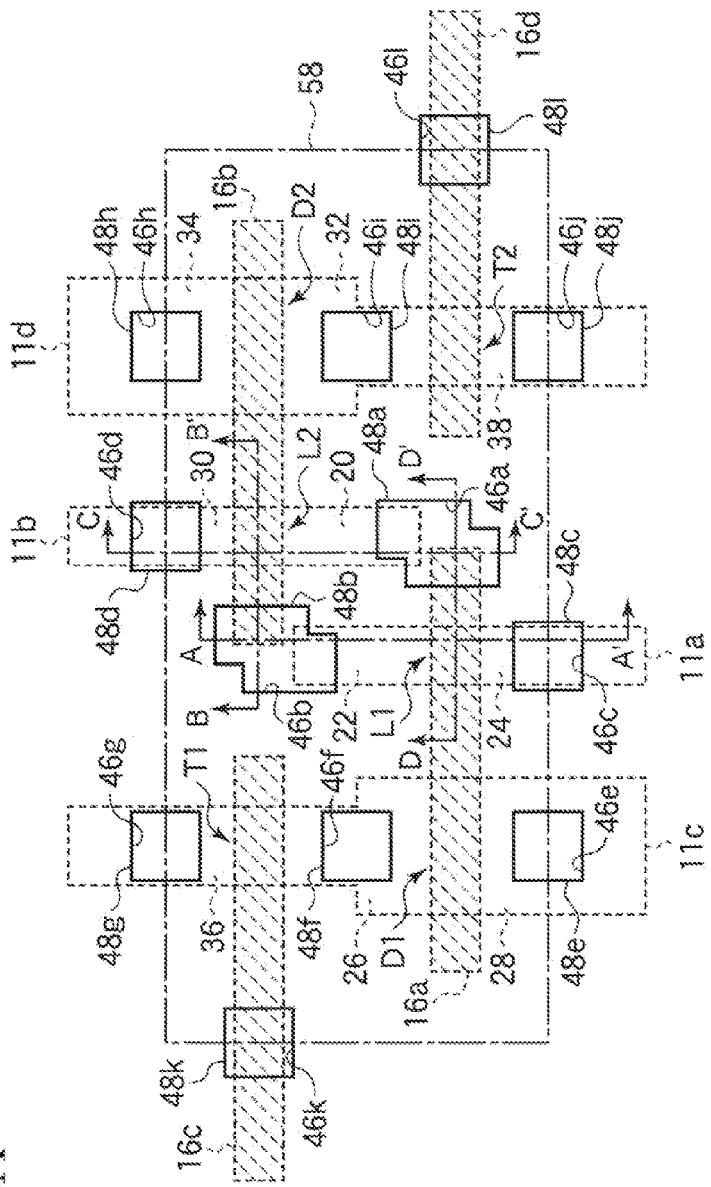
Figure 28B:
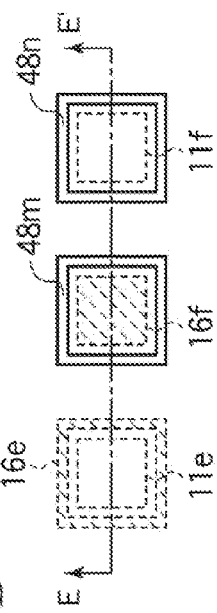

Next, the method for manufacturing the semiconductor device according to the present embodiment will be described with reference to FIGS. 5A to 29B. FIGS. 5A to 29B are views of the semiconductor device according to the present embodiment in the steps of the method for manufacturing the semiconductor device. FIGS. 5A to 10B are sectional views. FIGS. 11A and 11B are plan views corresponding to the views of FIGS. 10A and 10B. FIGS. 12A and 12B are sectional views. FIGS. 13A and 13B are plan views corresponding to the views of FIGS. 12A and 12B. FIGS. 14A to 19B are sectional views. FIGS. 20A and 20B are plan views corresponding to the views of FIGS. 19A and 19B. FIGS. 21A and 21B are sectional views. FIGS. 22A and 22B are plan views corresponding to the views of FIGS. 21A and 21B. FIGS. 23A and 23B are sectional views. FIGS. 24A and 24B are plan views corresponding to the views of FIGS. 23A and 23B. FIGS. 25A and 25B are sectional views. FIGS. 26A and 26B are plan views corresponding to the views of FIGS. 25A and 25B. FIGS. 27A and 27B are sectional views. FIGS. 28A and 28B are plan views corresponding to the views of FIGS. 27A and 27B. FIGS. 29A and 29B are sectional views.

Figure 5A:
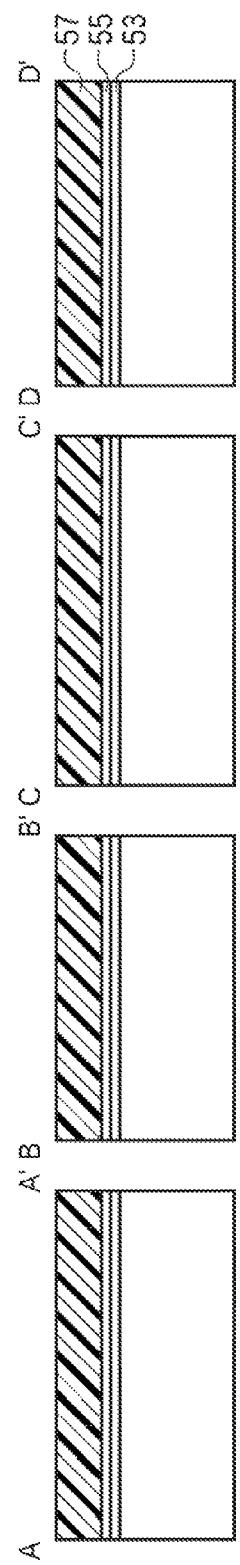
Figure 5B:
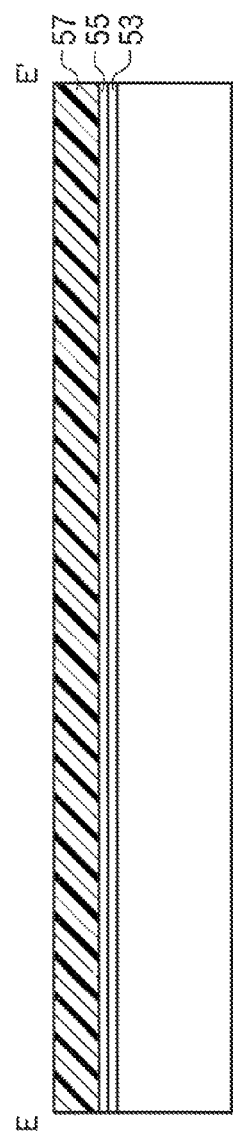

First, as illustrated in FIGS. 5A and 5B, the semiconductor substrate (semiconductor wafer) 10 is prepared. As the semiconductor substrate 10, a silicon wafer, for example, is used.

Next, a silicon oxide film 53 of an about 10 nm-film thickness is formed on the semiconductor substrate 10 by, e.g., thermal oxidation.

Next, a silicon nitride film 55 of an about 100 nm-film thickness is formed on the entire surface by, e.g., CVD (Chemical Vapor Deposition).

Next, a photoresist film 57 is formed on the entire surface by, e.g., spin coating.

Then, by using a reticle having the patterns of the active regions (device regions) 11a-11d and the patterns of the alignment marks 11e, 11f formed on, these patterns are exposed on the photoresist film 57.

Next, the photoresist film 57 is developed.

Figure 6A:
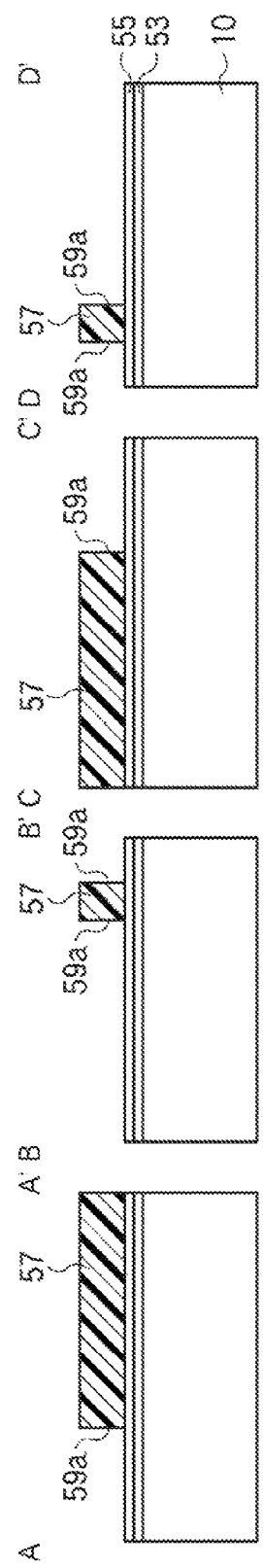
Figure 6B:
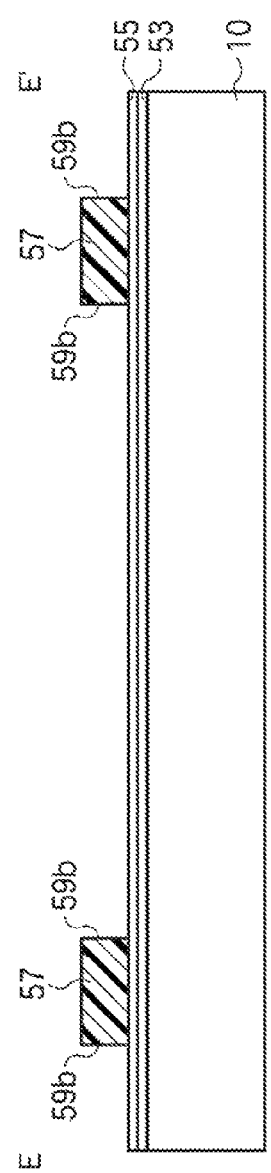

Thus, the patterns of the active regions 11a-11d and the patterns of the alignment marks 11e, 11f are transferred on the photoresist film 57 (see FIGS. 6A and 6B). Specifically, the openings 59a for forming the device isolation regions 12a, and the openings 59b for forming the alignment marks 11e, 11f are formed in the photoresist film 57.

Next, as illustrated in FIGS. 7A and 7B, the silicon nitride film 55 and the silicon oxide film 53 are etched with the photoresist film 57 as the mask.

Figure 8A:
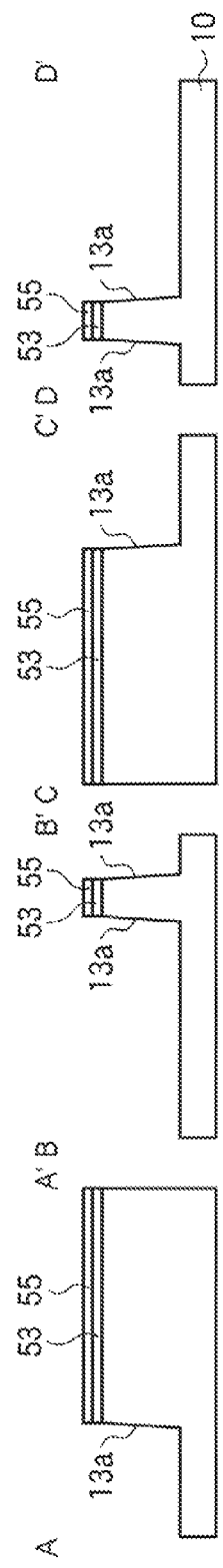
Figure 8B:
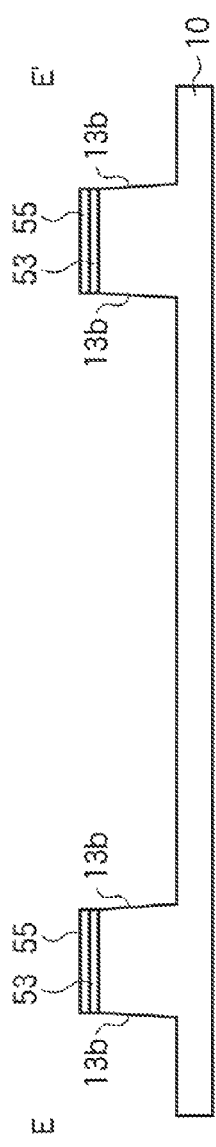

Next, as illustrated in FIGS. 8A and 8B, with the photoresist film 57 as the mask, the semiconductor wafer 10 is etched to the trench 13a for the device isolation region 12a to be buried in and the trench 13b for the insulation film 12b to be buried in are formed in the semiconductor wafer 10.

Then, the photoresist film 57 is released by, e.g., asking.

Figure 9A:
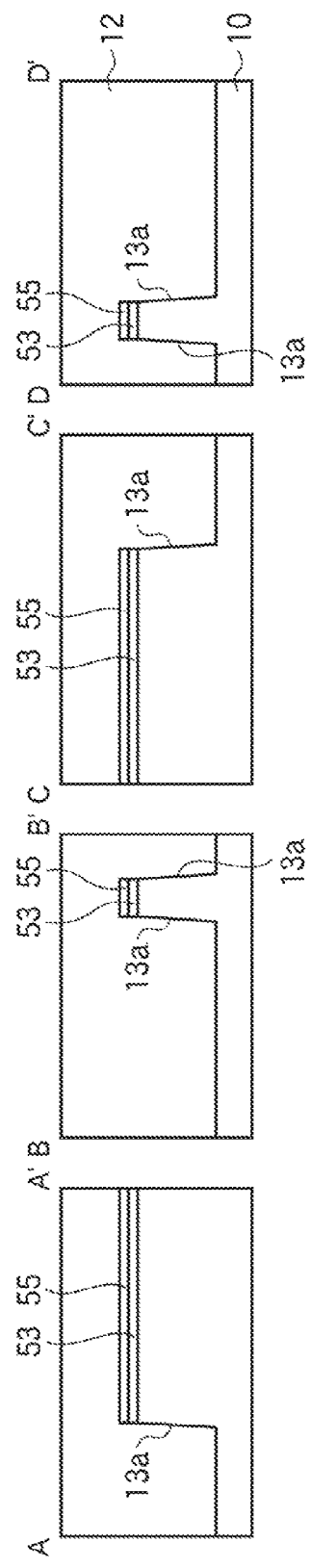
Figure 9B:
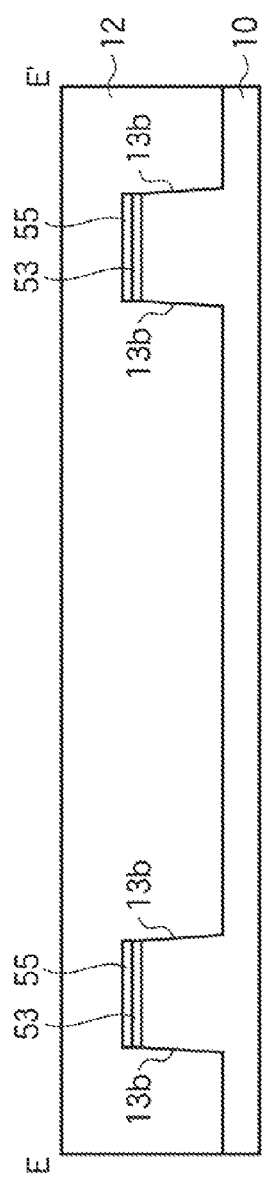

Next, as illustrated in FIGS. 9A and 9B, an insulation film 12 of, e.g., a 500 nm-film thickness is formed in the trenches 13a, 13b and on the semiconductor wafer 10.

Then, the insulation film 12 is polished by, e.g., CMP (Chemical Mechanical Polishing). Then, the silicon nitride film 55 and the silicon oxide film 53 are etched off. Thus, the device isolation region 12a and the insulation film 12b are buried respectively in the trench 13a and the trench 13b. The alignment marks 11e, 11f are respectively defined by the insulation film 12b buried in the trench 13b (see FIGS. 10A to 11B). The alignment marks 11e, 11f are formed respectively at plural parts of the periphery of the semiconductor chip.

The plane shape of the alignment marks 11e, 11f is, e.g., rectangle.

The plane shape of the alignment marks 11e, 11f is not limited to a rectangle. The plane shapes of the alignment marks 11e, 11f can be, e.g., a frame-shape or others.

Thus, the active regions 11a-11d are defined by the device isolation regions 12a, and the alignment marks 11e, 11f are formed, defined by the insulation film 12b.

Next, although not illustrated, ion implantation for forming wells (not illustrated) and ion implantation for forming the channel doped layers (not illustrated) are made in the active regions 11a-11d, and then activation anneal is made.

Then, the gate insulation film 14 of silicon dioxide of, e.g., a physical film thickness 0.6-2 nm thickness is formed on the entire surface by, e.g., thermal oxidation.

Then, a polysilicon film of, e.g., a 70-120 nm-film thickness is formed on the entire surface by CVD (Chemical Vapor Deposition).

Then, a photoresist film (not illustrated) is formed on the entire surface by, e.g., spin coating.

Next, by using a reticle having the patterns of the gate interconnections 16a-16d and the patterns of the alignment marks 16e, 16f formed on, these patterns are exposed on the photoresist film.

To align the reticle, the alignment mark 11e defined by the isolation film 12b is used.

Next, the photoresist film is developed.

Thus, the patterns of the gate interconnections 16a-16d and the patterns of the alignment marks 16e, 16f are transferred on the photoresist film.

Then, with the photoresist film as the mask the polysilicon film is etched. Thus, the gate interconnections 16a-16d of polysilicon and the alignment marks 16e, 16f of polysilicon are formed (see FIGS. 12A to 13B).

The gate interconnection 16a is formed linear, crossing the device regions 11a, 11c. The gate interconnection 16b is formed linear, crossing the device regions 11b, 11d. The gate interconnection 16c is formed linear, crossing the device region 11d. The longitudinal directions of the gate interconnections 16a-16d are in the same direction. The gate interconnections 16a and the gate interconnection 16b are formed, neighboring each other in parts of the regions. The gate interconnection 16c is formed, positioned on the line extended from the gate interconnection 16b. The gate interconnection 16d is formed, positioned on the line extended from the gate interconnection 16a. The width of the gate interconnections 16a-16d, i.e., the gate length is, e.g., about 35-60 nm. The interval between the gate interconnections 16a, 16d and the gate interconnections 16b, 16c, i.e., the pitch of the gate interconnections is, e.g., about 0.16-0.2 μm. The alignment marks 16e, 16f are formed respectively at plural parts of the periphery of the semiconductor chip.

The plane shape of the alignment marks 16e is, e.g., a frame-shape.

The plane shape of the alignment marks 16e is not limited to the frame shape. The plane shape of the alignment mark 16e can be, e.g., a rectangle or others.

The plane shape of the alignment mark 16f is, e.g., a rectangle.

The plane shape of the alignment mark 16f is not limited to a rectangle. The plane shape of the alignment mark 16f can be a frame shape or others.

Thus, the gate interconnections 16a-16d are formed while the alignment marks 16e-16f are formed.

Then, a dopant impurity is implanted by ion implantation to form the extension regions (not illustrated) which form the shallow regions of the extension source/drain structure respectively in the semiconductor substrate 10 on both sides of the gate interconnections 16a-16d.

Next, a silicon oxide film of, e.g., an about 30-60 nm is formed on the entire surface by, e.g., CVD.

Next, the silicon oxide film is etched by, e.g., anisotropic etching. Thus, the sidewall insulation film 18 of silicon dioxide is formed on the side walls of the gate interconnections 16a-16d (see FIGS. 14A and 14B).

A dopant impurity is implanted by ion implantation to form impurity diffused regions which form the deep regions of the extension source/drain structure in the semiconductor substrate 10 on both sides of the gate interconnections 16a-16d. Thus, the source/drain diffused layers 20, 22, 24, 26, 28, 30, 32, 34, 36, 38 (see FIGS. 1A and 1B) having the extension regions and the deep impurity diffused regions are formed.

Then, heat processing (anneal) for activating the dopant impurity implanted in the source/drain diffused layers 20, 22, 24, 26, 28, 30, 32, 34, 36, 38 is made. The heat processing temperature is, e.g., about 800-1200° C.

Then, a refractory metal film of a 5-30 nm-film thickness is formed on the entire surface by, e.g., sputtering. As the refractory metal film, nickel film, for example, is used.

Next, heat processing is made to react the surface of the semiconductor substrate 10 and the refractory metal film with each other while reacting the upper surfaces of the gate interconnections 16a-16d and the refractory metal film with each other. Then, the unreacted refractory metal film is etched off.

Thus, on the source/drain diffused layers 20, 22, 24, 26, 28, 30, 32, 34, 36, 38, the silicide film 52 of, e.g., nickel silicide is formed. The silicide film 52 on the source/drain diffused layers 20, 22, 24, 26, 28, 30, 32, 34, 36, 38 function as the source/drain electrodes. On the gate interconnections 16a-16d, the silicide film 52 of, e.g., nickel silicide is formed. On the alignment marks 11e, 11f, 16e, 16f, the silicide film 52 of, e.g., nickel silicide is formed (see FIGS. 15A and 15B).

Next, the insulation film 40 of silicon nitride of, e.g., a 30-80 nm-film thickness is formed on the entire surface by, e.g., plasma CVD. The film forming conditions for the insulation film 40 are as exemplified below. That is, the frequency of high-frequency power to be applied is, e.g., 13.56 MHz. The gas to be fed into the film forming chamber is, e.g., a mixed gas containing SiH$_4$ gas, NH$_3$ gas and N$_2$ gas. The internal temperature of the film forming chamber is, e.g., 350-450° C. The insulation film 40 is formed, filling the intervals between the gate interconnections 16a-16d (see FIGS. 16A and 16B).

Then, the insulation film 42 of silicon dioxide of, e.g., an about 400-700 nm-film thickness is formed on the entire surface by, e.g., plasma CVD. The film forming conditions for the insulation film 42 are as exemplified below. That is, the frequency of the high frequency power to be applied is, e.g., 13.56 MHz. The gas to be fed into the film forming chamber is the mixed gas containing SiH$_4$ gas and N$_2$O gas. The internal temperature of the film forming chamber is, e.g., about 350-450° C.

Next, the surface of the insulation film 42 is planarizsed by, e.g., CMP. The insulation film 40 and the insulation film 42 form the inter-layer insulation film 44 (see FIGS. 17A and 17B).

Next, as illustrated in FIGS. 18A and 18B, a photoresist film 60 is formed on the entire surface by, e.g., spin coating.

Then, by photolithography, partial patterns 61a1, 61b1 and the patterns 61c-61l are exposed on the photoresist film 60 (see FIGS. 19A to 20B). The partial patterns 61a1, 61b1 are for forming the contact holes 46a, 46b. The patterns 61c-61l are for forming the contact holes 46c-46l. The partial patterns 61a1, 61b1 are laid out, sufficiently overlapping parts of the gate interconnections 16a, 16b. The partial patterns 61a1, 61b1 are laid out, sufficiently overlapping parts of partial patterns 61a2, 61b2 (see FIGS. 21A to 22B) which will be mentioned below. In aligning the first mask (the first reticle) (not illustrated) for exposing the partial patterns 61a1, 61b1 and the patters 61c-61l, the alignment is made by using the alignment mark 16f.

The pattern of the alignment mark 16f and patterns of the gate interconnections 16a-16d were transferred by using the same mask. Accordingly, no disalignment takes place between the alignment mark 16f, and the gate interconnections 16a, 16b. The alignment mark 16f is used in aligning the first mask, whereby the disalignment between the partial patterns 61a1, 61b1, and the gate interconnections 16a, 16b can be made extremely small. Accordingly, the partial patterns 61a1, 61b1, and parts of the gate interconnections 16a, 16b can be sufficiently overlapped.

Thus, the partial patterns 61a1, 61b1 for forming the contact holes 46a, 46b, and the patterns 61c-61l for forming the contact holes 46c-46l are exposed on the photoresist film 60. At this time, the pattern 61m of the alignment mark (not illustrated) of the first mask (not illustrated) is also exposed on the photoresist film 60.

Then, by photolithography, partial patterns 61a2, 61b2 are exposed on the photoresist film 60 (see FIGS. 21A to 22B). The partial patterns 61a2, 61b2 are for forming the contact holes 46a, 46b together with the partial patterns 61a1, 61b1.

The partial patterns 61a2, 61b2 are laid out, sufficiently overlapping parts of the active regions 11b, 11a. The partial patterns 61a2, 61b2 are laid out, sufficiently overlapping parts of the partial patterns 61a2, 61b2. In aligning the second mask (the second reticle) for exposing the partial patterns 61a2, 61b2, the alignment is made by using an alignment mark 11f.

The pattern of the alignment mark 11f and the patterns of the active regions 11a-11d were transferred by using the same mask. Accordingly, no disalignment takes place between the alignment mark 11f and the active regions 11a-11d. The alignment mark 11f is used in aligning the second mask, whereby the disalignment between the partial patterns 61a2, 61b2 and the active regions 11b, 11a can be made extremely small. Accordingly, parts of the partial patterns 61a2, 61b2 and parts of the active regions 11b, 11a can be sufficiently overlapped.

Thus, the partial patterns 61a2, 61b2 of the contact holes 46a, 46b are exposed on the photoresist film 60. At this time, the pattern 61n of the alignment mark (not illustrated) of the second mask is also exposed on the photoresist film 60.

The partial patterns 61a1, 61b1 and partial patterns 61a2, 61b2 are thus exposed, whereby the parts of the partial patterns 61a1, 61b1 and the parts of the partial patterns 61a2, 61b2 are surely overlapped even when disalignments take place.

Next, the photoresist film 60 is developed. Thus, the openings 70a-70l for forming the contact holes 46a-46l, the opening 70m of the pattern of the alignment mark of the first mask, and the opening 70n of the pattern of the alignment mark of the second mask are formed in the photoresist film 60 (see FIGS. 23A to 24B).

As described above, according to the present embodiment, parts of the partial patterns 61a1, 61b1 and parts of the gate interconnections 16a, 16b can be sufficiently overlapped. According to the present embodiment, parts of the partial patterns 61a1, 61b1 and parts of the active regions 11b, 11a can be sufficiently overlapped. Parts of the partial patterns 61a1, 61b1 and parts of the partial pattern 61a2, 61b2 are laid out, sufficiently overlapping each other. Accordingly, the opening 70a of the photoresist film 60 is formed, sufficiently overlapping the end of the gate interconnection 16a and the part of the source/drain diffused layer 20 of the load transistor L2. The opening 70b of the photoresist film 60 is formed, sufficiently overlapping the end of the gate interconnection 16b and the part of the source/drain diffused layer 22 of the load transistor L1.

Then, with the photoresist film 60 as the mask, the inter-layer insulation film 44 is etched. Thus, the contact holes 46a-46l and the openings 46m, 46n are formed in the inter-layer insulation film 44 (see FIGS. 25A to 26B).

As described above, the opening 70a of the photoresist film 60 sufficiently overlaps the end of the gate interconnection 16a and the part of the source/drain diffused layer 20 of the load transistor L2. Accordingly, the contact hole 46a surely exposes integrally the end of the gate interconnection 16a and the source/drain diffused layer 20 of the load transistor L2 even when a disalignment takes place.

As described above, the opening 70b of the photoresist film 60 sufficiently overlaps the end of the gate interconnection 16b and the part of the source/drain diffused layer 22 of the load transistor L1. Accordingly, the contact hole 46b surely exposes integrally the end of the gate interconnection 16b and the source/drain diffused layer 22 of the load transistor L1 even when a disalignment takes place. The shape of the section of the contact holes 46a, 46b in the direction parallel with the surface of the semiconductor substrate 10 is, e.g., substantially elliptical (see FIG. 3).

The contact hole 46c is formed, exposing the source/drain diffused layer 24 of the load transistor L1. The contact hole 46d is formed, exposing the source/drain diffused layer 30 of the load transistor L2. The contact hole 46e is formed, exposing the source/drain diffused layer 28 of the driver transistor D1. The contact hole 46f is formed, exposing the source/drain diffused layer 26 which is common between the driver transistor D1 and the transfer transistor T1. The contact hole 46g is formed, exposing the source/drain diffused layer 36 of the driver transistor T1. The contact holes 46h is formed, exposing the source/drain diffused layer 34 of the driver transistor D2. The contact hole 46i is formed, exposing the source/drain diffused layer 32 which is common between the driver transistor D2 and the transfer transistor T2. The contact hole 46j is formed, exposing the source/drain diffused layer 38 of the driver transistor T2. The shape of the section of the contact holes 46c-46j in the direction parallel with the surface of the semiconductor substrate 10 is, e.g., substantially circular (see FIG. 3). The diameter of the contact holes 46c-46l is, e.g., about 50-80 nm.

The openings 46m, 46n are formed down to the insulation film 12b. The shape of the section of he openings 46m, 46n in the direction parallel with the surface of the semiconductor substrate 10 is, e.g., the frame shape.

Next, a Ti film of, e.g., a 2-10 nm-film thickness and a TiN film of, e.g., a 2-10 nm-film thickness are sequentially formed on the entire surface by, e.g., sputtering or CVD to form a glue layer.

Then, a tungsten film of, e.g., a 70-100 nm-film thickness is formed on the entire surface by, e.g., sputtering.

Then, the tungsten film is polished by, e.g., CMP until the surface of the inter-layer insulation film 44 is exposed. Thus, the contact layers 48a-48j of tungsten are buried in the contact holes 46a-46l. In the openings 46m, 46b, the alignment marks 48m, 48n of tungsten are respectively buried (see FIGS. 27A to 28B).

As described above, the contact hole 46a surely exposes integrally the end of the gate interconnection 16a and the part of the source/drain diffused layer 20 of the load transistor L2. Accordingly, the contact layer 48a surely connects integrally the end of the gate interconnection 16a and the source/drain diffused layer 20 of the load transistor L2.

As described above, the contact hole 46b surely exposes integrally the end of the gate interconnection 16b and the source/drain diffused layer 22 of the load transistor L1. Accordingly, the contact layer 48b surely connects integrally the end of the gate interconnection 16b and the part of the source/drain diffused layer of the load transistor L1.

Next, a conduction film is formed on the entire surface by, e.g., sputtering.

Then, the conduction film is patterned by photolithography to form the interconnections 50 respectively connected to the contact layers 48a-48l (see FIGS. 29A and 29B).

Thus, the semiconductor device according to the present embodiment is manufactured.

When a disalignment takes place in the method for manufacturing the semiconductor device according to the present embodiment, what is described below follows. The case of a disalingment will be described with reference to FIGS. 30A to 33B. FIGS. 30A to 33B are plan views of the semiconductor device according to the present embodiment in the steps of the method for manufacturing the semiconductor device, which illustrate the case of a disalignment.

Figures 30A, 30B:
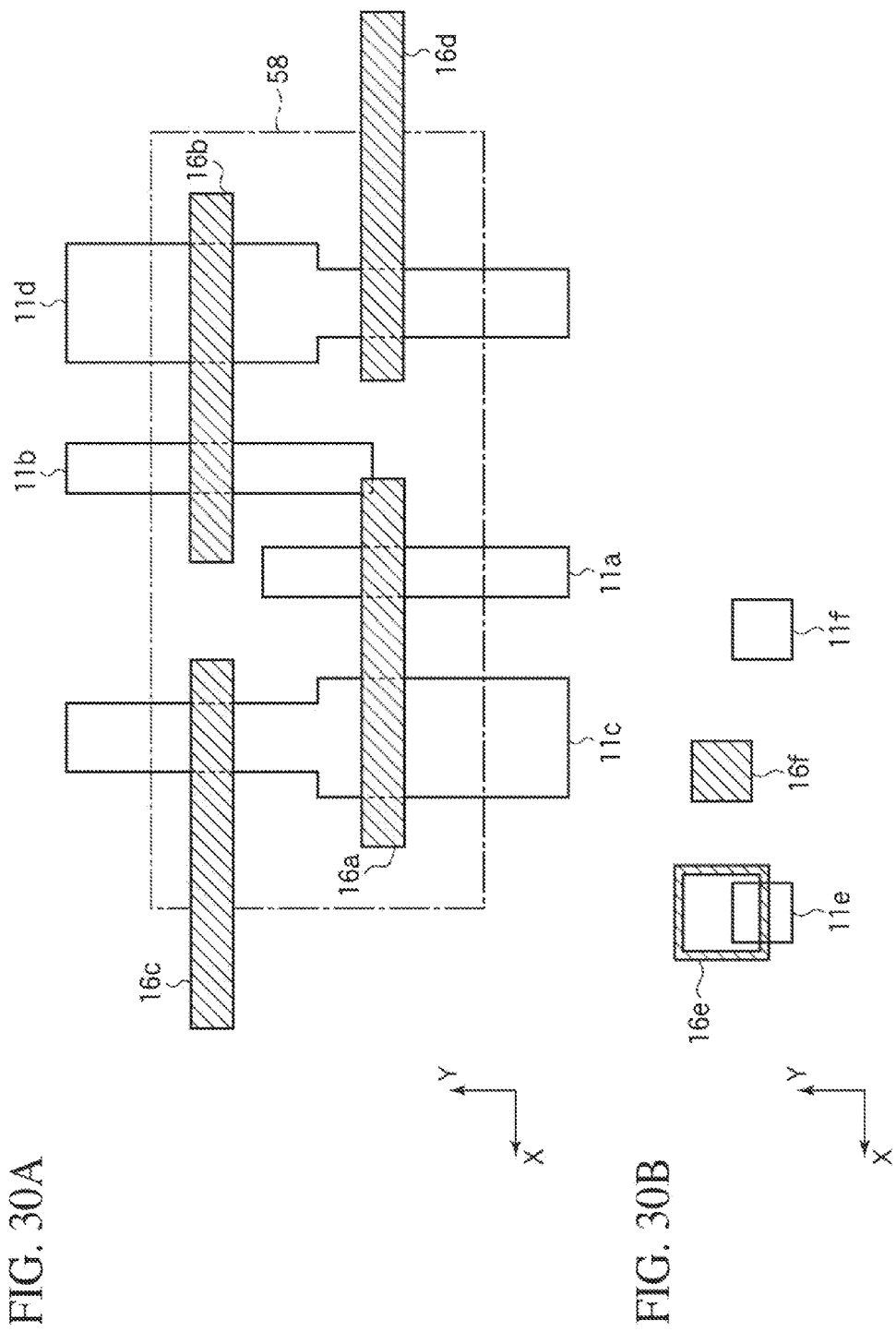

FIGS. 30A and 30B correspond to FIGS. 13A and 13B described above.

FIGS. 30A and 30B illustrate the case that a large disalingment takes place in the Y direction in transferring the patterns of the gate interconnections 16a-16d. The patterns of the alignment marks 16e, 16f, which are also transferred simultaneously with transferring the patterns of the gate interconnections 16a-16d, are disaligned largely with respect to the alignment marks 11e, 11f.

Figure 31A:
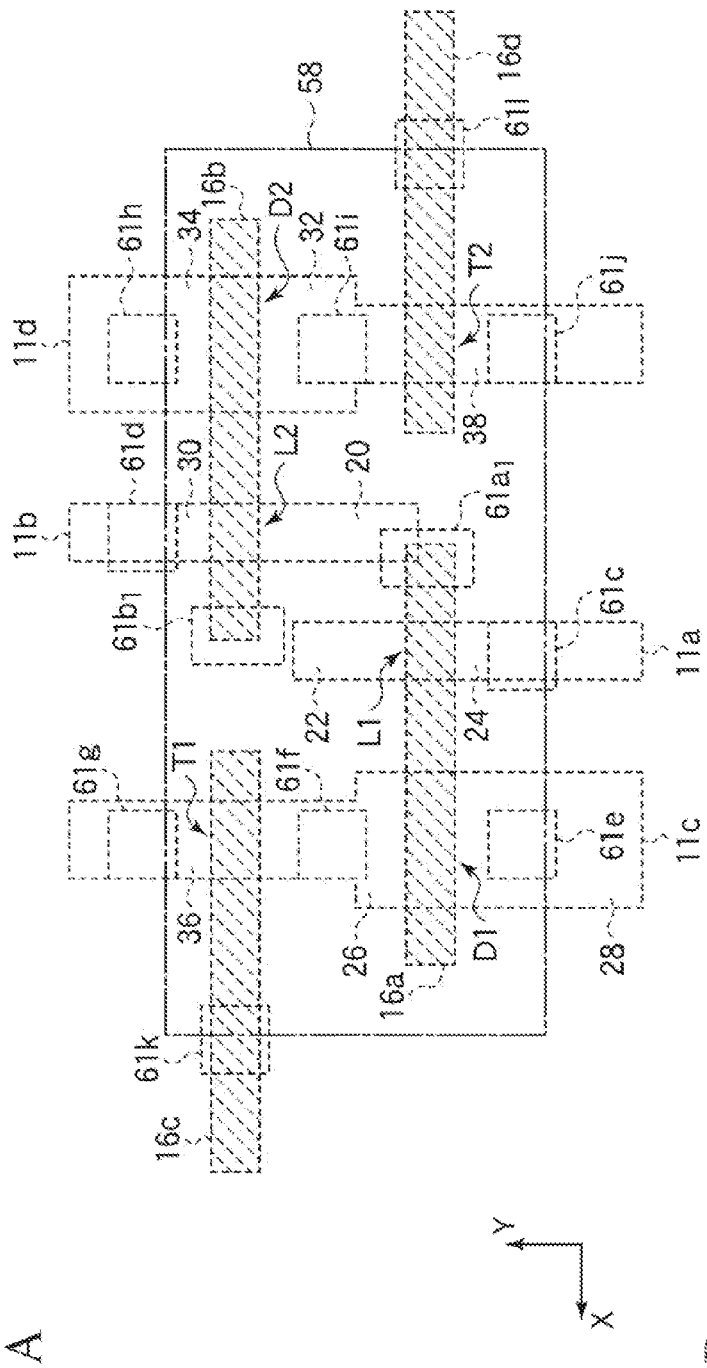
Figure 31B:
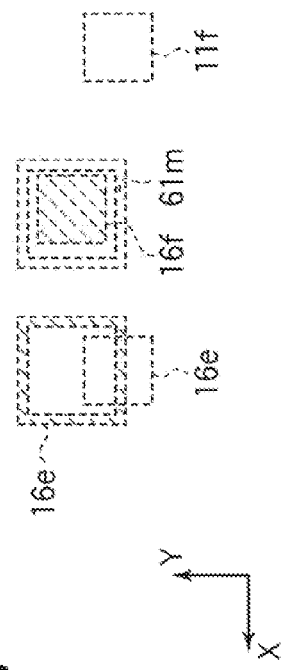

FIGS. 31A and 31B correspond to FIGS. 20A and 20B described above.

The alignment mark (not illustrated) of the first mask (not illustrated) is aligned with the alignment mark 16f, whereby, as illustrated in FIGS. 31A and 31B, the ends of the gate interconnections 16a, 16b and parts of the partial patterns 61a1, 16b1 can be sufficiently overlapped.

Figure 32A:
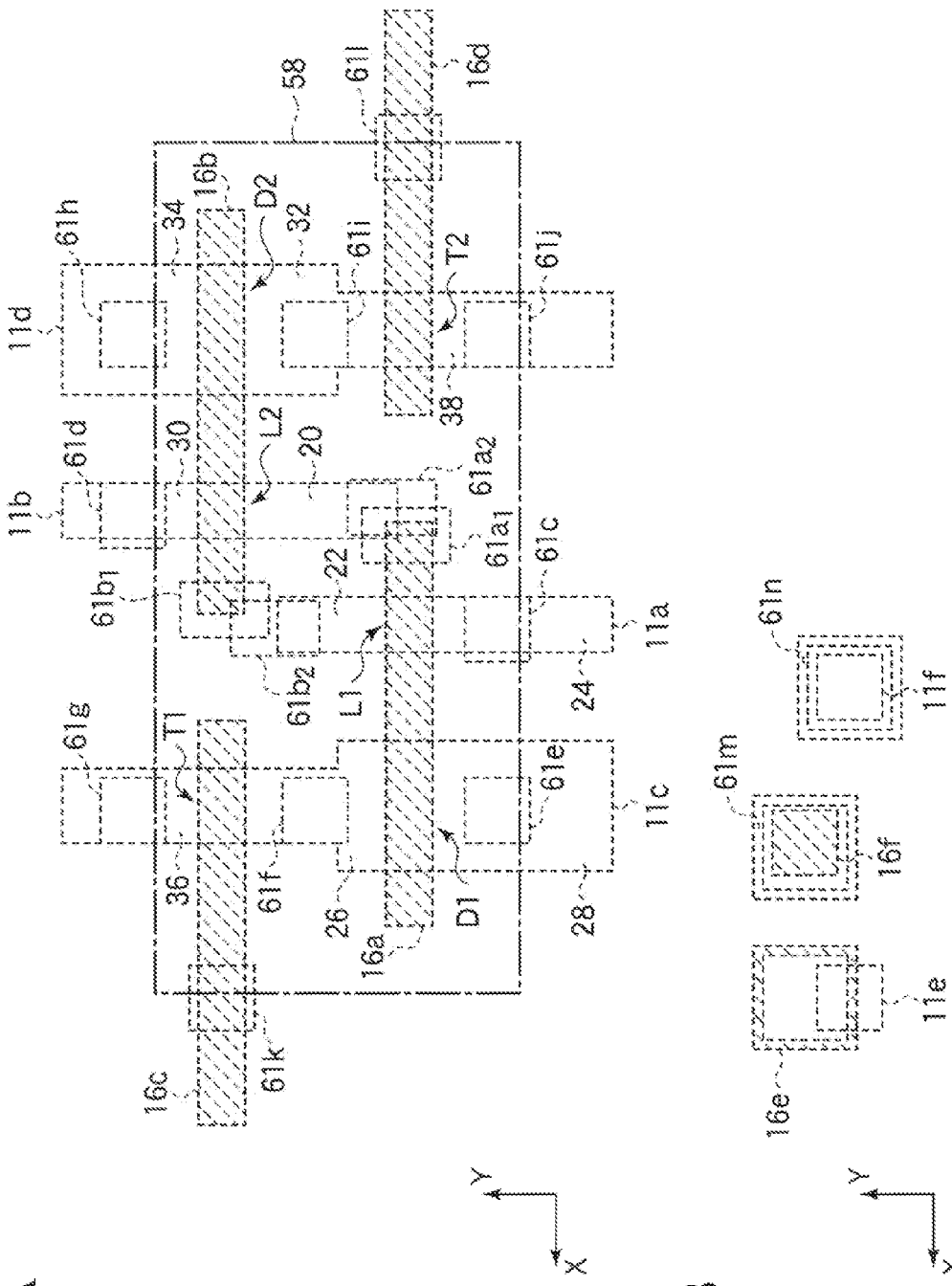
Figure 32B:
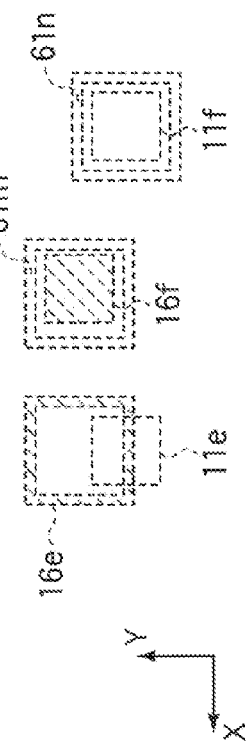

FIGS. 32A and 32B correspond to FIGS. 22A and 22B described above.

The alignment mark (not illustrated) of the second mask (not illustrated) is aligned with the alignment mark 11f, whereby as illustrated in FIGS. 32A and 32B, a part of the source/drain diffused layer 20 of the load transistor L2 and the partial pattern 61a2 can be sufficiently overlapped. A part of the source/drain diffused layer 22 of the load transistor L1 and a part of the partial pattern 61b2 can be sufficiently overlapped.

Figure 33A:
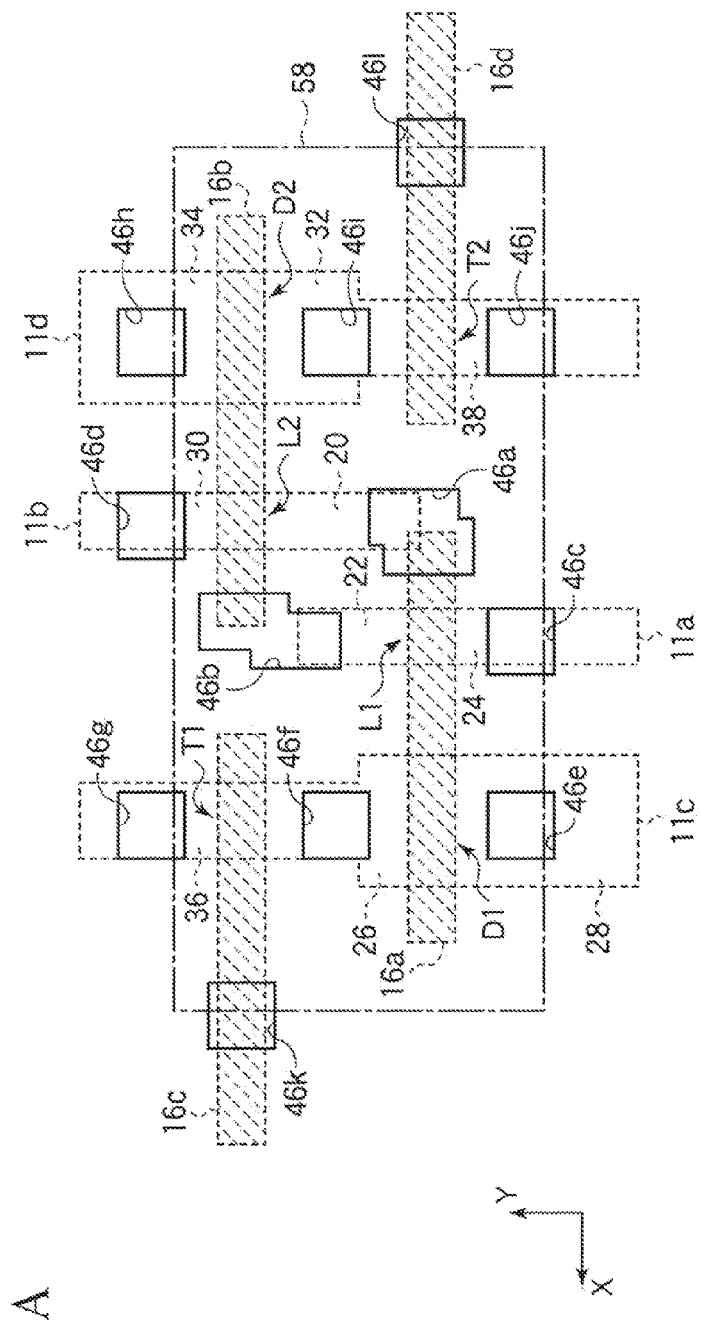
Figure 33B:
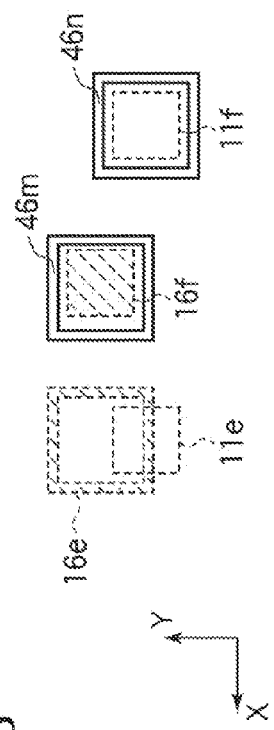

FIGS. 33A and 33B correspond to FIGS. 24A and 24B described above.

The contact hole 46a sufficiently exposes integrally the end of the gate interconnection 16a and a part of the source/drain diffused layer 20 of the load transistor L2. The contact hole 46b sufficiently exposes integrally the end of the gate interconnection 16b and a part of the source/drain diffused layer 22 of the load transistor L1.

As described above, according to the present embodiment, even when a large disalignment takes place, the contact hole 46a which surely exposes integrally the end of the gate interconnection 16a and a part of the source/drain diffused layer 20 of the load transistor L2 can be formed. According to the present embodiment, even when a large disalingment takes place, the contact hole 46b which surely exposes integrally the end of the gate interconnection 16b and a part of the source/drain diffused layer 22 of the load transistor L1 can be formed.

In the present embodiment, the partial patterns 61a1, 61b1 for forming parts of the contact holes 46a, 46b are exposed on the photoresist film 60 in alignment with the alignment mark 16f transferred simultaneously with transferring the patterns of the gate interconnections 16a, 16b. Accordingly, parts of the partial patterns 61a1, 61b1 and parts of the gate interconnections 16a, 16b can be sufficiently overlapped. The partial patterns 61a2, 61b2 for forming parts of the contact holes 46a, 46b are exposed on the photoresist film 60 in alignment with the alignment mark 11f transferred simultaneously with transferring the patterns of the active regions 11a, 11b. Accordingly, parts of the partial patterns 61a2, 61b2 and parts of the active regions 11b, 11a can be sufficiently overlapped. Parts of the partial patterns 61a1, 61b1 and parts of the partial patterns 61a2, 61b2 are laid out, sufficiently overlapping each other. Thus, according to the present embodiment, the contact hole 46a surely exposing integrally the end of the gate interconnection 16a and a part of the source/drain diffused layer 20 of the load transistor L2 can be formed. The contact hole 46b surely exposing integrally the end of the gate interconnection 16b and a part of the source/drain diffused layer 22 of the load transistor L1 can be formed. Thus, according to the present embodiment, the contact layer 48 surely connecting integrally the end of the gate interconnection 16a and the source/drain diffused layer 20 of the load transistor L2 can be formed. The contact layer 48b surely connecting integrally the end of the gate interconnection 16b and a part of the source/drain diffused layer 22 of the load transistor L1 can be formed. Thus, according to the present embodiment, the semiconductor device of high reliability can be manufactured with high yields.

[b] Second Embodiment

Figure 35:
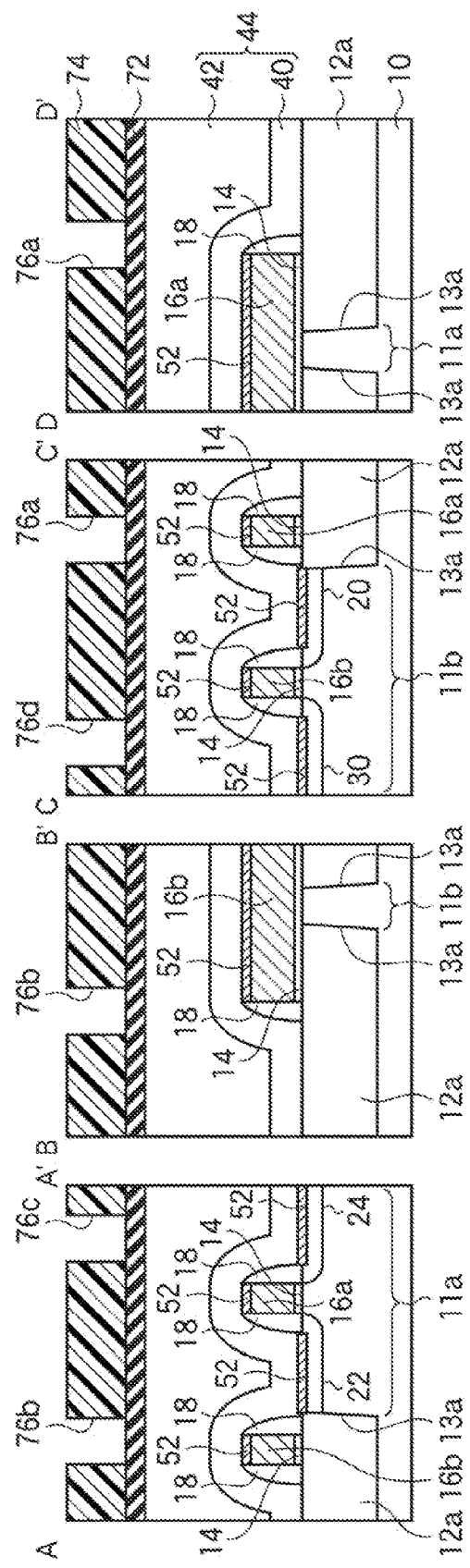
Figure 36A:
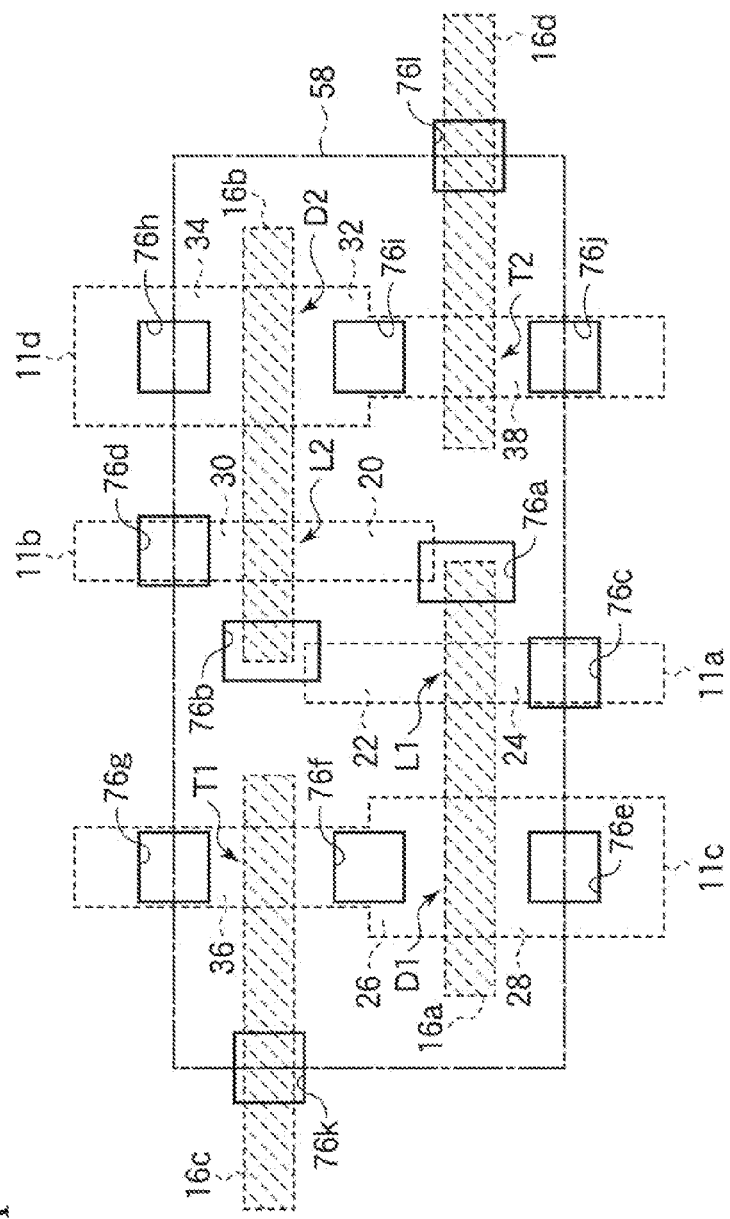
Figure 36B:
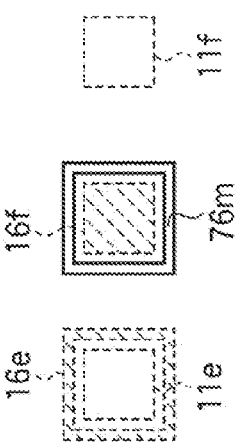
Figure 37:
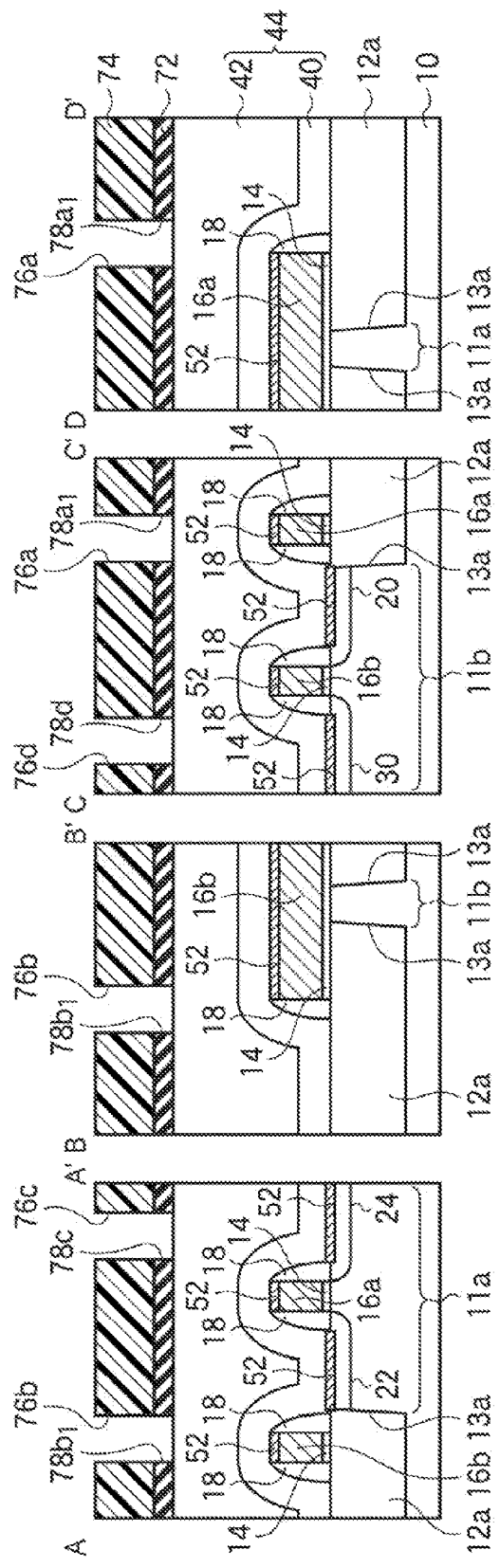
Figure 38A:
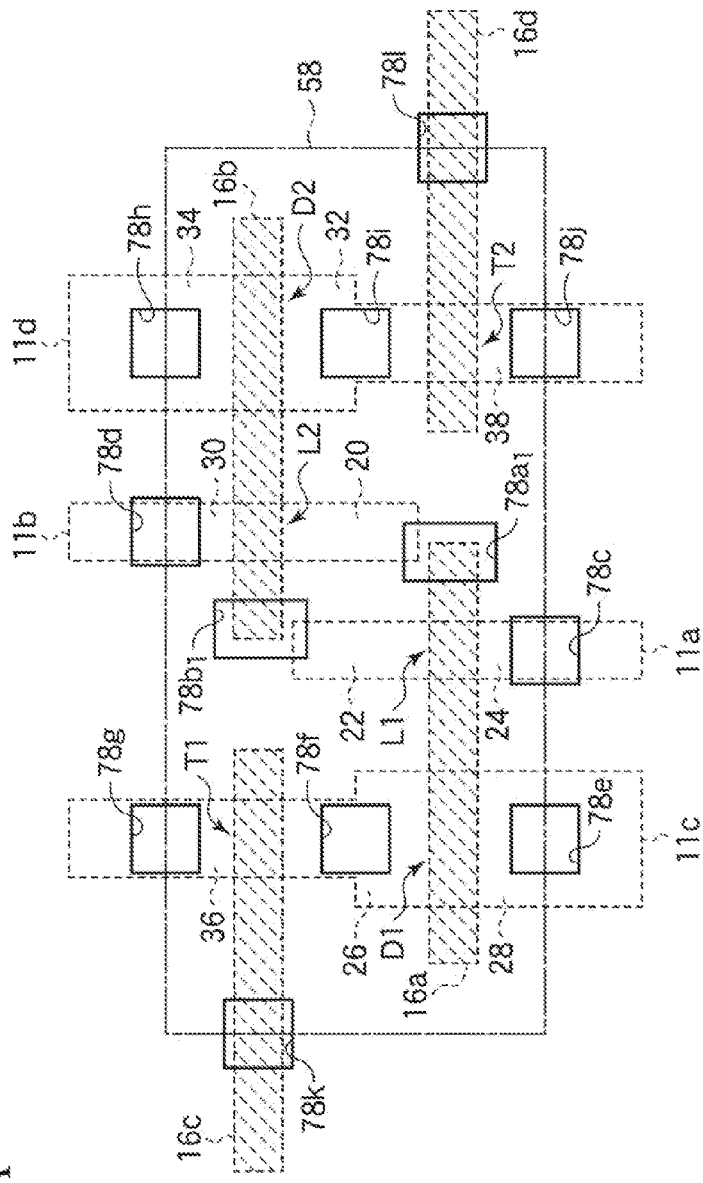
Figure 38B:
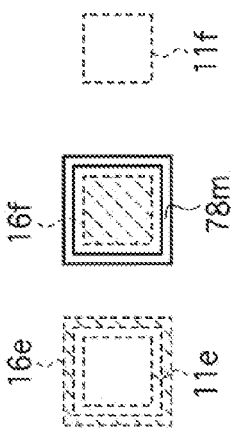
Figure 42A:
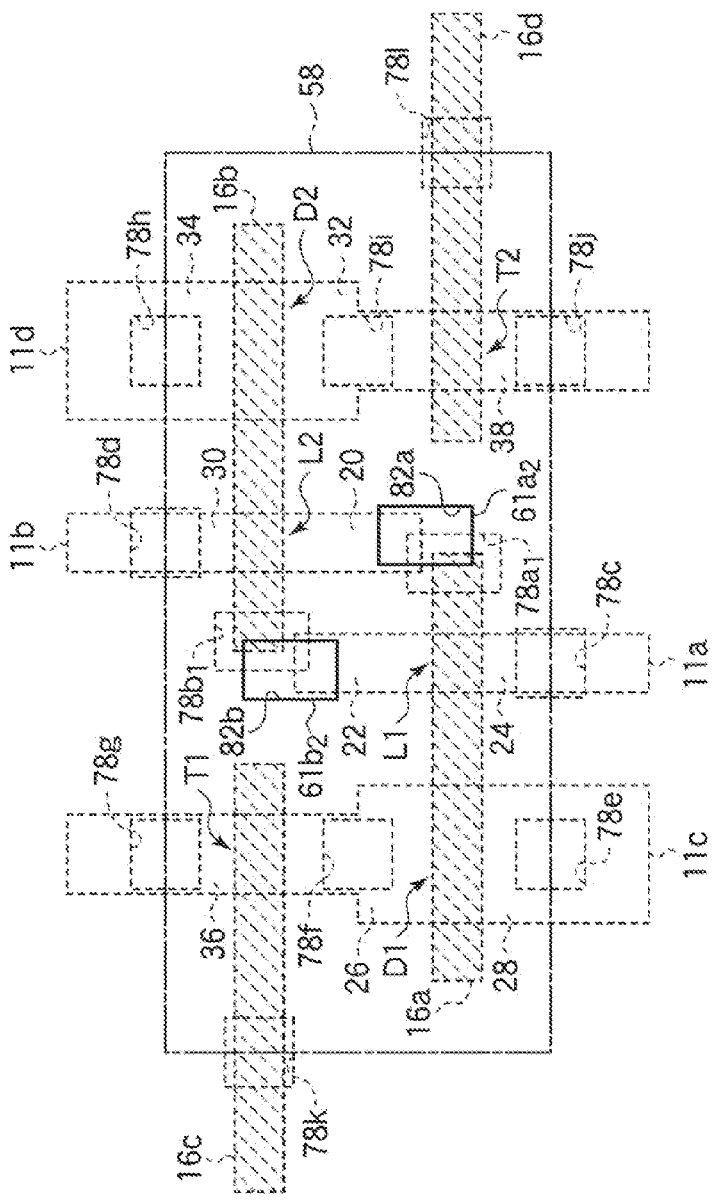
Figure 42B:
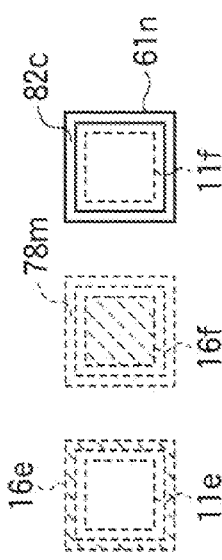
Figure 43:
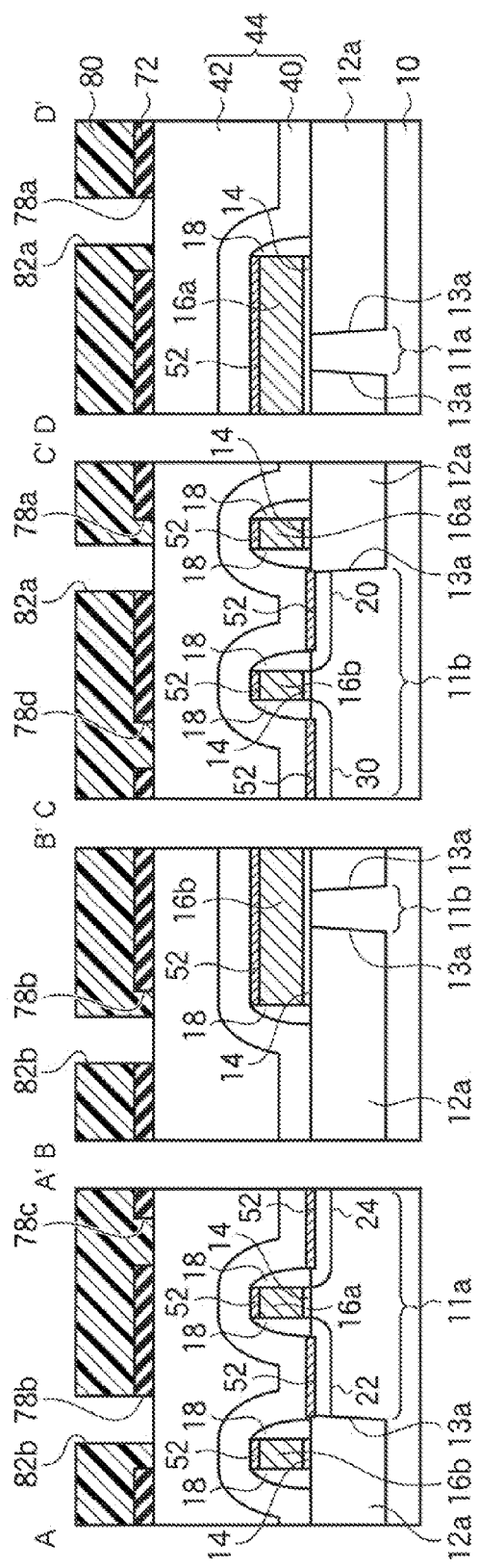
Figure 44A:
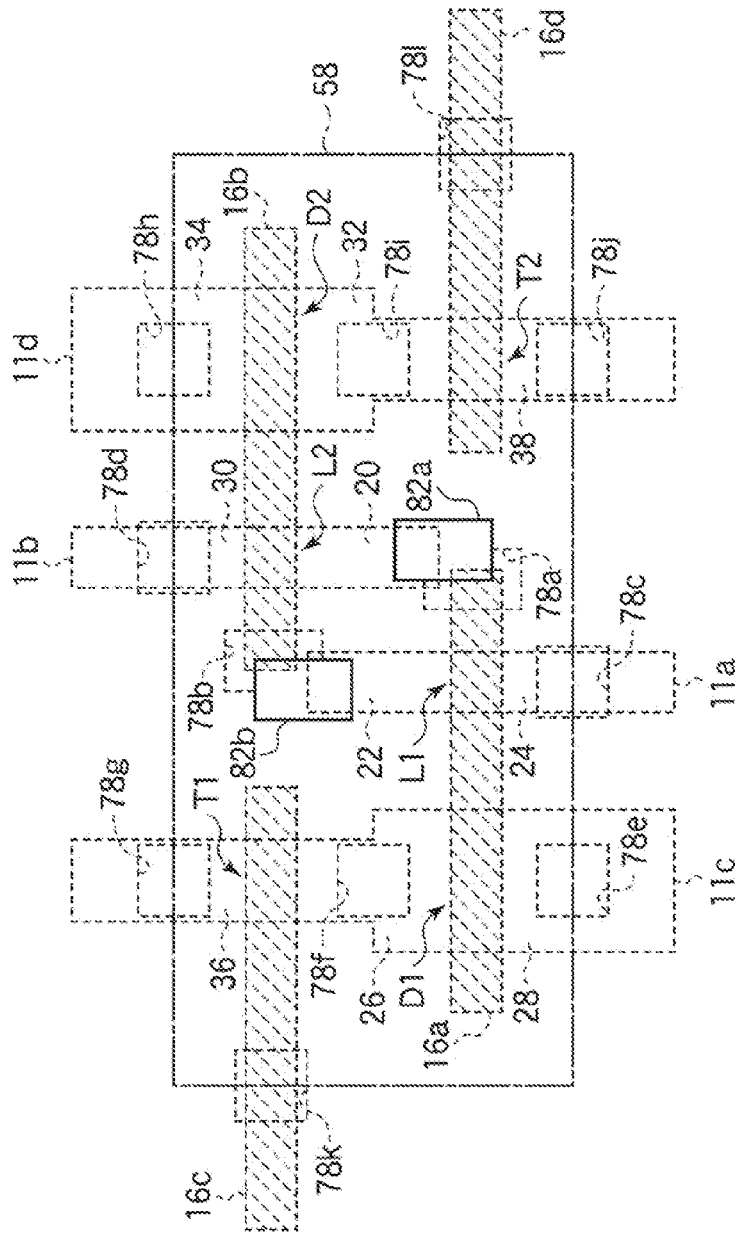
Figure 44B:
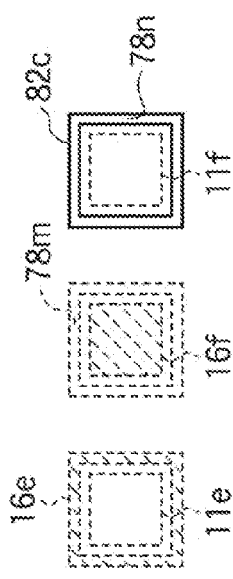
Figure 46A:
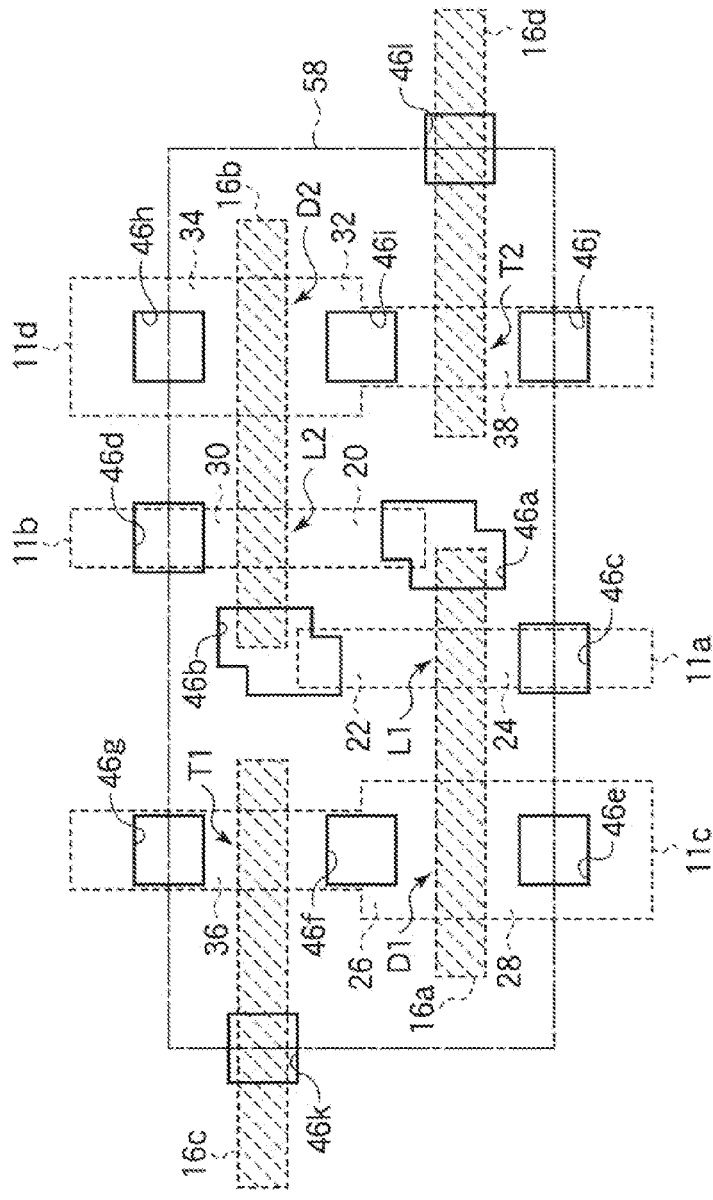
Figure 46B:
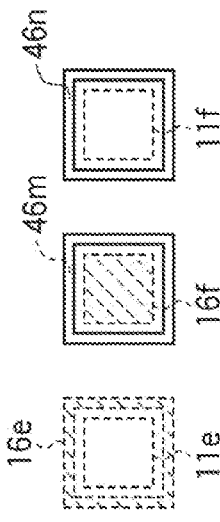
Figure 47A:
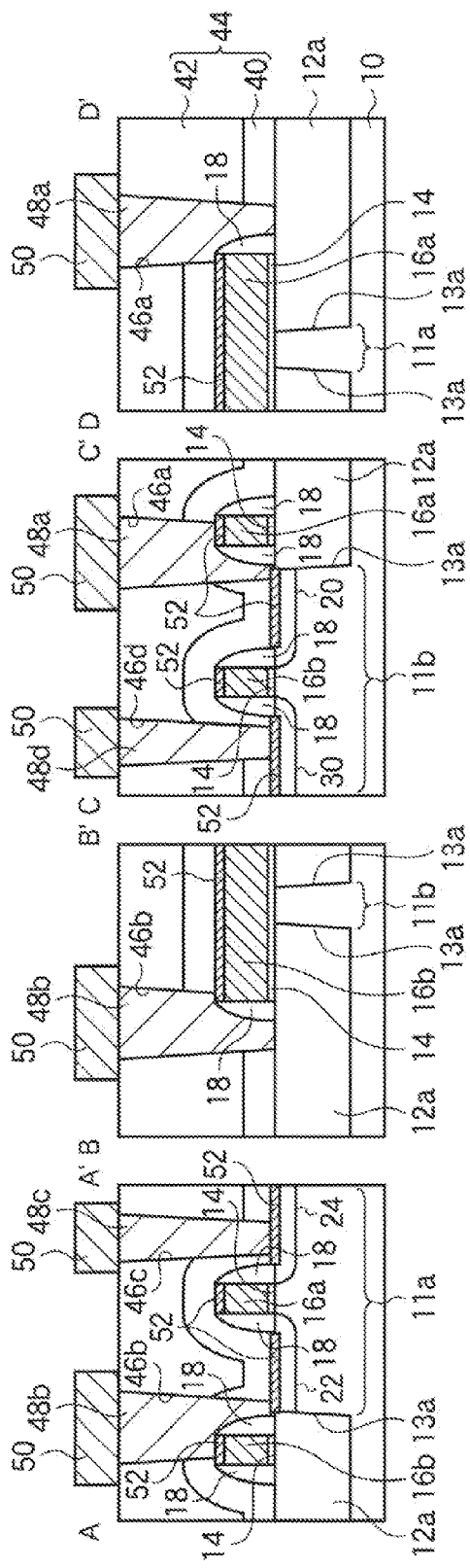
Figure 47B:
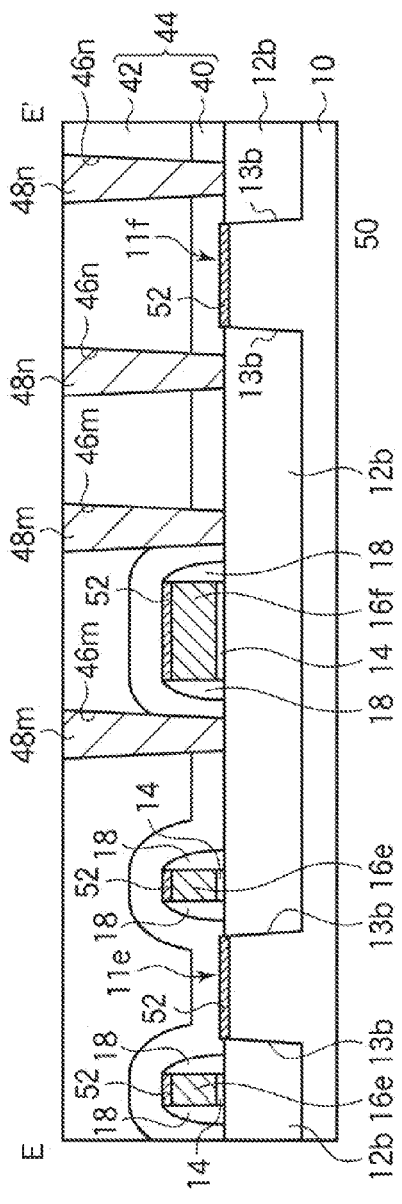
Figures 48A, 48B:
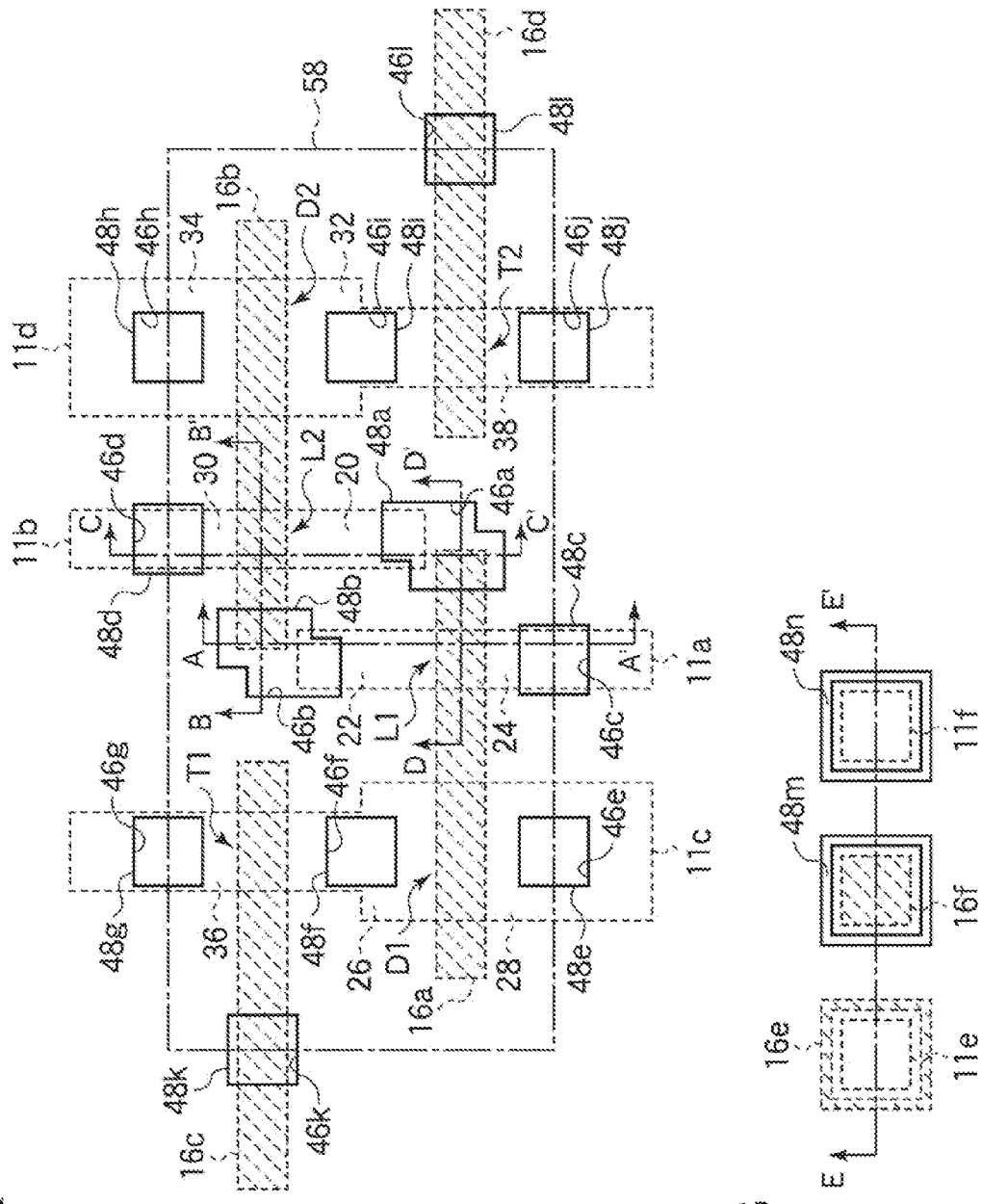

The semiconductor device manufacturing method according to a second embodiment will be described with reference to FIGS. 34A to 48B. FIGS. 34A to 48B are sectional views of the semiconductor device in the steps of the semiconductor device manufacturing method according to the present embodiment, which illustrate the method. FIGS. 34A to 35 are sectional views. FIGS. 36A and 36B are plan views corresponding to FIG. 35. FIG. 37 is a sectional view. FIGS. 38A and 39B are plan views corresponding to FIG. 37. FIGS. 39A to 41 are sectional views. FIGS. 42A and 42B are plan views corresponding to FIG. 41. FIG. 43 is a sectional view. FIGS. 44A and 44B are plan views corresponding to FIG. 43. FIGS. 45A and 45B are sectional views. FIGS. 46A and 46B are plan views corresponding to FIGS. 45A and 45B. FIGS. 47A and 47B are sectional views. FIGS. 48A and 48B are plan views corresponding to FIGS. 47A and 47B. The same members of the present embodiment as those of the semiconductor device according to the first embodiment and its manufacturing method illustrated in FIGS. 1A to 33B are represented by the same reference numbers not to repeat or to simplify their description.

The semiconductor device manufacturing method according to the present embodiment forms the contact holes 46a-46l by using a hard mask.

First, the step of forming the silicon oxide film 53 on the semiconductor substrate 10 to the step of forming the interlayer insulation film 44 are the same as those of the method for manufacturing the semiconductor device according to the first embodiment described above with reference to FIG. 5A to 17B, and their description will not be repeated.

Next, as illustrated in FIG. 34A, a silicon nitride film 72 of an about 30 nm-film thickness is formed by, e.g., plasma CVD. The silicon nitride film 72 is to be a hard mask.

Next, a photoresist film 74 is formed on the entire surface by, e.g., spin coating.

Then, in the same way as in the method for manufacturing the semiconductor device according to the first embodiment described above with reference to FIGS. 19A and 19B, the partial patterns 61a1 and 61b1 and the patterns 61c-61l (see FIGS. 19A to 20B) are exposed on the photoresist film 74 by photolithography (see FIG. 34B).

As described above, the partial patterns 61a1, 61b1 are for forming the contact holes 46a, 46b. As described above, the patterns 61c, 61l are for forming the contact holes 46c-46l. The partial patterns 61a1, 61b1 are laid out, sufficiently overlapping parts of the gate interconnections 16a, 16b. The partial patterns 61a1, 61b1 are laid out, sufficiently overlapping parts of the partial patterns 61a2, 61b2 to be described later (see FIG. 40). In aligning the first mask (the first reticle) (not illustrated) for exposing the partial patterns 61a1, 61b1 and the patterns 61c-61l, the alignment is made by using the alignment mark 16f (see FIGS. 20A and 20B).

The pattern of the alignment mark 16f and the patterns of the gate interconnections 16a-16d were transferred by using the same mask. Accordingly no disalignment takes place between the alignment mark 16f and the gate interconnections 16a, 16b. The alignment mark 16f is used in aligning the first mask, whereby the disalignment between the partial patterns 61a1, 61b1 and the gate interconnections 16a, 16b can be made extremely small. Accordingly, the partial patterns 61a1, 61b1 and parts of the gate interconnections 16a, 16b can be sufficiently overlap.

Thus, the partial patterns 61a1, 16b1 for forming the contact holes 46a, 46b and the patterns 61c-61l for forming the contact holes 46c-46l (see FIGS. 20A and 20B) are exposed on the photoresist film 60. At this time, the pattern 61m (see FIGS. 19A to 20B) of the alignment mark (not illustrated) for the first mask is also exposed on the photoresist film 74.

Then, the photoresist film 74 is developed. Thus, the openings 76a, 76b of the partial patterns 61a1, 61b1 of the contact holes 46a, 46b and the openings 76c-76l for forming the contact holes 46c-46l are formed in the photoresist film 74. The opening 76m of the pattern of the alignment mark (not illustrated) of the first mask (not illustrated) is formed in the photoresist film 74 (see FIGS. 35 to 36B).

As described above, parts of the partial patterns 61a1, 61b1 and parts of the gate interconnections 16a, 16b are sufficiently overlapped. Accordingly, the openings 76a, 76b and parts of the gate interconnections 16a, 16b are sufficiently overlapped.

Then, the silicon nitride film 72 is etched with the photoresist film 74 as the mask. Thus, a hard mask 72 with the openings 78a1, 78b1 of the partial patterns of the contact holes 46a, 46b and the openings 78c-78l for forming the contact holes 46c-46l formed in is formed. In the hard mask 72, an opening 78m of the pattern of the alignment mark (not illustrated) of the first mask (not illustrated) is formed (see FIGS. 37 to 38B).

As described above, the openings 76a, 76b and parts of the gate interconnections 16a, 16b are sufficiently overlapped. Thus, the openings 78a1, 78b1 and the parts of the gate interconnections 16a, 16b are sufficiently overlapped.

Next, as illustrated in FIG. 39A, the photoresist film 74 is removed by wet processing and asking.

Next, as illustrated in FIG. 39B, a photoresist film 80 is formed on the entire surface by, e.g., spin coating.

Figure 40:
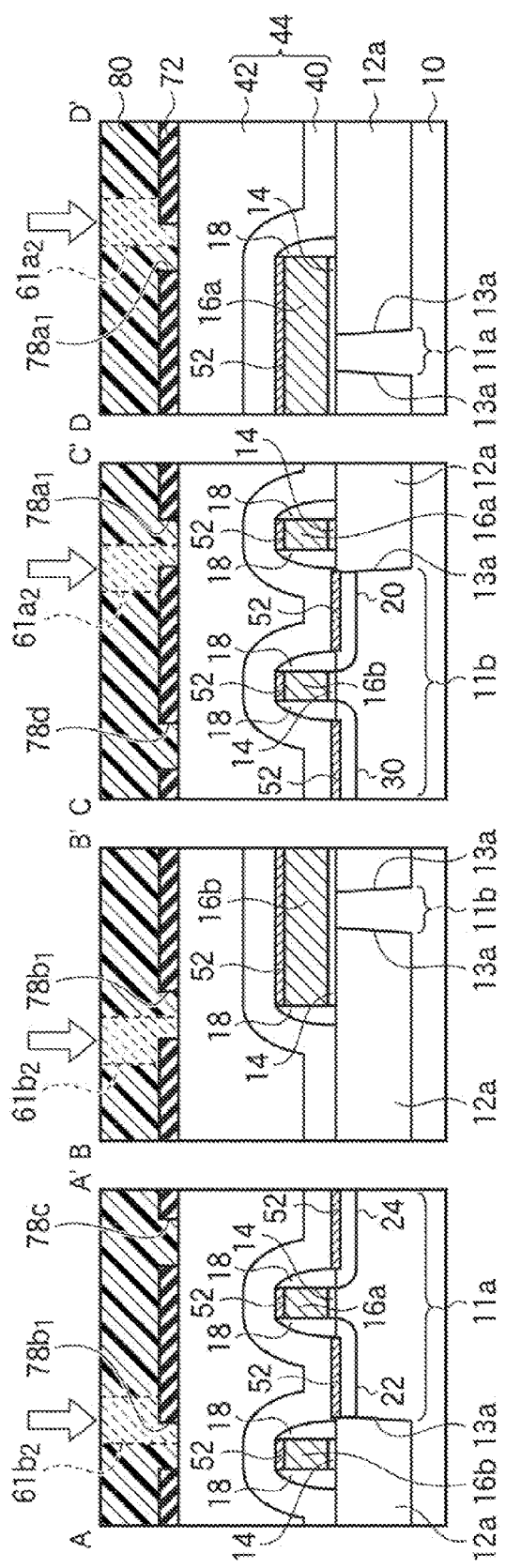
Figure 41:
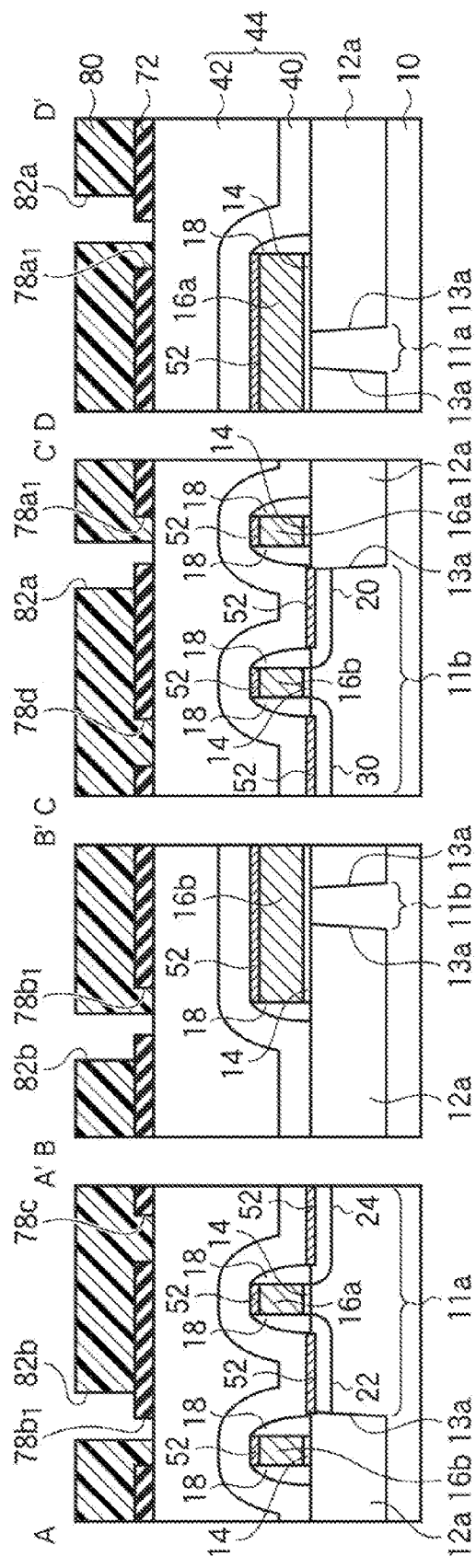

Then, the partial patterns 61a2, 61b2 are exposed on the photoresist film 80 by photolithography (see FIG. 40). The partial patterns 61a2, 61b2 are laid out, sufficiently overlapping parts of the active regions 11b, 11a. The partial patterns 61a2, 61b2 are laid out, sufficiently overlapping parts of the openings 78a1, 78b1. In aligning the second mask (not illustrated) for exposing the partial patterns 61a2, 61b2, the alignment is made by using the alignment mark 11f.

The pattern of the alignment mark 11f and the patterns of the active regions 11a-11d were transferred by using the same mask. Accordingly, no disalignment takes place between the alignment mark 11f and the active regions 11a-11d. The alignment mark 11f is used in aligning the second mask, whereby the alignment between the partial patterns 61a2, 61b2 and the active regions 11b, 11a can be made extremely small. Accordingly, parts of the partial patterns 61a2, 61b2 and parts of the active regions can be sufficiently overlapped.

Thus, the partial patterns 61a2, 61b2 of the contact holes 46a, 46b are exposed on the photoresist film 80. At this time, the pattern 61n (see FIGS. 42A and 42B) of the alignment mark (not illustrated) for the second mask is also exposed on the photoresist film 80.

The partial patterns 61a2, 61b2 are thus exposed, whereby parts of the openings 78a1, 78b1 and parts of the partial patterns 61a2, 61b2 can be surely overlapped even when a disalignment takes place.

Then, the photoresist film 80 is developed. Thus, the openings 82a, 82b for forming the partial patterns 61a2, 61b2 of the contact holes 46a, 46b and the opening 82c of the pattern of the alignment mark are formed in the photoresist film 80. Parts of the openings 82a, 82b and parts of the active regions 11b, 11a are sufficiently overlapped (see FIGS. 41 to 42B).

The hard mask 72 is etched with the photoresist film 80 as the mask. Thus, the partial patterns 61a2, 61b2 of the contact holes 46a, 46b are transferred to the hard mask 72. Thus, the openings 78a, 78b for forming the contact holes 46a, 46b are formed in the hard mask 72. The opening 78n of the pattern of the alignment mark (not illustrated) of the second mask (not illustrated) is also formed in the hard mask 72 (see FIGS. 43 to 44B).

As described above, parts of the openings 82a, 82b and parts of the active regions 11b, 11a are sufficiently overlapped. Accordingly the parts of the openings 78a, 78b and the parts of the active regions 11b, 11a are sufficiently overlapped. As described above, the openings 78a1, 78b1 (see FIG. 41) and parts of the gate interconnections 16a, 16b are sufficiently overlapped. Accordingly, the parts of the openings 78a, 78b and the parts of the gate interconnections 16a, 16b are sufficiently overlapped.

Next, as illustrated in FIG. 45A, the photoresist film 80 is removed by wet processing and asking.

Next, the inter-layer insulation film 44 is etched with the hard mask 72 as the mask. Thus, the contact holes 46a-46l and the openings 46m, 46n are formed in the inter-layer insulation film 44 (see FIGS. 45B to 46B).

As described above, parts of the openings 78a, 78b and parts of the active regions 11b, 11a are sufficiently overlapped. Accordingly, parts of the contact holes 46a, 46b and the parts of the active regions 11b, 11a are sufficiently overlapped. As described above, the parts of the openings 78a, 78b and parts of the gate interconnections 16a, 16b are sufficiently overlapped. Accordingly, the parts of the contact holes 46a, 46b and the parts of the gate interconnections 16a, 16b are sufficiently overlapped.

Thus, even when a disalingment takes place, the contact holes 46a can surely expose integrally the end of the gate interconnection 16a and the source/drain diffused layer 20 of the load transistor L2. Even when a disalignment takes place, the contact hole 46b surely exposes integrally the end of the gate interconnection 16b and the source/drain diffused layer 22 of the load transistor L1.

The semiconductor device manufacturing method following the above-described steps is the same as the method for manufacturing the semiconductor device according to the first embodiment described above with reference to FIGS. 27A to 29B, and its description will not be repeated.

Thus, the semiconductor device is manufactured by the semiconductor device manufacturing method according to the present embodiment (see FIGS. 47A to 48B).

As described above, the inter-layer insulation film 44 may be etched by using the hard mask 72. In the present embodiment, the partial patterns 61a1, 61b1 for forming parts of the contact holes 46a, 46b are transferred to the hard mask 72 in alignment with the alignment mark 16f transferred simultaneously with transferring the patterns of the gate interconnections 16a, 16b. The partial patterns 61a2, 61b2 for forming parts of the contact holes 46a, 46b are transferred to the hard mask 72 in alignment with the alignment mark 11f transferred simultaneously with transferring patterns of the active regions 11a, 11b. Parts of the partial patterns 61a1, 61b1 and parts of the partial patterns 61a2, 61b2 are laid out, sufficiently overlapped. Thus, according to the present embodiment as well, the contact hole 46a which can surely expose integrally the end of the gate interconnection 16a and a part of the source/drain diffused layer 20 of the load transistor L2 can be formed. The contact hole 46b which can surely expose integrally the end of the gate interconnection 16b and the end of the source/drain diffused layer 22 of the load transistor L1 can be formed. Thus, according to the present embodiment as well, the contact layer 48a which can surely connect integrally the end of the gate interconnection 16a and the source/drain diffused layer 20 of the load transistor L2 can be formed. The contact layer 48b which can surely connect integrally the end of the gate interconnection 16b and a part of the source/drain diffused layer 22 of the load transistor L1 can be formed. Thus, according to the present embodiment as well, the semiconductor device of high reliability can be manufactured with high yields.

[Modified Embodiments]

The present invention is not limited to the above-described embodiments and can cover other various modifications.

For example, in the above-described embodiments, in the first exposure, the partial patterns 61a1, 61b1 and the patterns 61c-61m are exposed, and the partial patterns 61a2, 61b2, 61n are exposed in the second exposure. However, this is not essential. For example, it is possible that in the first exposure, the partial patterns 61a1, 61b1 and the pattern 61m are exposed, and in the second exposure, the partial patterns 61a2, 61b2 and the patterns 61c-61l, 61n are exposed in the second exposure.

In the above-described embodiments, the first exposure was made with the first mask aligned with the alignment mark 16f transferred simultaneously with transferring the patters of the gate interconnections 16a, 16b. The second exposure was made with the second mask aligned with the alignment mark 11f transferred simultaneously with transferring the patterns of the active regions 11a, 11b. However, the sequence of the exposures is not limited to this. For example, it is possible that the first exposure may be made with the second mask aligned with the alignment mark 11f transferred simultaneously with transferring the patterns of the active regions 11a, 11b, and the second exposure is made with the first mask aligned with the alignment mark 16f transferred simultaneously with transferring the patterns of the gate interconnections 16a, 16b.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device manufacturing method comprising:
    forming a device isolation region for defining a plurality of active regions in a semiconductor substrate and forming a first alignment mark in the semiconductor substrate;
    forming a first gate interconnection which is formed, crossing over one of said plurality of active regions and which is linear and includes a gate electrode of a first transistor, and a second gate interconnection which is formed, crossing over the other of said plurality of active regions and which is linear, in parallel with the first gate interconnection over the semiconductor substrate with a gate insulation film formed therebetween and includes a gate electrode of a second transistor, and forming a second alignment mark over the semiconductor substrate;
    forming source/drain diffused layers of the first transistor and the second transistor respectively in the active regions;
    forming an insulation film over the semiconductor substrate and over the first gate interconnection and the second gate interconnection;
    forming a photoresist film over the insulation film;
    making alignment by using the second alignment mark and exposing on the photoresist film a first partial pattern for forming a first contact hole in the insulation film, overlapping at least a part of the first gate interconnection;
    making alignment by using the first alignment mark and exposing on the photoresist film a second partial pattern for forming the first contact hole in the insulation film, overlapping at least a part of the source/drain diffused layer of the second transistor;
    developing the photoresist film to form a first opening in the photoresist film at a portion where the first partial pattern and the second partial pattern have been exposed;
    etching the insulation film with the photoresist film as a mask to form in the insulation film the first contact hole down to the first gate interconnection and the source/drain diffused layer of the second transistor; and
    burying a first contact layer in the first contact hole.

2. The semiconductor device manufacturing method according to claim 1, wherein
    in the exposing the first partial pattern on the photoresist film, a third partial pattern for forming a second contact hole in the insulation film is further exposed, overlapping at least a part of the second gate interconnection,
    in the exposing the second partial pattern on the photoresist film, a fourth partial pattern for forming the second contact hole in the insulation film is further exposed, overlapping at least a part of the source/drain diffused layer of the first transistor,
    in the developing the photoresist film, a second opening is further formed in the photoresist film at a portion where the third partial pattern and the fourth partial pattern have been exposed,
    in the etching the insulation film with the photoresist film as the mask, the second contact hole is further formed in the insulation film down to the second gate interconnection and the source/drain diffused layer of the first transistor, and
    in the burying the first contact layer in the first contact hole, a second contact layer is buried in the second contact hole.

3. The semiconductor device manufacturing method according to claim 1, wherein
    the first alignment mark is defined by the same film that forms the device isolation region defining the active regions.

4. The semiconductor device manufacturing method according to claim 1, wherein
    the second alignment mark is formed of the same film as the first gate interconnection and the second gate interconnection.

* * * * *